United States Patent
Zhang et al.

(10) Patent No.: US 12,514,116 B2
(45) Date of Patent: Dec. 30, 2025

(54) ORGANIC ELECTROLUMINESCENT DEVICE

(71) Applicant: BEIJING SUMMER SPROUT TECHNOLOGY CO., LTD., Beijing (CN)

(72) Inventors: Han Zhang, Beijing (CN); Le Wang, Beijing (CN); Junfei Wang, Beijing (CN); Qiang Wang, Beijing (CN); Menglan Xie, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 1007 days.

(21) Appl. No.: 17/468,362

(22) Filed: Sep. 7, 2021

(65) Prior Publication Data

US 2022/0077404 A1 Mar. 10, 2022

(30) Foreign Application Priority Data

Sep. 8, 2020 (CN) .......................... 202010925203.7

(51) Int. Cl.
*H10K 85/60* (2023.01)
*C07D 487/16* (2006.01)
(Continued)

(52) U.S. Cl.
CPC ....... *H10K 85/6572* (2023.02); *C07D 487/16* (2013.01); *C09K 11/06* (2013.01);
(Continued)

(58) Field of Classification Search
CPC ............. H10K 85/6572; H10K 85/615; H10K 85/631; H10K 85/654; H10K 2101/90;
(Continued)

(56) References Cited

U.S. PATENT DOCUMENTS

| 5,703,436 A | 12/1997 | Forrest et al. |
| 5,707,745 A | 1/1998 | Forrest et al. |

(Continued)

FOREIGN PATENT DOCUMENTS

| CN | 108117525 A | 6/2018 | |
| CN | 111269239 A * | 6/2020 | ........... C07D 487/16 |

(Continued)

OTHER PUBLICATIONS

Machine Translation of CN111269239A (Year: 2020).*
(Continued)

*Primary Examiner* — Jenna N Chandhok
(74) *Attorney, Agent, or Firm* — ArentFox Schiff LLP; Joseph M. Maraia

(57) ABSTRACT

Provided is an organic electroluminescent device. The electroluminescent device includes an anode, a cathode and an organic layer disposed between the anode and the cathode, where the organic layer includes a first compound having a structure of $H_1$-$L_1$-$E_1$ and a second compound having a structure of $H_2$-$L_2$-$E_2$. The electroluminescent device containing a novel material combination has a low driving voltage, high device efficiency and a significantly improved device lifetime, which greatly improves the overall performance of the device. Further provided are an electronic equipment including the preceding electroluminescent device and use of the electroluminescent device in an electronic element module, a display apparatus or a lighting apparatus.

29 Claims, 1 Drawing Sheet

(51) Int. Cl.
*C09K 11/06* (2006.01)
*H10K 50/11* (2023.01)
*H10K 101/10* (2023.01)

(52) U.S. Cl.
CPC ...... *C09K 2211/1018* (2013.01); *H10K 50/11* (2023.02); *H10K 2101/10* (2023.02)

(58) Field of Classification Search
CPC .. H10K 85/633; H10K 85/657; C07D 487/16; C09K 2211/1018
See application file for complete search history.

(56) References Cited

U.S. PATENT DOCUMENTS

| | | |
|---|---|---|
| 5,844,363 A | 12/1998 | Gu et al. |
| 6,097,147 A | 8/2000 | Baldo et al. |
| 6,303,238 B1 | 10/2001 | Thompson et al. |
| 7,279,704 B2 | 10/2007 | Walters et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2015/0349273 A1 | 12/2015 | Hung et al. |
| 2016/0141508 A1 | 5/2016 | Jatsch et al. |
| 2016/0359122 A1 | 12/2016 | Boudreault et al. |
| 2018/0337340 A1 | 11/2018 | Moon |
| 2021/0167297 A1 | 6/2021 | Wang et al. |

FOREIGN PATENT DOCUMENTS

| | | | |
|---|---|---|---|
| CN | 112876489 A | | 6/2021 |
| KR | 10-2015-0077220 A | | 7/2015 |
| KR | 2015077220 A | * | 7/2015 |
| WO | 2016052819 A1 | | 4/2016 |

OTHER PUBLICATIONS

Machine Translation of KR2015077220A (Year: 2015).*
Tang, et al., "Organic electroluminescent diodes," App. Phys. Ltrs., 51(12), Sep. 21, 1987, pp. 912-915.
Uoyama et al., "Highly efficient organic light-emitting diodes from delayed fluorescence," Nature, Dec. 13, 2012, vol. 492, pp. 234-240.

* cited by examiner

ORGANIC ELECTROLUMINESCENT DEVICE

CROSS-REFERENCE TO RELATED APPLICATION(S)

This application claims priority to Chinese Patent Application No. CN 202010925203.7 filed on Sep. 8, 2020, the disclosure of which is incorporated herein by reference in its entirety.

TECHNICAL FIELD

The present disclosure relates to organic electronic devices, for example, organic electroluminescent devices. More particularly, the present disclosure relates to an organic electroluminescent device having a novel combination of compounds and an electronic equipment including the organic electroluminescent device.

BACKGROUND

Organic electronic devices include, but are not limited to, the following types: organic light-emitting diodes (OLEDs), organic field-effect transistors (0-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US20180337340A1 has disclosed an organic electroluminescent compound and an organic electroluminescent device containing the same. The organic electroluminescent device includes an organic layer containing one or more hosts, where a first host is an organic optical compound having the following structure:

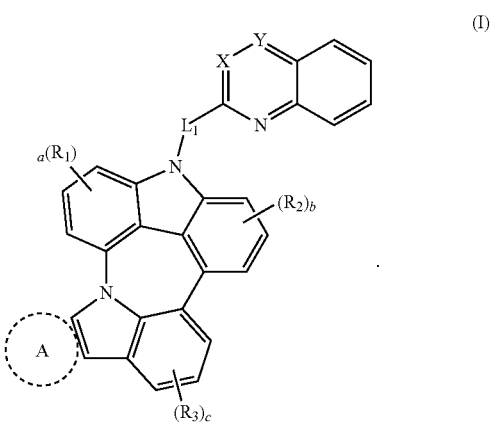

(I)

However, the use of the organic electroluminescent compound together with an organic compound containing a structural unit of triazine or a similar structure thereof bonded to triarylamine as host materials has not been disclosed or taught.

US20160141508A1 has disclosed an organic optical device including an organic layer. The organic layer contains an organic optical compound represented by the following structure:

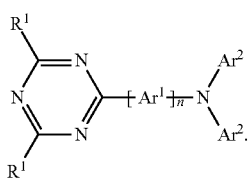

(2)

This application has disclosed the use of the organic optical compound as a host material, but has not pointed out its usefulness as host materials together with another particular type of compound.

CN108117525A has disclosed an organic optical device including an organic layer. The organic layer contains an organic optical compound represented by the following structure:

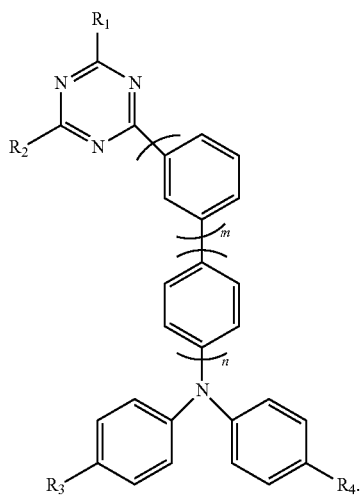

(3)

This application has disclosed the use of the organic optical compound as a host material, but has not pointed out its usefulness as host materials together with another particular type of compound.

WO2016052819A1 has disclosed an organic optical device including an organic layer. The organic layer contains an organic optical compound represented by the following structure:

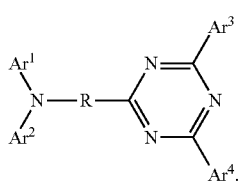

(4)

This application has disclosed the use of the organic optical compound as a host material or a light-emitting material, but has not pointed out its usefulness as host materials together with another particular type of compound.

However, multiple host materials reported so far can still be improved. To meet the increasing requirements of the industry, it is an efficient research and development means to select a combination of suitable host materials and a novel material combination still needs to be further researched and developed. The present disclosure provides a device containing multiple host materials. Compared with the prior art, the device can provide better overall device performance.

SUMMARY

The present disclosure aims to provide an electroluminescent device containing a novel material combination, so as to solve at least part of the preceding problems. The electroluminescent device containing the novel material combination has a low driving voltage, high device efficiency and a significantly improved device lifetime, which greatly improves the overall performance of the device.

According to an embodiment of the present disclosure, disclosed is an electroluminescent device including:
an anode,
a cathode, and
an organic layer disposed between the anode and the cathode, where the organic layer includes a first compound and a second compound;
the first compound has a structure of $H_1$-$L_1$-$E_1$;
$H_1$ has a structure represented by Formula 1-1:

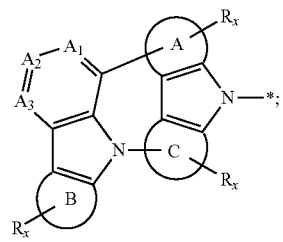

Formula 1-1 in Formula 1-1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 30 carbon atoms or a heterocyclic ring having 3 to 30 carbon atoms;
$R_x$ represents, at each occurrence identically or differently, mono-substitution, multiple substitutions or non-substitution;
R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

two adjacent substituents R, $R_x$ can be optionally joined to form a ring;

in Formula 1-1, "*" represents the position where the structure represented by Formula 1-1 is joined to $L_1$;

$L_1$ is selected from a single bond, substituted or unsubstituted arylene having 6 to 30 carbon atoms, substituted or unsubstituted heteroarylene having 3 to 30 carbon atoms or a combination thereof;

$E_1$ is selected from substituted or unsubstituted heteroaryl having 3 to 60 carbon atoms, and the heteroaryl contains at least one N atom;

the second compound has a structure of $H_2$-$L_2$-$E_2$;

$H_2$ has a structure represented by Formula 2-1:

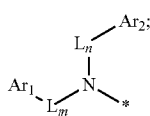

Formula 2-1 in Formula 2-1, $Ar_1$ and $Ar_2$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$L_m$ and $L_n$ are, at each occurrence identically or differently, selected from the group consisting of: a single bond, substituted or unsubstituted arylene having 6 to 30 carbon atoms, substituted or unsubstituted heteroarylene having 3 to 30 carbon atoms and combinations thereof;

in Formula 2-1, "*" represents the position where the structure represented by Formula 2-1 is joined to $L_2$;

$L_2$ is selected from a single bond, substituted or unsubstituted arylene having 6 to 30 carbon atoms, substituted or unsubstituted heteroarylene having 3 to 30 carbon atoms or a combination thereof;

$E_2$ has a structure represented by Formula 2-2:

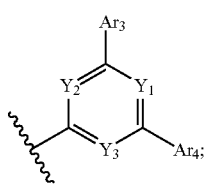

Formula 2-2 in Formula 2-2, $Y_1$, $Y_2$ and $Y_3$ are each independently selected from N or $CR_v$, and at least one of $Y_1$ to $Y_3$ is N;

wherein $Ar_3$ and $Ar_4$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and in Formula 2-2,

represents the position where the structure represented by Formula 2-2 is joined to $L_2$.

According to an embodiment of the present disclosure, further disclosed is an electronic equipment including the preceding electroluminescent device.

According to an embodiment of the present disclosure, further disclosed is use of the preceding electroluminescent device in an electronic element module, a display apparatus or a lighting apparatus.

The present disclosure provides an electroluminescent device containing a novel material combination. The electroluminescent device containing the novel material combination has a low driving voltage, high-level device efficiency and a significantly improved device lifetime, which greatly improves the overall performance of the device.

DETAILED DESCRIPTION

Figure 1:
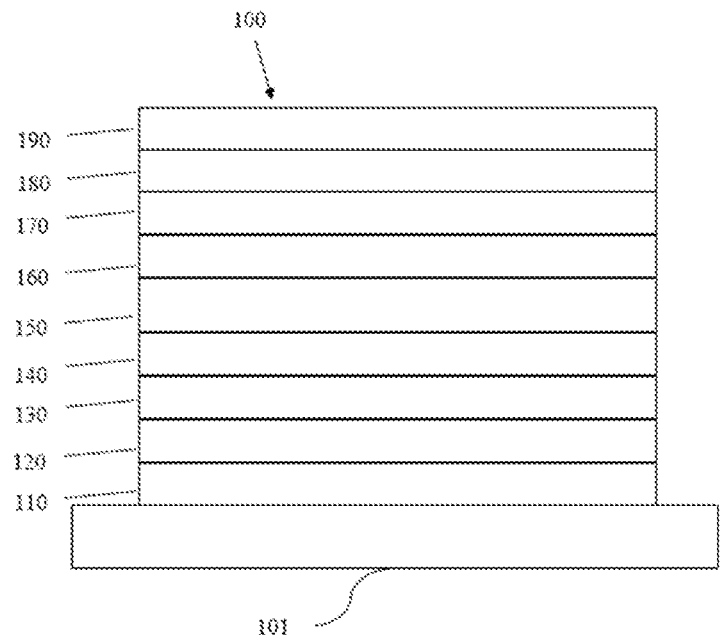
FIG. 1 is a schematic diagram of an organic light-emitting apparatus that may include a compound combination disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
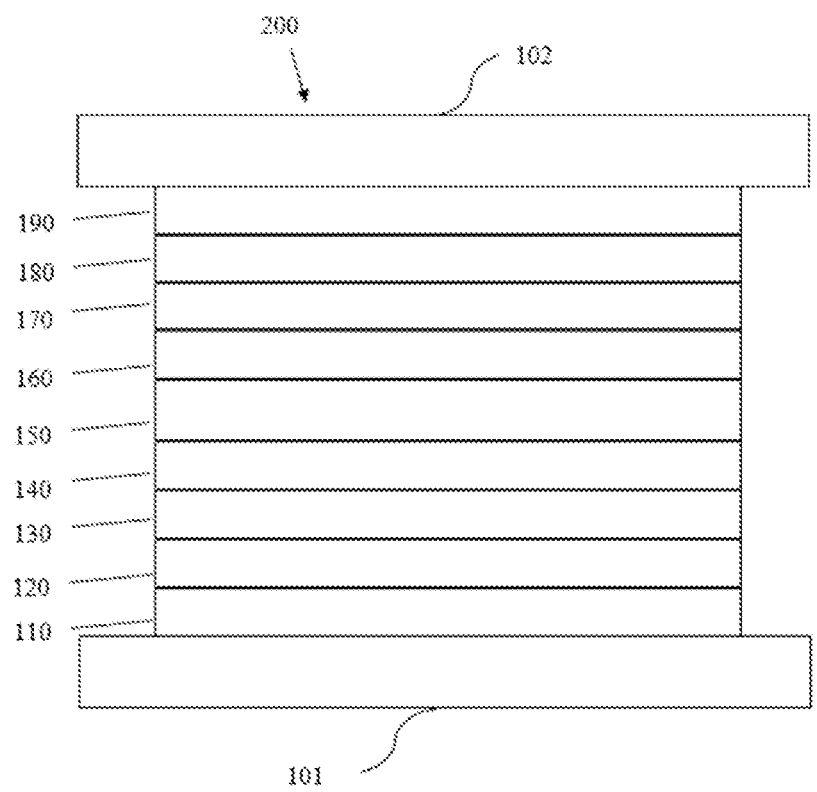
FIG. 2 is a schematic diagram of another organic light-emitting apparatus that may include a compound combination disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethylethylsilyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, propenyl, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, wherein at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyl di-t-butylsilyl. Additionally, the alkylsilyl group may be optionally substituted.

Arylsilyl—as used herein, contemplates a silyl group substituted with at least one aryl group. Arylsilyl groups may be those having 6 to 30 carbon atoms, preferably those having 8 to carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, a substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted amino, substituted acyl, substituted carbonyl, a substituted carboxylic acid group, a substituted ester group, substituted sulfinyl, substituted sulfonyl and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, carboxylic acid group, ester group, sulfinyl, sulfonyl and phosphino may be substituted with one or more groups selected from the group consisting of deuterium, halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted heterocyclic group having 3 to 20 ring atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted alkynyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

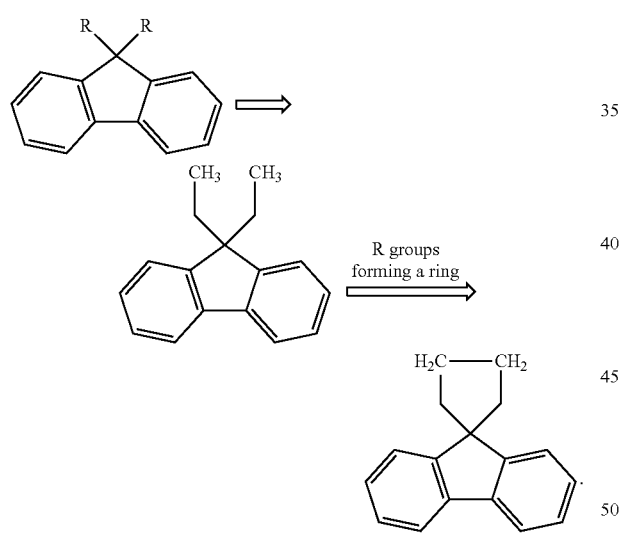

The expression that adjacent substituents can be optionally joined to form a ring is also intended to mean that two substituents bonded to carbon atoms which are directly bonded to each other are joined to each other via a chemical bond to form a ring, which can be exemplified by the following formula:

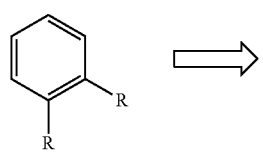

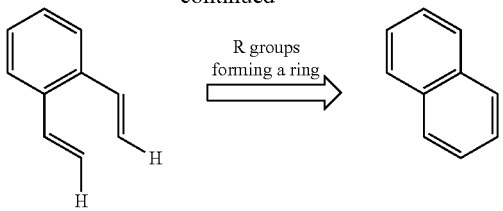

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

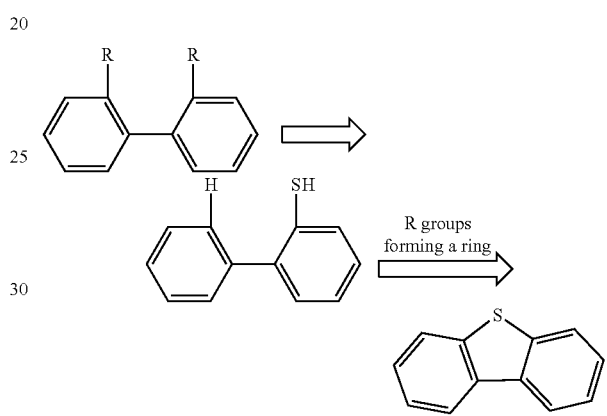

According to an embodiment of the present disclosure, disclosed is an electroluminescent device comprising
an anode,
a cathode, and
an organic layer disposed between the anode and the cathode, wherein the organic layer comprises a first compound and a second compound;
the first compound has a structure of $H_1$-$L_1$-$E_1$;
$H_1$ has a structure represented by Formula 1-1:

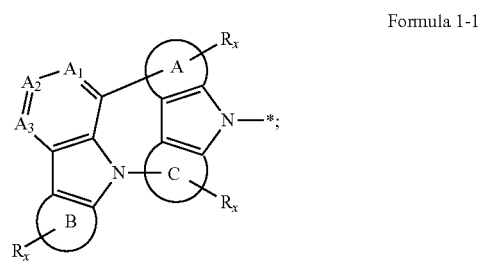

Formula 1-1 in Formula 1-1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 30 carbon atoms or a heterocyclic ring having 3 to 30 carbon atoms;
$R_x$ represents, at each occurrence identically or differently, mono-substitution, multiple substitutions or non-substitution;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

two adjacent substituents R, $R_x$ can be optionally joined to form a ring;

in Formula 1-1, "*" represents the position where the structure represented by Formula 1-1 is joined to $L_1$;

$L_1$ is selected from a single bond, substituted or unsubstituted arylene having 6 to 30 carbon atoms, substituted or unsubstituted heteroarylene having 3 to 30 carbon atoms or a combination thereof;

$E_1$ is selected from substituted or unsubstituted heteroaryl having 3 to 60 carbon atoms, and the heteroaryl contains at least one N atom;

the second compound has a structure of $H_2$-$L_2$-$E_2$;

$H_2$ has a structure represented by Formula 2-1:

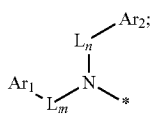

Formula 2-1 in Formula 2-1, $Ar_1$ and $Ar_2$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$L_m$ and $L_n$ are, at each occurrence identically or differently, selected from the group consisting of: a single bond, substituted or unsubstituted arylene having 6 to 30 carbon atoms, substituted or unsubstituted heteroarylene having 3 to 30 carbon atoms and combinations thereof;

in Formula 2-1, "*" represents the position where the structure represented by Formula 2-1 is joined to $L_2$;

$L_2$ is selected from a single bond, substituted or unsubstituted arylene having 6 to 30 carbon atoms, substituted or unsubstituted heteroarylene having 3 to 30 carbon atoms or a combination thereof;

$E_2$ has a structure represented by Formula 2-2:

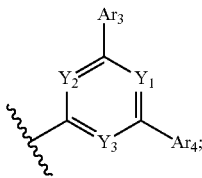

Formula 2-2 in Formula 2-2, $Y_1$, $Y_2$ and $Y_3$ are each independently selected from N or $CR_v$, and at least one of $Y_1$ to $Y_3$ is N;

wherein $Ar_3$ and $Ar_4$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and in Formula 2-2,

represents the position where the structure represented by Formula 2-2 is joined to $L_2$.

In this embodiment, the expression that "adjacent substituents R, $R_x$ can be optionally joined to form a ring" is intended to mean that any one or more of groups of adjacent substituents, such as adjacent substituents R, adjacent substituents $R_x$, and adjacent substituents R and $R_x$, can be joined to form a ring. Obviously, for those skilled in the art, it is possible that none of these groups of adjacent substituents are joined to form a ring.

According to an embodiment of the present disclosure, wherein, in the first compound, the ring A, the ring B and the ring C are, at each occurrence identically or differently, selected from a five-membered carbocyclic ring, an aromatic ring having 6 to 18 carbon atoms or a heteroaromatic ring having 3 to 18 carbon atoms.

According to an embodiment of the present disclosure, wherein, in the first compound, the ring A, the ring B and the ring C are, at each occurrence identically or differently, selected from a five-membered carbocyclic ring, a benzene ring, a five-membered heteroaromatic ring or a six-membered heteroaromatic ring.

According to an embodiment of the present disclosure, wherein, in the first compound, the $H_1$ has a structure represented by Formula 1-1-a:

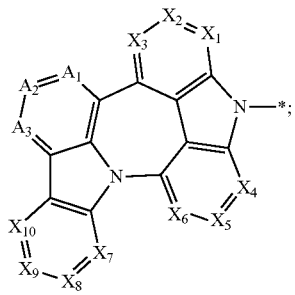

Formula 1-1-a wherein $A_1$ to $A_3$ are, at each occurrence identically or differently, selected from N or CR, and $X_1$ to $X_{10}$ are, at each occurrence identically or differently, selected from N or CRx;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring.

In the present disclosure, the expression that "adjacent substituents R, $R_x$ can be optionally joined to form a ring" is intended to mean that any one or more of groups of adjacent substituents, such as adjacent substituents R, adjacent substituents $R_x$, and adjacent substituents R and $R_x$, can be joined to form a ring. Obviously, for those skilled in the art, it is possible that none of these groups of adjacent substituents are joined to form a ring.

According to an embodiment of the present disclosure, wherein in Formula 1-1-a, R and $R_x$ are, at each occurrence identically or differently, selected from the group consisting of: hydrogen, deuterium, halogen, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, a cyano group, an isocyano group, a sulfanyl group and combinations thereof;

adjacent substituents R, $R_x$ can be optionally joined to form a ring.

According to an embodiment of the present disclosure, wherein in Formula 1-1-a, at least one of R and $R_x$ is selected from deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms or substituted or unsubstituted heteroaryl having 3 to 30 carbon atoms;

adjacent substituents R, $R_x$ can be optionally joined to form a ring.

According to an embodiment of the present disclosure, wherein in Formula 1-1-a, at least one of R and $R_x$ is selected from deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylene, carbazolyl, 9-phenylcarbazolyl, 9,9-dimethylfluorenyl, pyridyl, phenylpyridyl or a combination thereof.

adjacent substituents R, $R_x$ can be optionally joined to form a ring.

According to an embodiment of the present disclosure, wherein, the $H_1$ is selected from any one of the group consisting of H1-1 to H1-141, where for the specific structures of H1-1 to H1-141, reference is made to claim 5.

According to an embodiment of the present disclosure, wherein, hydrogens in the structures of H1-1 to H1-141 can be partially or fully substituted with deuterium.

According to an embodiment of the present disclosure, wherein, the $E_1$ has a structure represented by Formula 1-2:

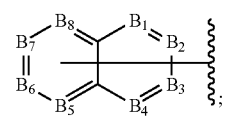

Formula 1-2

$B_1$ to $B_8$ are, at each occurrence identically or differently, selected from C, N or $CR_z$, and at least two of $B_1$ to $B_8$ are selected from N;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$ can be optionally joined to form a ring;

in Formula 1-2,

represents the position where the structure represented by Formula 1-2 is joined to the $L_1$.

In the present disclosure, the expression that "adjacent substituents $R_z$ can be optionally joined to form a ring" is intended to mean that any adjacent substituents $R_z$ can be joined to form a ring. Obviously, for those skilled in the art, it is possible that none of any adjacent substituents $R_z$ are joined to form a ring.

According to an embodiment of the present disclosure, wherein, the $E_1$ has a structure represented by any one of the group consisting of Formula 1-2-a to Formula 1-2-i:

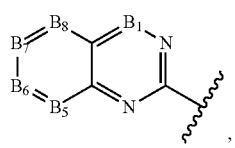
Formula 1-2-a

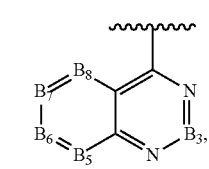
Formula 1-2-b

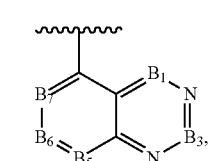
Formula 1-2-c

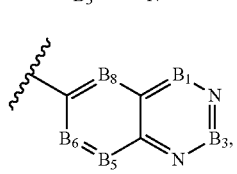
Formula 1-2-d

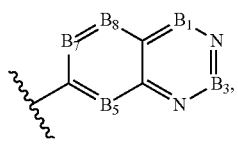
Formula 1-2-e

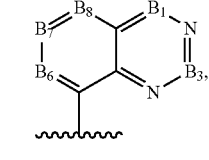
Formula 1-2-f

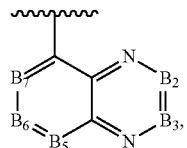
Formula 1-2-g

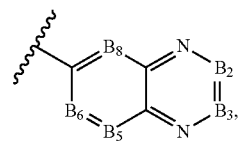
Formula 1-2-h

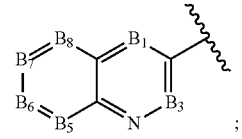
Formula 1-2-i wherein
in Formula 1-2-a, $B_1$ and $B_5$ to $B_8$ are each independently selected from $CR_z$;
in Formula 1-2-b, $B_3$ and $B_5$ to $B_8$ are each independently selected from $CR_z$;
in Formula 1-2-c, $B_1$, $B_3$ and $B_5$ to $B_7$ are each independently selected from $CR_z$;
in Formula 1-2-d, $B_1$, $B_3$, $B_5$, $B_6$ and $B_8$ are each independently selected from $CR_z$;
in Formula 1-2-e, $B_1$, $B_3$, $B_5$, $B_7$ and $B_8$ are each independently selected from $CR_z$;
in Formula 1-2-f, $B_1$, $B_3$ and $B_6$ to $B_8$ are each independently selected from $CR_z$;
in Formula 1-2-g, $B_2$, $B_3$ and $B_5$ to $B_7$ are each independently selected from $CR_z$;
in Formula 1-2-h, $B_2$, $B_3$, $B_5$, $B_6$ and $B_8$ are each independently selected from $CR_z$;
in Formula 1-2-i, $B_3$ and $B_5$ to $B_8$ are each independently selected from $CR_z$;
wherein $R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;
adjacent substituents $R_z$ can be optionally joined to form a ring;

represents the position where a structure represented by Formula 1-2-a to Formula 1-2-i is joined to the $L_1$.

According to an embodiment of the present disclosure, wherein, in Formula 1-2-a to Formula 1-2-i, $B_1$ to $B_8$ are, at each occurrence identically or differently, selected from $CR_z$; the $R_z$ is, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof;

adjacent substituents $R_z$ can be optionally joined to form a ring.

According to an embodiment of the present disclosure, wherein, the $E_1$ has a structure represented by Formula 1-3:

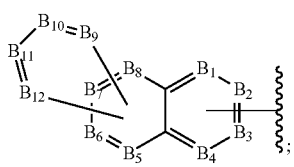

Formula 1-3 wherein $B_1$ to $B_8$ are, at each occurrence identically or differently, selected from C, N or $CR_z$, $B_9$ to $B_{12}$ are, at each occurrence identically or differently, selected from N or $CR_z$, at least two of $B_1$ to $B_8$ are selected from N, and any adjacent two of $B_5$ to $B_5$ are C and joined to $B_9$ and $B_{12}$, respectively;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$ can be optionally joined to form a ring;

in Formula 1-3,

represents the position where the structure represented by Formula 1-3 is joined to the $L_1$.

In this embodiment, the expression that "adjacent substituents $R_z$ can be optionally joined to form a ring" is intended to mean that any adjacent substituents $R_z$ can be joined to form a ring. Obviously, for those skilled in the art, it is possible that none of any adjacent substituents $R_z$ are joined to form a ring.

According to an embodiment of the present disclosure, wherein, the $E_1$ has a structure represented by any one of the group consisting of Formula 1-3-a to Formula 1-3-h:

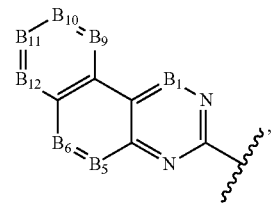

Formula 1-3-a

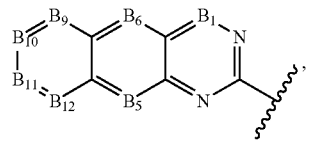

Formula 1-3-b

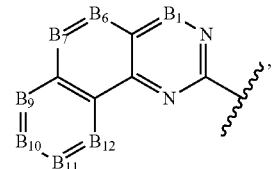

Formula 1-3-c

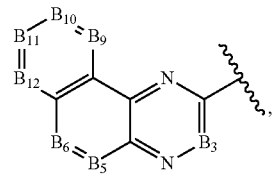

Formula 1-3-d

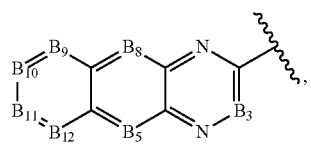

Formula 1-3-e

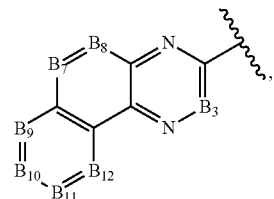

Formula 1-3-f

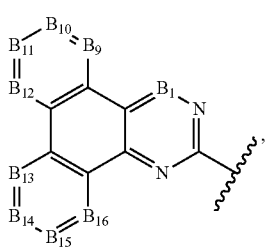

Formula 1-3-g

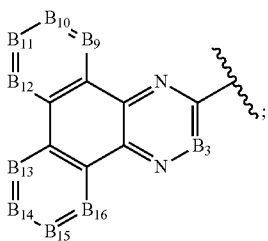

Formula 1-3-h wherein
in Formula 1-3-a, $B_1$, $B_5$, $B_6$ and $B_9$ to $B_{12}$ are, at each occurrence identically or differently, selected from $CR_z$;
in Formula 1-3-b, $B_1$, $B_5$, $B_8$ and $B_9$ to $B_{12}$ are, at each occurrence identically or differently, selected from $CR_z$;
in Formula 1-3-c, $B_1$, $B_7$, $B_8$ and $B_9$ to $B_{12}$ are, at each occurrence identically or differently, selected from $CR_z$;
in Formula 1-3-d, $B_3$, $B_5$, $B_6$ and $B_9$ to $B_{12}$ are, at each occurrence identically or differently, selected from $CR_z$;
in Formula 1-3-e, $B_3$, $B_5$, $B_8$ and $B_9$ to $B_{12}$ are, at each occurrence identically or differently, selected from $CR_z$;
in Formula 1-3-f, $B_3$, $B_7$, $B_8$ and $B_9$ to $B_{12}$ are, at each occurrence identically or differently, selected from $CR_z$;
in Formula 1-3-g, $B_1$ and $B_9$ to $B_{12}$ are, at each occurrence identically or differently, selected from $CR_z$, and $B_{13}$ to $B_{16}$ are, at each occurrence identically or differently, selected from $CR_W$;
in Formula 1-3-h, $B_3$ and $B_9$ to $B_{12}$ are, at each occurrence identically or differently, selected from $CR_z$, and $B_{13}$ to $B_{16}$ are, at each occurrence identically or differently, selected from $CR_w$;
wherein $R_z$ and $R_w$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;
adjacent substituents $R_z$, $R_w$ can be optionally joined to form a ring;

represents the position where a structure represented by Formula 1-3-a to Formula 1-3-h is joined to the $L_1$.

In the present disclosure, the expression that adjacent substituents $R_z$, $R_w$ can be optionally joined to form a ring is intended to mean that any one or more of groups of adjacent substituents, such as substituents $R_z$, substituents $R_w$, and substituents $R_z$ and $R_w$, can be joined to form a ring. Obviously, it is possible that none of these groups of adjacent substituents are joined to form a ring.

According to an embodiment of the present disclosure, in Formula 1-3-a to Formula 1-3-h, $B_1$ to $B_{12}$ are, at each occurrence identically or differently, selected from $CR_z$, and $B_{13}$ to $B_{16}$ are, at each occurrence identically or differently, selected from $CR_w$; the $R_z$ and $R_w$ are, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof;
adjacent substituents $R_z$, $R_w$ can be optionally joined to form a ring.

According to an embodiment of the present disclosure, wherein the $E_1$ has a structure represented by Formula 1-4:

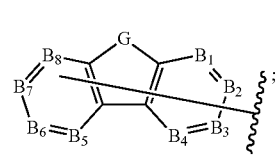

Formula 1-4 in Formula 1-4, $B_1$ to $B_8$ are, at each occurrence identically or differently, selected from C, N or $CR_z$, and at least one of $B_1$ to $B_8$ is selected from N;
G is selected from $CR_gR_g$, $SiR_gR_g$, $NR_g$, $BR_g$, $PR_g$, O, S or Se; when two $R_g$ are present at the same time, the two $R_g$ may be identical or different;
$R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$, $R_g$ can be optionally joined to form a ring;

in Formula 1-4,

represents the position where the structure represented by Formula 1-4 is joined to the $L_1$.

In the present disclosure, the expression that "adjacent substituents $R_z$, $R_g$ can be optionally joined to form a ring" is intended to mean that any one or more of groups of adjacent substituents, such as substituents $R_z$, substituents $R_g$, and substituents $R_z$ and $R_g$, can be joined to form a ring. Obviously, for those skilled in the art, it is possible that none of these groups of adjacent substituents are joined to form a ring.

According to an embodiment of the present disclosure, wherein the $E_1$ has a structure represented by Formula 1-4:

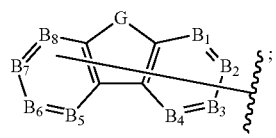

Formula 1-4 in Formula 1-4, $B_1$ to $B_8$ are, at each occurrence identically or differently, selected from C, N or $CR_z$, and at least two of $B_1$ to $B_8$ are selected from N;

G is selected from $CR_gR_g$, $SiR_gR_g$, $NR_g$, $BR_g$, $PR_g$, O, S or Se; when two $R_g$ are present at the same time, the two $R_g$ may be identical or different;

wherein $R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$, $R_g$ can be optionally joined to form a ring;

in Formula 1-4,

represents the position where the structure represented by Formula 1-4 is joined to the $L_1$.

According to an embodiment of the present disclosure, wherein the $E_1$ has a structure represented by any one of the group consisting of Formula 1-4-a to Formula 1-4-f:

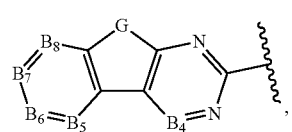

Formula 1-4-a

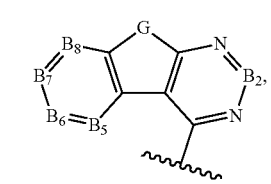

Formula 1-4-b

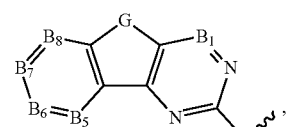

Formula 1-4-c

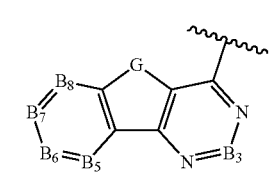

Formula 1-4-d

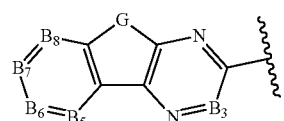

Formula 1-4-e

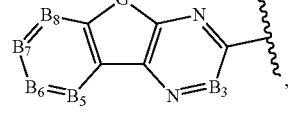

Formula 1-4-f in Formula 1-4-a, $B_4$ and $B_5$ to $B_8$ are, at each occurrence identically or differently, selected from $CR_z$;

in Formula 1-4-b, $B_2$ and $B_5$ to $B_8$ are, at each occurrence identically or differently, selected from $CR_z$;

in Formula 1-4-c, $B_1$ and $B_5$ to $B_8$ are, at each occurrence identically or differently, selected from $CR_z$;

in Formula 1-4-d, $B_3$ and $B_5$ to $B_8$ are, at each occurrence identically or differently, selected from $CR_z$;

in Formula 1-4-e, $B_3$ and $B_5$ to $B_8$ are, at each occurrence identically or differently, selected from $CR_z$;

in Formula 1-4-f, $B_2$ and $B_5$ to $B_8$ are, at each occurrence identically or differently, selected from $CR_z$;

in Formula 1-4-a to Formula 1-4-f, G is selected from $CR_gR_g$, $SiR_gR_g$, $NR_g$, $BR_g$, $PR_g$, O, S or Se; when two $R_g$ are present at the same time, the two $R_g$ may be identical or different;

$R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$, $R_g$ can be optionally joined to form a ring;

represents the position where a structure represented by Formula 1-4-a to Formula 1-4-f is joined to the $L_1$.

According to an embodiment of the present disclosure, wherein in Formula 1-4-a to Formula 1-4-f, G is selected from $CR_gR_g$, O, S or Se; when two $R_g$ are present at the same time, the two $R_g$ may be identical or different; and $B_1$ to $B_8$ are, at each occurrence identically or differently, selected from $CR_z$; wherein $R_z$ and $R_g$ are, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms and combinations thereof;

adjacent substituents $R_z$, $R_g$ can be optionally joined to form a ring.

According to an embodiment of the present disclosure, wherein, in Formula 1-2-a to Formula 1-2-i, $B_1$ to $B_8$ are, at each occurrence identically or differently, selected from $CR_z$; in Formula 1-3-a to Formula 1-3-h, $B_1$ to $B_{12}$ are, at each occurrence identically or differently, selected from $CR_z$, and $B_{13}$ to $B_{16}$ are, at each occurrence identically or differently, selected from $CR_w$; and in Formula 1-4-a to Formula 1-4-f, G is selected from O or S, and $B_1$ to $B_5$ are each independently selected from $CR_z$; the $R_z$ and $R_w$ are, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms and combinations thereof; and at least one $R_z$ in the $B_1$ to $B_4$ is, at each occurrence identically or differently, selected from the group consisting of: deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof.

According to an embodiment of the present disclosure, wherein in Formula 1-2-a to Formula 1-2-i, $B_1$ to $B_8$ are, at each occurrence identically or differently, selected from $CR_z$; in Formula 1-3-a to Formula 1-3-h, $B_1$ to $B_{12}$ are, at each occurrence identically or differently, selected from $CR_z$, and $B_{13}$ to $B_{16}$ are, at each occurrence identically or differently, selected from $CR_w$; and in Formula 1-4-a to Formula 1-4-f, G is selected from O or S, and $B_1$ to $B_5$ are, at each occurrence identically or differently, selected from $CR_z$; the $R_z$ and $R_w$ are, at each occurrence identically or differently, selected from the group consisting of: hydrogen, deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylene, carbazolyl, 9-phenylcarbazolyl, 9,9-dimethylfluorenyl, pyridyl, phenylpyridyl and combinations thereof; and at least one $R_z$ in the $B_1$ to $B_4$ is, at each occurrence identically or differently, selected from the group consisting of: deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylene, carbazolyl, 9-phenylcarbazolyl, 9,9-dimethylfluorenyl, pyridyl, phenylpyridyl and combinations thereof.

According to an embodiment of the present disclosure, wherein the $E_1$ is selected from any one of the group consisting of E1-1 to E1-140, where for the specific structures of the E1-1 to E1-140, reference is made to claim 10.

According to an embodiment of the present disclosure, wherein hydrogens in the structures of the E1-1 to E1-140 can be partially or fully substituted with deuterium.

According to an embodiment of the present disclosure, wherein the $L_1$ is selected from the group consisting of: a single bond, phenylene, naphthylene, biphenylene, terphenylene, triphenylenylene, pyridylene, thienylene, dibenzofurylene, dibenzothienylene and combinations thereof.

According to an embodiment of the present disclosure, wherein the $L_1$ is selected from any one of the group consisting of L1-0 to L1-47, where for the specific structures of the L1-0 to L1-47, reference is made to claim 11.

According to an embodiment of the present disclosure, hydrogens in the structures of the L1-1 to L1-47 can be partially or fully substituted with deuterium.

According to an embodiment of the present disclosure, wherein the first compound has the structure of $H_1$-$L_1$-$E_1$, and wherein the $H_1$ is selected from any one of the group consisting of H1-1 to H1-141, the $L_1$ is selected from any one of the group consisting of L1-0 to L1-47, and the $E_1$ is selected from any one of the group consisting of E1-1 to E1-140; optionally, hydrogens in the first compound can be partially or fully substituted with deuterium.

According to an embodiment of the present disclosure, wherein the first compound is selected from the group consisting of Compound I-1 to Compound I-792. For the specific structures of the Compound I-1 to Compound I-792, reference is made to claim 12.

According to an embodiment of the present disclosure, wherein hydrogens in the structures of the Compound I-1 to Compound I-792 can be partially or fully substituted with deuterium.

According to an embodiment of the present disclosure, wherein in Formula 2-1, $Ar_1$ and $Ar_2$ are, at each occurrence identically or differently, selected from the group consisting of: substituted or unsubstituted aryl having 6 to 18 carbon atoms, substituted or unsubstituted heteroaryl having 3 to 18 carbon atoms and combinations thereof.

According to an embodiment of the present disclosure, wherein in Formula 2-1, $Ar_1$ and $Ar_2$ are, at each occurrence identically or differently, selected from the group consisting of: phenyl, deuterated phenyl, methylphenyl, fluorophenyl, t-butylphenyl, trideuteromethylphenyl, biphenyl, naphthyl, deuterated naphthyl, phenanthryl, anthracenyl, dibenzofuryl, dibenzothienyl, 9,9-dimethylfluorenyl, carbazolyl, pyridyl, pyrimidinyl, 4-cyanophenyl, 3-cyanophenyl, triphenylene, quinolinyl, isoquinolinyl and combinations thereof.

According to an embodiment of the present disclosure, wherein in Formula 2-1, $L_m$ and $L_n$ are, at each occurrence identically or differently, selected from the group consisting of: a single bond, substituted or unsubstituted arylene having 6 to 18 carbon atoms, substituted or unsubstituted heteroarylene having 3 to 18 carbon atoms and combinations thereof.

According to an embodiment of the present disclosure, wherein in Formula 2-1, $L_m$ and $L_n$ are, at each occurrence identically or differently, selected from the group consisting of: a single bond, substituted or unsubstituted phenylene, substituted or unsubstituted naphthylene, substituted or unsubstituted biphenylene, substituted or unsubstituted pyridylene, substituted or unsubstituted thienylene, substituted or unsubstituted dibenzofurylene, substituted or unsubstituted dibenzothienylene and combinations thereof.

According to an embodiment of the present disclosure, wherein in the second compound, the $H_2$ is selected from any one of the group consisting of H2-1 to H2-206, where for the specific structures of the H2-1 to H2-206, reference is made to claim 15.

According to an embodiment of the present disclosure, wherein hydrogens in the structures of the H2-1 to H2-206 can be partially or fully substituted with deuterium.

According to an embodiment of the present disclosure, wherein in Formula 2-2, at least two of the $Y_1$, $Y_2$ and $Y_3$ are N.

According to an embodiment of the present disclosure, wherein in Formula 2-2, the $Y_1$, $Y_2$ and $Y_3$ are N.

According to an embodiment of the present disclosure, wherein in Formula 2-2, the $Ar_3$ and $Ar_4$ are, at each occurrence identically or differently, selected from the group consisting of: substituted or unsubstituted aryl having 6 to 18 carbon atoms, substituted or unsubstituted heteroaryl having 3 to 18 carbon atoms and combinations thereof.

According to an embodiment of the present disclosure, wherein in Formula 2-2, the $Ar_3$ and $Ar_4$ are, at each occurrence identically or differently, selected from the group consisting of: phenyl, deuterated phenyl, methylphenyl, fluorophenyl, t-butylphenyl, trideuteromethylphenyl, biphenyl, naphthyl, deuterated naphthyl, dibenzofuryl, dibenzothienyl, 9,9-dimethylfluorenyl, carbazolyl, pyridyl, pyrimidinyl, 4-cyanophenyl, 3-cyanophenyl, triphenylene and combinations thereof.

According to an embodiment of the present disclosure, wherein the $E_2$ is, at each occurrence identically or differently, selected from any one of the group consisting of E2-1 to E2-67, where for the specific structures of the E2-1 to E2-67, reference is made to claim 18.

According to an embodiment of the present disclosure, wherein hydrogens in the structures of the E2-1 to E2-67 can be partially or fully substituted with deuterium.

According to an embodiment of the present disclosure, wherein the $L_2$ is, at each occurrence identically or differently, selected from a single bond, substituted or unsubstituted arylene having 6 to 18 carbon atoms, substituted or unsubstituted heteroarylene having 3 to 18 carbon atoms or a combination thereof.

According to an embodiment of the present disclosure, wherein the $L_2$ is, at each occurrence identically or differently, selected from a single bond, phenylene, biphenylene, naphthylene, terphenylene, 9,9-dimethylfluorenylene, dibenzofurylene, dibenzothienylene, carbazolylene, pyridylene, phenylpyridylene or a combination thereof.

According to an embodiment of the present disclosure, wherein the $L_2$ is selected from any one of the group consisting of L-0 to L-200, where for the specific structures of the L-0 to L-200, reference is made to claim 19.

According to an embodiment of the present disclosure, wherein hydrogens in the structures of the L-1 to L-200 can be partially or fully substituted with deuterium.

According to an embodiment of the present disclosure, wherein the second compound has the structure of $H_2$-$L_2$-$E_2$, the $H_2$ is selected from any one of the group consisting of H2-1 to H2-206, the $L_2$ is selected from any one of the group consisting of L-0 to L-200, and the $E_2$ is selected from any one of the group consisting of E2-1 to E2-67; optionally, hydrogens in the second compound can be partially or fully substituted with deuterium.

According to an embodiment of the present disclosure, wherein the second compound is selected from the group consisting of Compound II-1 to Compound II-1351. For the specific structures of the Compound II-1 to Compound II-1351, reference is made to claim 20.

According to an embodiment of the present disclosure, wherein hydrogens in the structures of the Compound II-1 to Compound II-1351 can be partially or fully substituted with deuterium.

According to an embodiment of the present disclosure, wherein in the device, the organic layer is a light-emitting layer, and the first compound and the second compound are host materials.

According to an embodiment of the present disclosure, wherein in the device, the organic layer further comprises at least one phosphorescent material.

According to an embodiment of the present disclosure, wherein in the device, the at least one phosphorescent material is a metal complex having a general formula of $M(L_a)_m(L_b)_n(L_c)_q$; wherein the M is selected from a metal with a relative atomic mass greater than 40;

$L_a$, $L_b$ and $L_c$ are a first ligand, a second ligand and a third ligand coordinated to the M, respectively; $L_a$, $L_b$ and $L_c$ can be optionally joined to form a multidentate ligand; for example, any two of $L_a$, $L_b$ and $L_c$ may be joined to form a tetradentate ligand; in another example, $L_a$, $L_b$ and $L_c$ may be joined to each other to form a hexadentate ligand; or in yet another example, none of $L_a$, $L_b$ and $L_c$ are joined so that no multidentate ligand is formed;

$L_a$, $L_b$ and $L_c$ may be identical or different; m is 1, 2 or 3, n is 0, 1 or 2, q is 0 or 1, and m+n+q equals to the oxidation state of the M; when m is greater than or equal to 2, the plurality of $L_a$ may be identical or different; when n is equal to 2, two $L_b$ may be identical or different;

$L_a$ has a structure represented by Formula 3:

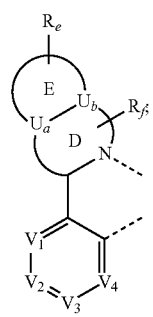

Formula 3 wherein the ring D is selected from a five-membered heteroaromatic ring or a six-membered heteroaromatic ring;

the ring E is selected from a five-membered unsaturated carbocyclic ring, a benzene ring, a five-membered heteroaromatic ring or a six-membered heteroaromatic ring;

the ring D and the ring E are fused via $U_a$ and $U_b$;

$U_a$ and $U_b$ are, at each occurrence identically or differently, selected from C or N;

$R_f$ and $R_e$ represent, at each occurrence identically or differently, mono-substitution, multiple substitutions or non-substitution; $V_1$ to $V_4$ are, at each occurrence identically or differently, selected from $CR_v$ or N;

$R_f$, $R_e$ and $R_v$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_f$, $R_e$, $R_v$ can be optionally joined to form a ring;

$L_b$ and $L_c$ are each independently selected from any one of the following structures:

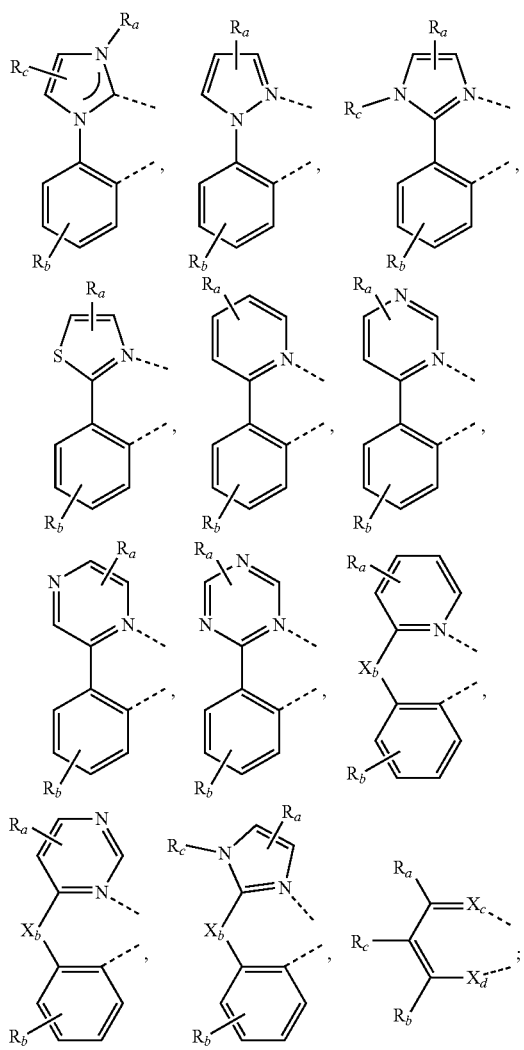

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in structures of the ligands $L_b$ and $L_c$, adjacent substituents $R_a$, $R_b$, $R_c$, $R_{N1}$, $R_{N2}$, $R_{C1}$, $R_{C2}$ can be optionally joined to form a ring.

In this embodiment, the expression that "adjacent substituents $R_f$, $R_c$, $R_v$ can be optionally joined to form a ring" is intended to mean that any one or more of groups of adjacent substituents, such as two substituents $R_f$, two substituents $R_c$, two substituents $R_v$, and substituents $R_f$ and $R_c$, can be joined to form a ring. Obviously, it is possible that none of these substituents are joined to form a ring.

In this embodiment, the expression that "adjacent substituents $R_a$, $R_b$, $R_c$, $R_{N1}$, $R_{N2}$, $R_{C1}$, $R_{C2}$ can be optionally joined to form a ring" is intended to mean that any one or more of groups of adjacent substituents, such as two substituents $R_a$, two substituents $R_b$, two substituents $R_w$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{c1}$, substituents $R_b$ and $R_{C2}$, substituents $R_a$ and $R_{N2}$, substituents $R_b$ and $R_{N2}$, and substituents $R_{C1}$ and $R_{C2}$, can be joined to form a ring. Obviously, it is possible that none of these substituents are joined to form a ring.

According to an embodiment of the present disclosure, the at least one phosphorescent material is a metal complex having a general formula of $M(L_a)_m(L_b)_n$; wherein
the M is selected from a metal with a relative atomic mass greater than 40;
$L_a$ and $L_b$ are a first ligand and a second ligand coordinated to the M, respectively; $L_a$ and $L_b$ can be optionally joined to form a multidentate ligand;
m is 1, 2 or 3, n is 0, 1 or 2, and m+n equals to the oxidation state of the M; wherein when m is greater than or equal to 2, the plurality of $L_a$ may be identical or different; when n is equal to 2, two $L_b$ may be identical or different;
$L_a$ has a structure represented by Formula 3:

Formula 3

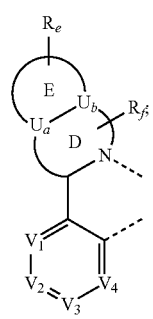

wherein
the ring D is selected from a five-membered heteroaromatic ring or a six-membered heteroaromatic ring;
the ring E is selected from a five-membered unsaturated carbocyclic ring, a benzene ring, a five-membered heteroaromatic ring or a six-membered heteroaromatic ring;

the ring D and the ring E are fused via $U_a$ and $U_b$;
$U_a$ and $U_b$ are, at each occurrence identically or differently, selected from C or N;
$R_f$ and $R_c$ represent, at each occurrence identically or differently, mono-substitution, multiple substitutions or non-substitution;
$V_1$ to $V_4$ are, at each occurrence identically or differently, selected from $CR_v$ or N;
$R_f$, $R_c$ and $R_v$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;
adjacent substituents $R_f$, $R_c$, $R_v$ can be optionally joined to form a ring;
wherein the ligand $L_b$ has the following structure

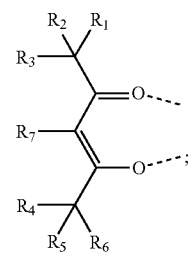

wherein $R_1$ to $R_7$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

In this embodiment, the expression that "adjacent substituents $R_f$, $R_c$, $R_v$ can be optionally joined to form a ring" is intended to mean that any one or more of groups of adjacent substituents, such as two substituents $R_f$, two substituents $R_c$, two substituents $R_v$, and substituents $R_f$ and $R_c$, can be joined to form a ring. Obviously, it is possible that none of these substituents are joined to form a ring.

According to an embodiment of the present disclosure, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one or two of $R_4$ to $R_6$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein at least two of $R_1$ to $R_3$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof; and/or at least two of $R_4$ to $R_6$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein in the device, the at least one phosphorescent material is a complex of Ir, Pt or Os.

According to an embodiment of the present disclosure, wherein in the device, the at least one phosphorescent material is a complex of Ir, which has a structure represented by any one of $Ir(L_a)(L_b)(L_c)$, $Ir(L_a)_2(L_b)$, $Ir(L_a)_2(L_c)$ or $Ir(L_a)(L_c)_2$; wherein $L_a$, $L_b$ and $L_c$ are, at each occurrence identically or differently, selected from any one of the ligands in embodiments above.

According to an embodiment of the present disclosure, wherein in the device, the at least one phosphorescent material is selected from the group consisting of the following structures:

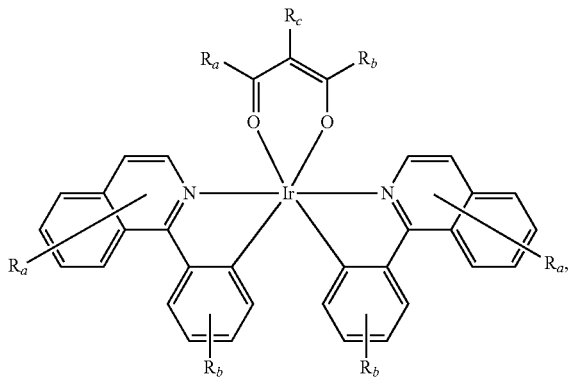

-continued

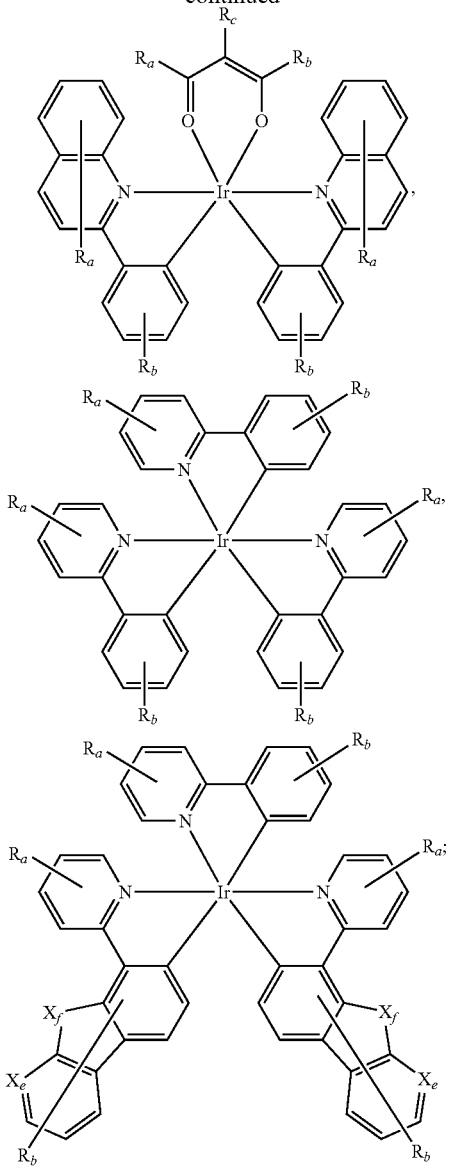

wherein $X_f$ is, at each occurrence identically or differently, selected from the group consisting of: O, S, Se, $NR_{N3}$ and $CR_{C3}R_{C4}$;

$X_e$ is, at each occurrence identically or differently, selected from $CR_d$ or N;

$R_a$, $R_b$ and $R_c$ represent, at each occurrence identically or differently, mono-substitution, multiple substitutions or non-substitution;

$R_a$, $R_b$, $R_c$, $R_d$, $R_{N3}$, $R_{C3}$ and $R_{C4}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to another embodiment of the present disclosure, further disclosed is an electronic equipment comprising the electroluminescent device according to any one of the embodiments described above.

According to another embodiment of the present disclosure, further disclosed is a use of an electroluminescent device in an electronic element module, a display apparatus or a lighting apparatus. The electroluminescent device has a specific structure as described in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, materials disclosed herein may be used in combination with a wide variety of emissive dopants, hosts, transporting layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

Methods for preparing a first compound and a second compound selected herein are not limited in the present disclosure. Those skilled in the art can prepare the first compound and the second compound by conventional synthesis methods or can easily prepare the first compound and the second compound with reference to patent applications of US20180337340A1, US20160141508A1, CN108117525A, WO2016052819A1, CN202010270250.2, CN202010285016.7, CN202010268985.1, CN202010285026.0, CN202010720191.4, CN202010825242.X$_c$ CN202010239279.4. The preparation methods are not repeated herein. In device examples, the characteristics of the device are also tested using conventional equipment in the art (including, but not limited to, evaporator produced by ANGSTROM ENGINEERING, optical testing system produced by SUZHOU FATARw life testing system produced by SUZHOU FATARw and ellipsometer produced by BEIJING ELLITOP, etc.) by methods well known to those skilled in the art. As the persons skilled in the art are aware of the above-mentioned equipment use, test methods and other related contents, the inherent data of the sample can be obtained with certainty and without influence, so the above related contents are not further described in this present disclosure.

Device Example

Device Example 1

First, a glass substrate having an Indium Tin Oxide (ITO) anode with a thickness of 120 nm was cleaned and then treated with oxygen plasma and UV ozone. After the treatment, the substrate was dried in a nitrogen-filled glovebox to remove moisture and then mounted on a substrate holder and placed in a vacuum chamber. Organic layers specified below were sequentially deposited through vacuum thermal evaporation on the ITO anode at a rate of 0.01 to 5 Å/s and at a vacuum degree of about $10^{-8}$ torr. Compound HI was used as a hole injection layer (HIL) with a thickness of 100 Å. Compound HT was used as a hole transporting layer (HTL) with a thickness of 400 Å. Compound EB was used as an electron blocking layer (EBL) with a thickness of 50 Å. Then, Compound I-1 as a first host, Compound II-190 as a second host and a phosphorescent compound RD were co-deposited as an emissive layer (EML) with a thickness of 400 Å. Compound HB was used as a hole blocking layer (HBL) with a thickness of 50 Å. On the HBLc Compound ET and 8-hydroxyquinolinolato-lithium (Liq) were co-deposited as an electron transporting layer (ETL) with a thickness of 350 Å. Finally, 8-hydroxyquinolinolato-lithium (Liq) with a thickness of 10 Å was deposited as an electron injection layer (EIL), and Al with a thickness of 1200 Å was deposited as a cathode. The device was transferred back to the glovebox and encapsulated with a glass lid to complete the device.

Device Example 2

The implementation mode in Device Example 2 was the same as that in Device Example 1, except that Compound I-1 was replaced with Compound I-19 as the first host in the emissive layer (EML).

Device Example 3

The implementation mode in Device Example 3 was the same as that in Device Example 2, except that Compound II-190 was replaced with Compound II-295 as the second host in the emissive layer (EML).

Device Example 4

The implementation mode in Device Example 4 was the same as that in Device Example 2, except that Compound II-190 was replaced with Compound II-400 as the second host in the emissive layer (EML).

Device Example 5

The implementation mode in Device Example 5 was the same as that in Device Example 4, except that Compound I-19 was replaced with Compound I-32 as the first host in the emissive layer (EML).

Device Example 6

The implementation mode in Device Example 6 was the same as that in Device Example 4, except that Compound I-19 was replaced with Compound I-34 as the first host in the emissive layer (EML).

Device Example 7

The implementation mode in Device Example 7 was the same as that in Device Example 4, except that Compound I-19 was replaced with Compound I-105 as the first host in the emissive layer (EML).

Device Example 8

The implementation mode in Device Example 8 was the same as that in Device Example 4, except that Compound I-19 was replaced with Compound I-53 as the first host in the emissive layer (EML).

Device Comparative Example 1

The implementation mode in Device Comparative Example 1 was the same as that in Device Example 1, except that Compound I-1 and Compound II-190 were replaced with Compound I-1 as a host and Compound I-1 and Compound RD were co-deposited (at a weight ratio of 97:3) in the emissive layer (EML).

Device Comparative Example 2

The implementation mode in Device Comparative Example 2 was the same as that in Device Comparative Example 1, except that Compound I-1 was replaced with Compound I-19 as the host in the emissive layer (EML).

Device Comparative Example 3

The implementation mode in Device Comparative Example 3 was the same as that in Device Comparative Example 1, except that Compound I-1 was replaced with Compound I-32 as the host in the emissive layer (EML).

Device Comparative Example 4

The implementation mode in Device Comparative Example 4 was the same as that in Device Comparative Example 1, except that Compound I-1 was replaced with Compound I-34 as the host in the emissive layer (EML).

Device Comparative Example 5

The implementation mode in Device Comparative Example 5 was the same as that in Device Comparative Example 1, except that Compound I-1 was replaced with Compound I-105 as the host in the emissive layer (EML).

Device Comparative Example 6

The implementation mode in Device Comparative Example 6 was the same as that in Device Comparative Example 1, except that Compound I-1 was replaced with Compound II-190 as the host in the emissive layer (EML).

Device Comparative Example 7

The implementation mode in Device Comparative Example 7 was the same as that in Device Comparative Example 1, except that Compound I-1 was replaced with Compound II-295 as the host in the emissive layer (EML).

Device Comparative Example 8

The implementation mode in Device Comparative Example 8 was the same as that in Device Comparative Example 1, except that Compound I-1 was replaced with Compound II-400 as the host in the emissive layer (EML).

Device Comparative Example 9

The implementation mode in Device Comparative Example 9 was the same as that in Device Comparative Example 1, except that Compound I-1 was replaced with Compound I-53 as the host in the emissive layer (EML).

Detailed structures and thicknesses of layers of the devices are shown in the following table. A layer using more than one material is obtained by doping different compounds at their weight ratios as recorded.

TABLE 1

Device structures in device examples and device comparative examples

| Device ID | HIL | HTL | EBL | EML | HBL | ETL |
|---|---|---|---|---|---|---|
| Example 1 | Compound HI (100 Å) | Compound HT (400 Å) | Compound EB (50 Å) | Compound I-1:Compound II-190:Compound RD (48.5:48.5:3) (400 Å) | Compound HB (50 Å) | Compound ET:Liq (40:60) (350 Å) |
| Example 2 | Compound HI (100 Å) | Compound HT (400 Å) | Compound EB (50 Å) | Compound I-19:Compound II-190:Compound RD (48.5:48.5:3) (400 Å) | Compound HB (50 Å) | Compound ET:Liq (40:60) (350 Å) |
| Example 3 | Compound HI (100 Å) | Compound HT (400 Å) | Compound EB (50 Å) | Compound I-19:Compound II-295:Compound RD (48.5:48.5:3) (400 Å) | Compound HB (50 Å) | Compound ET:Liq (40:60) (350 Å) |
| Example 4 | Compound HI (100 Å) | Compound HT (400 Å) | Compound EB (50 Å) | Compound I-19:Compound II-400:Compound RD (48.5:48.5:3) (400 Å) | Compound HB (50 Å) | Compound ET:Liq (40:60) (350 Å) |
| Example 5 | Compound HI (100 Å) | Compound HT (400 Å) | Compound EB (50 Å) | Compound I-32:Compound II-400:Compound RD (48.5:48.5:3) (400 Å) | Compound HB (50 Å) | Compound ET:Liq (40:60) (350 Å) |

TABLE 1-continued

Device structures in device examples and device comparative examples

| Device ID | HIL | HTL | EBL | EML | HBL | ETL |
|---|---|---|---|---|---|---|
| Example 6 | Compound HI (100 Å) | Compound HT (400 Å) | Compound EB (50 Å) | Compound I-34:Compound II-400:Compound RD (48.5:48.5:3) (400 Å) | Compound HB (50 Å) | Compound ET:Liq (40:60) (350 Å) |
| Example 7 | Compound HI (100 Å) | Compound HT (400 Å) | Compound EB (50 Å) | Compound I-105:Compound II-400:Compound RD (48.5:48.5:3) (400 Å) | Compound HB (50 Å) | Compound ET:Liq (40:60) (350 Å) |
| Example 8 | Compound HI (100 Å) | Compound HT (400 Å) | Compound EB (50 Å) | Compound I-53:Compound II-400:Compound RD (48.5:48.5:3) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound I-1:Compound RD (97:3) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound I-19:Compound RD (97:3) (400 Å) | Compound HB (50 Å) | Compound ET:Liq (40:60) (350 Å) |
| Comparative Example 3 | Compound HI (100 Å) | Compound HT (400 Å) | Compound EB (50 Å) | Compound I-32:Compound RD (97:3) (400 Å) | Compound HB (50 Å) | Compound ET:Liq (40:60) (350 Å) |
| Comparative Example 4 | Compound HI (100 Å) | Compound HT (400 Å) | Compound EB (50 Å) | Compound I-34: Compound RD (97:3) (400 Å) | Compound HB (50 Å) | Compound ET:Liq (40:60) (350 Å) |
| Comparative Example 5 | Compound HI (100 Å) | Compound HT (400 Å) | Compound EB (50 Å) | Compound I-105:Compound RD (97:3) (400 Å) | Compound HB (50 Å) | Compound ET:Liq (40:60) (350 Å) |
| Comparative Example 6 | Compound HI (100 Å) | Compound HT (400 Å) | Compound EB (50 Å) | Compound II-190:Compound RD (97:3) (400 Å) | Compound HB (50 Å) | Compound ET:Liq (40:60) (350 Å) |
| Comparative Example 7 | Compound HI (100 Å) | Compound HT (400 Å) | Compound EB (50 Å) | Compound II-295:Compound RD (97:3) (400 Å) | Compound HB (50 Å) | Compound ET:Liq (40:60) (350 Å) |
| Comparative Example 8 | Compound HI (100 Å) | Compound HT (400 Å) | Compound EB (50 Å) | Compound II-400:Compound RD (97:3) (400 Å) | Compound HB (50 Å) | Compound ET:Liq (40:60) (350 Å) |
| Comparative Example 9 | Compound HI (100 Å) | Compound HT (400 Å) | Compound EB (50 Å) | Compound I-53:Compound RD (97:3) (400 Å) | Compound HB (50 Å) | Compound ET:Liq (40:60) (350 Å) |

The structures of the materials used in the devices are shown as follows:

Compound HI

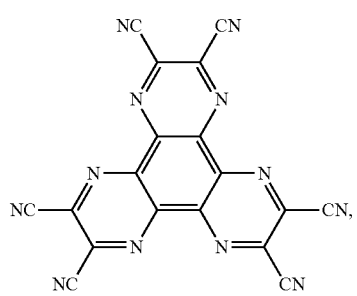

-continued

Compound HT

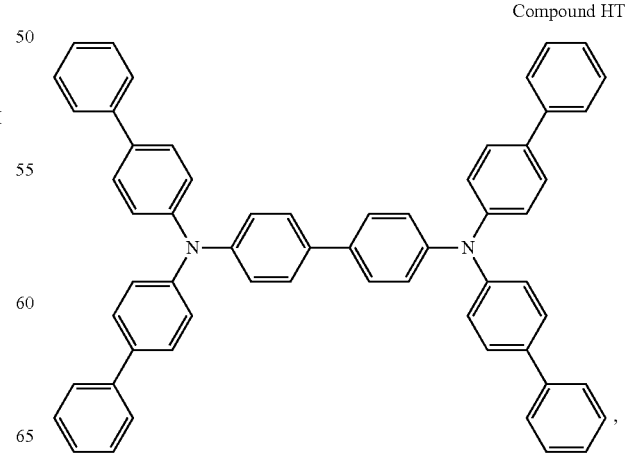

Compound EB
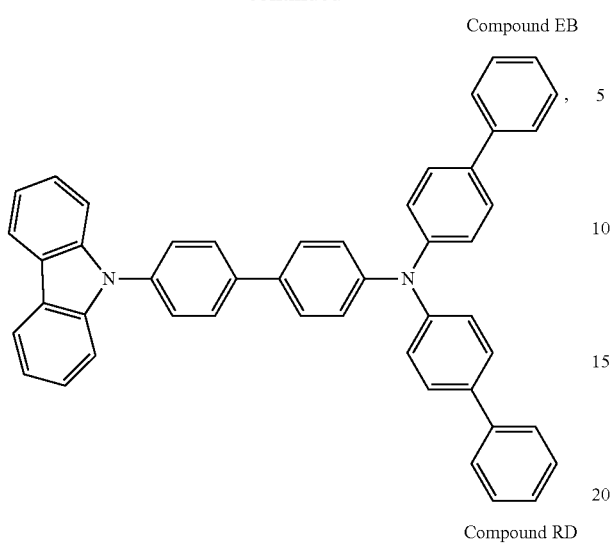
Compound RD
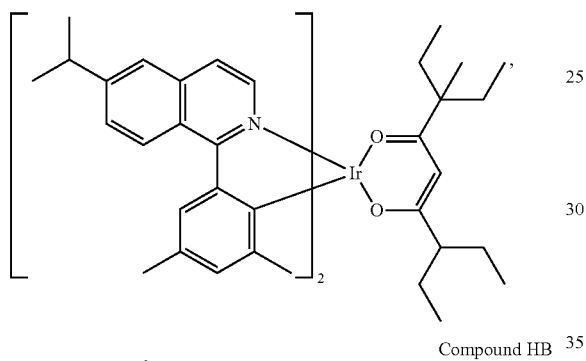
Compound HB
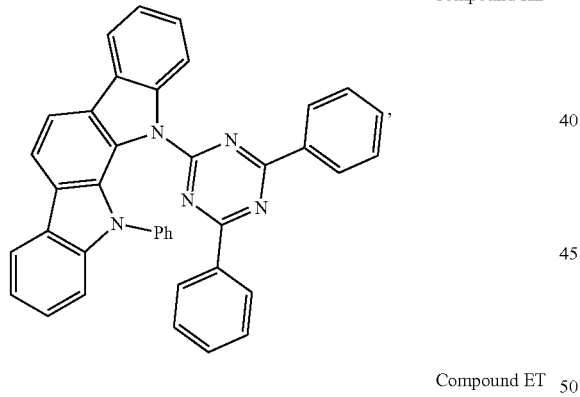
Compound ET
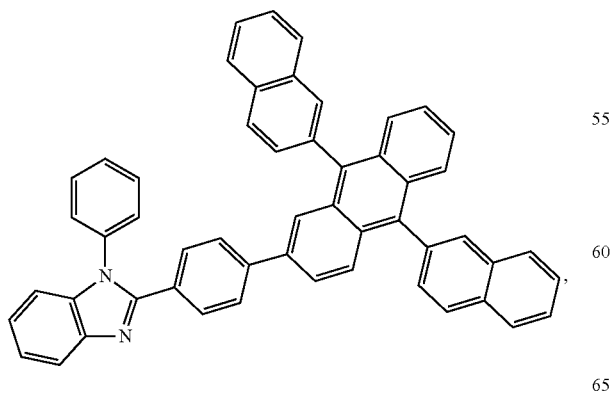
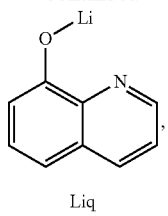
Liq
Compound 1-1
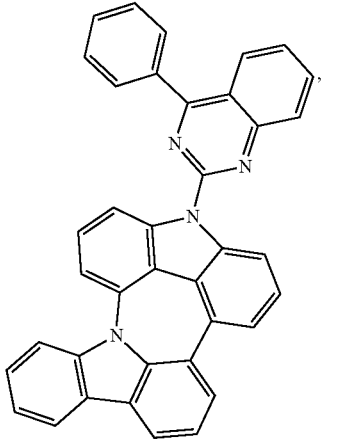
Compound I-19
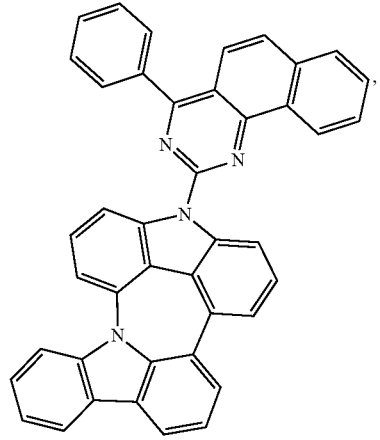
Compound I-32
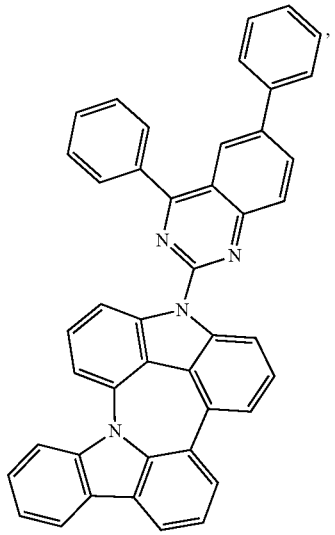

-continued

Compound I-34

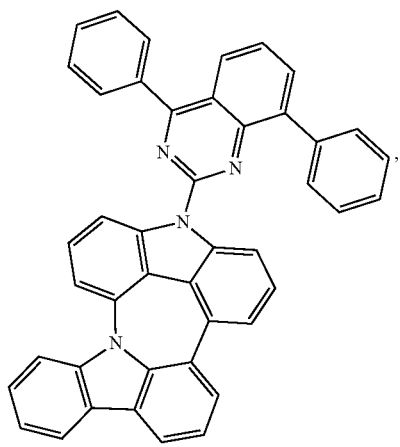

Compound I-105

Compound I-53

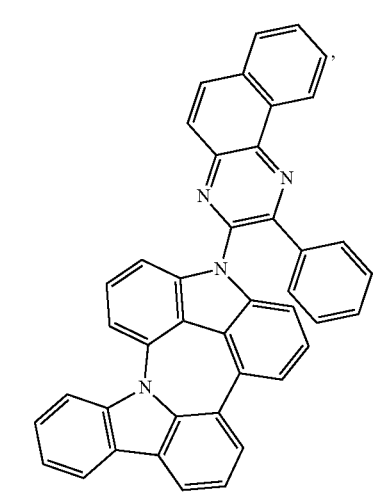

-continued

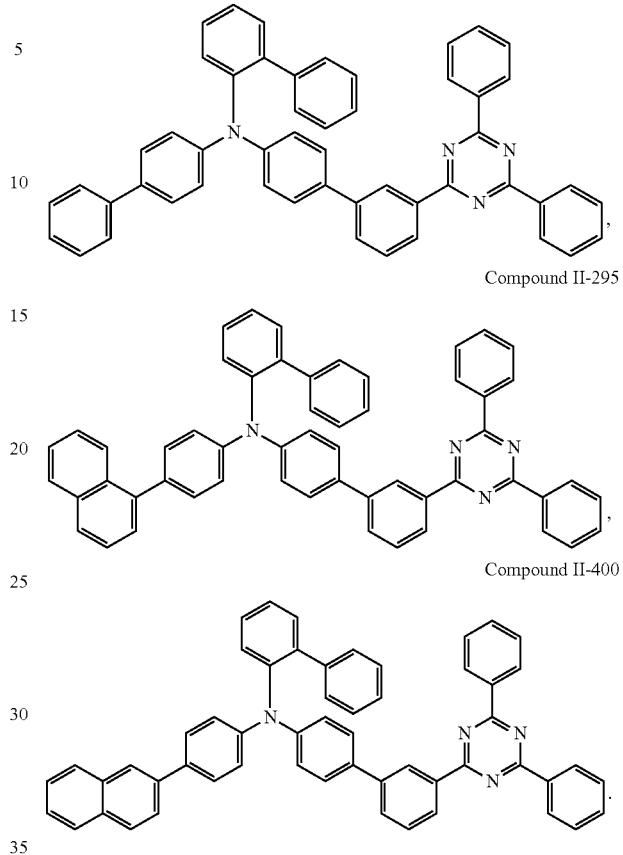

The voltage (V), external quantum efficiency (EQE), current efficiency (CE) and maximum wavelength ($\lambda_{max}$) of the device were measured at 15 mA/cm². The lifetime (LT97) of the device was measured at a constant current of 80 mA/cm², where the lifetime (LT97) refers to the time for the device to decay to 97% of its initial brightness. The data was recorded and shown in Table 2.

TABLE 2

| | Device data | | | | |
|---|---|---|---|---|---|
| | At 15 mA/cm² | | | | At 80 mA/cm² |
| Device ID | $\lambda_{max}$ (nm) | Voltage (V) | EQE (%) | CE (Cd/A) | LT97 (h) |
| Example 1 | 625 | 3.70 | 22.0 | 19 | 92 |
| Example 2 | 625 | 3.82 | 23.9 | 20 | 86 |
| Example 3 | 626 | 3.70 | 24.1 | 20 | 67 |
| Example 4 | 626 | 3.85 | 24.1 | 20 | 92 |
| Example 5 | 626 | 3.78 | 22.1 | 19 | 125 |
| Example 6 | 626 | 4.19 | 24.2 | 20 | 64 |
| Example 7 | 625 | 4.26 | 24.7 | 21 | 44 |
| Example 8 | 625 | 4.18 | 24.2 | 20 | 42 |
| Comparative Example 1 | 628 | 3.88 | 18.9 | 15 | 98 |
| Comparative Example 2 | 628 | 3.99 | 19.6 | 15 | 67 |
| Comparative Example 3 | 627 | 4.07 | 13.5 | 11 | 84 |
| Comparative Example 4 | 627 | 3.97 | 23.1 | 19 | 49 |
| Comparative Example 5 | 626 | 3.93 | 23.2 | 19 | 16 |

TABLE 2-continued

Device data

| Device ID | At 15 mA/cm² | | | | At 80 mA/cm² |
| --- | --- | --- | --- | --- | --- |
| | $\lambda_{max}$ (nm) | Voltage (V) | EQE (%) | CE (Cd/A) | LT97 (h) |
| Comparative Example 6 | 625 | 4.59 | 25.2 | 21 | 1 |
| Comparative Example 7 | 625 | 4.99 | 25.1 | 20 | 17 |
| Comparative Example 8 | 625 | 4.63 | 26.0 | 21 | 5 |
| Comparative Example 9 | 625 | 3.29 | 21.3 | 17 | 40 |

DISCUSSION

As shown in Table 2, compared with Comparative Examples 1 to 5 using only the first compound as the host, Examples 1 to 7 using a combination of the first compound and the second compound disclosed in the present disclosure as hosts had slightly changed maximum emission wavelength $\lambda_{max}$ which was blue-shifted by 1 nm to 3 nm at a current density of 15 mA/cm²; compared with Comparative Examples 6 to 8 using only the second compound as the host, Examples 1 to 7 had substantially the same $\lambda_{max}$.

Example 1 had a 0.18 V lower driving voltage, 1600 higher external quantum efficiency and 260% higher current efficiency than Comparative Example 1, and the lifetime LT97 of Example 1 reached 92 hours which was 6 hours shorter but still at a very high level in the industry; Examples 2, 3 and 4 had a 0.17 V, 0.29 V and 0.14 V lower driving voltage, 21.9%, 23.0% and 23.0% higher external quantum efficiency and 33.3% higher current efficiency than Comparative Example 2, respectively, the lifetimes of Examples 2 and 4 were increased by 19 hours and 25 hours, respectively, which were 28% and 37% longer than that of Comparative Example 2, and the lifetime of Example 3 was the same as that of Comparative Example 2; Example 5 had a 0.29 V lower driving voltage, 63% higher external quantum efficiency and 72% higher current efficiency than Comparative Example 3, and the lifetime of Example 5 was increased by 41 hours; the driving voltage of Example 6 was 4.19 V which was 0.22 V higher than that of Comparative Example 4 but still a relatively low voltage in the industry, Example 6 had 4.8% higher external quantum efficiency and 5.3% higher current efficiency than Comparative Example 4, and more importantly, the lifetime of Example 6 was increased by 15 hours which was 30% longer; though the driving voltage of Example 7 was 0.33 V higher than that of Comparative Example 5, Example 7 had 6.5% higher external quantum efficiency and 10.5% higher current efficiency than Comparative Example 5, and more importantly, the lifetime of Example 7 was increased by 28 hours which was up to 175% longer; the driving voltage of Example 8 was 0.9 V higher than that of Comparative Example 9 but still at a relatively low level in the industry, and more importantly, Example 8 had 14.5% higher external quantum efficiency and 17.6% higher current efficiency than Comparative Example 9. To conclude, compared with comparative examples using only the first compound as the host, the light-emitting devices using the combination of the first compound and the second compound disclosed in the present disclosure as the hosts have significant driving voltage, external quantum efficiency, current efficiency and device lifetime and exhibit very excellent overall performance.

Examples 1 and 2 had a 0.89 V lower driving voltage and a 0.77 V lower driving voltage than Comparative Example 6 using only the same second compound as the host, respectively, the external quantum efficiency of Examples 1 and 2 reached 22.0% and 23.9% which were slightly reduced (by 12.7% and 5.2%) but still at a relatively high level in the industry, and more importantly, the lifetimes of Examples 1 and 2 were greatly increased to 92 hours and 86 hours which were nearly 100 times longer than 1 hour of Comparative Example 6; Example 3 had a 1.29 V lower driving voltage than Comparative Example 7, the external quantum efficiency of Example 3 was 24.1% which was slightly reduced (by 4.0%) but still at a very high level in the industry, Example 3 had the same current efficiency as Comparative Example 7, and more importantly, the lifetime of Example 3 was greatly increased by 50 hours, an increase of up to 294%; compared with Comparative Example 8, the driving voltages of Examples 4 to 7 were reduced by 0.78 V, 0.85 V, 0.44 V and 0.37 V, respectively, the external quantum efficiency of Examples 4 to 7 was 24.1%, 22.1%, 24.2%, 24.7%, respectively, which were slightly reduced (by 7.3%, 15.0%, 6.9% and 5.0%) but still at a high or even very high level in the industry, and more importantly, the lifetimes of Examples 4 to 7 were greatly increased (by 87 hours, 120 hours, 59 hours and 39 hours, respectively), achieving a huge increase of 7.8 times at the lowest and 24 times at the highest. It can be seen from the preceding results that compared with comparative examples using only the second compound as the host, the light-emitting devices using a novel combination of host materials disclosed in the present disclosure have slightly lower device efficiency which is still at a relatively high level, can significantly reduce the driving voltage, and more importantly, can improve the device lifetime very greatly, which proves that the novel combination of host materials disclosed in the present disclosure has excellent overall performance, a very high commercial value of development and a very good application prospect.

The preceding results show that the novel combination of host materials in the emissive layer, disclosed in the present disclosure, can maintain the driving voltage, the device efficiency and the device lifetime at high levels. Compared with comparative examples using only a single compound in the combination of host materials as the host, the electroluminescent device using the novel combination of host materials disclosed in the present disclosure has more excellent overall performance.

It is to be understood that various embodiments described herein are merely exemplary and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It is to be understood that various theories as to why the present disclosure works are not intended to be limitative.

What is claimed is:

1. An electroluminescent device, comprising:
   an anode,
   a cathode, and
   an organic layer disposed between the anode and the cathode, wherein the organic layer comprises a first compound and a second compound;
   wherein the first compound has a structure of $H_1$-$L_1$-$E_1$;

wherein H₁ has a structure represented by Formula 1-1-a:

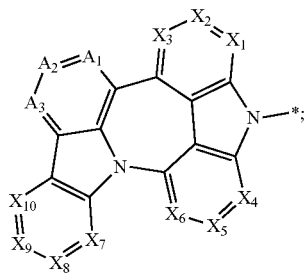

Formula 1-1-a in Formula 1-1-a, $A_1$, $A_2$ and $A_3$ are, at each occurrence identically or differently, selected from N or CR, and $X_1$ to $X_{10}$ are, at each occurrence identically or differently, selected from N or $CR_x$;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

two adjacent substituents R can be optionally joined to form a ring; and in Formula 1-1-a, "*" represents the position where the structure represented by Formula 1-1-a is joined to the $L_1$;

a single bond $L_1$ is L1-0;

the E1 has a structure represented by any one of the group consisting of Formula 1-2-a, Formula 1-2-d, Formula 1-2-h, and Formula 1-2-i:

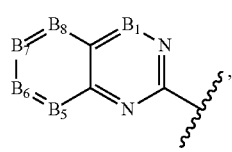

Formula 1-2-a

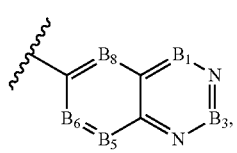

Formula 1-2-d

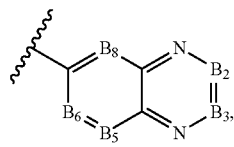

Formula 1-2-h

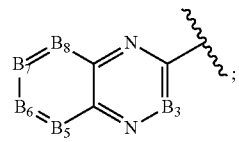

Formula 1-2-i wherein in Formula 1-2-a, Formula 1-2-d, Formula 1-2-h, and Formula 1-2-i, $B_1$ to $B_8$ are, at each occurrence identically or differently, selected from $CR_z$;

in Formula 1-2-a and Formula 1-2-i, at least one of $B_5$ to $B_8$ is selected from $CR_z$, and the $R_z$ is, at each occurrence identically or differently, selected from substituted or unsubstituted aryl having 6 to 30 carbon atoms;

wherein $R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

substituted alkyl, substituted cycloalkyl, substituted heteroalkyl, a substituted heterocyclic group, substituted arylalkyl, substituted alkoxy, substituted aryloxy, substituted alkenyl, substituted aryl, substituted alkylsilyl, substituted arylsilyl, substituted amino, substituted acyl, substituted carbonyl, a substituted carboxylic acid group, a substituted ester group, substituted sulfinyl, substituted sulfonyl and substituted phosphino means that any group of alkyl, cycloalkyl, heteroalkyl, heterocyclic group, arylalkyl, alkoxy, aryloxy, alkenyl, aryl, alkylsilyl, arylsilyl, amino, acyl, carbonyl, carboxylic acid group, ester group, sulfinyl, sulfonyl and phosphino may be substituted with one or more groups selected from the group consisting of deuterium, halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted heterocyclic group having 3 to 20 ring atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkynyl group having 2 to 20 carbon atoms, an unsubstituted aryl group having 6 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

represents the position where a structure represented by Formula 1-2-a, Formula 1-2-d, Formula 1-2-h, and Formula 1-2-i is joined to the $L_1$;

or, the E1 has a structure represented by Formula 1-4:

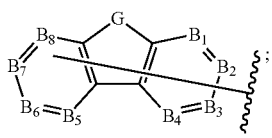

Formula 1-4 wherein in Formula 1-4, $B_1$ to $B_8$ are, at each occurrence identically or differently, selected from C, N or $CR_z$, and at least one of $B_1$ to $B_8$ is selected from N; and wherein G is selected from $CR_gR_g$, $SiR_gR_g$, $NR_g$, $BR_g$, $PR_g$, O, S or Se; when two $R_g$ are present at the same time, the two $R_g$ may be identical or different;

wherein $R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$, $R_g$ can be optionally joined to form a ring; and in Formula 1-4,

represents the position where the structure represented by Formula 1-4 is joined to the $L_1$; wherein the second compound has a structure of $H_2$-$L_2$-$E_2$;

wherein $H_2$ has a structure represented by Formula 2-1:

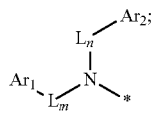

Formula 2-1 in Formula 2-1, $Ar_1$ and $Ar_2$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$L_m$ and $L_n$ are, at each occurrence identically or differently, selected from the group consisting of: a single bond, substituted or unsubstituted arylene having 6 to 30 carbon atoms, substituted or unsubstituted heteroarylene having 3 to 30 carbon atoms and combinations thereof; and in Formula 2-1, "*" represents the position where the structure represented by Formula 2-1 is joined to the L2;

$L_2$ is selected from substituted or unsubstituted arylene having 6 to 30 carbon atoms, substituted or unsubstituted heteroarylene having 3 to 30 carbon atoms or a combination thereof;

$E_2$ has a structure represented by Formula 2-2:

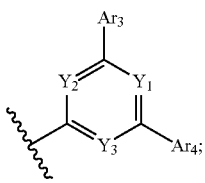

Formula 2-2 in Formula 2-2, $Y_1$, $Y_2$ and $Y_3$ are N;

wherein $Ar_3$ and $Ar_4$ are, at each occurrence identically or differently, selected from the group consisting of: substituted or unsubstituted aryl having 6 to 30 carbon atoms, substituted or unsubstituted heteroaryl having 3 to 30 carbon atoms and combinations thereof;

$R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and in Formula 2-2,

"ξ"

represents the position where the structure represented by Formula 2-2 is joined to the $L_2$.

2. The electroluminescent device of claim 1, wherein in the first compound,

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group, an isocyano group, a hydroxyl group, a sulfanyl group and combinations thereof; and adjacent substituents R can be optionally joined to form a ring.

3. The electroluminescent device of claim 2, wherein at least one of R and $R_x$ is selected from deuterium, halogen, a cyano group, a hydroxyl group, a sulfanyl group, substituted or unsubstituted alkyl having 1 to 20 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms or a combination thereof; and adjacent substituents R can be optionally joined to form a ring.

4. The electroluminescent device of claim 1, wherein $H_1$ is selected from any one of the group consisting of the following structures:

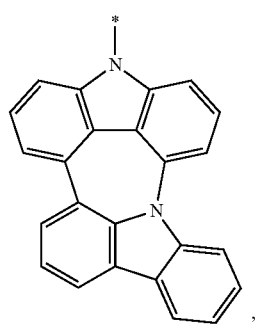

H1-1

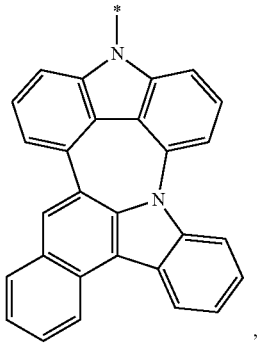

H1-7

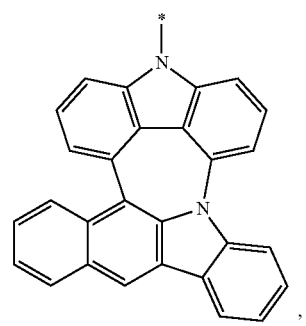

H1-8

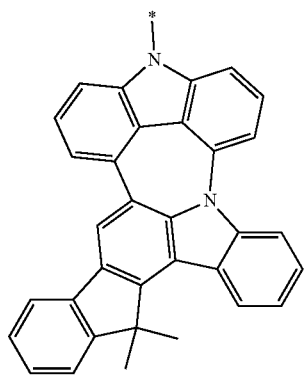

H1-65

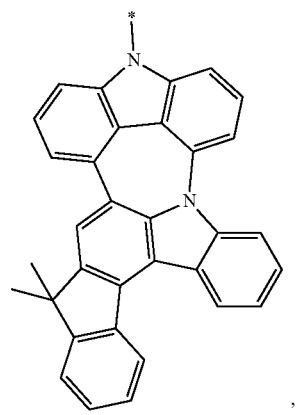

H1-66

-continued
H1-67
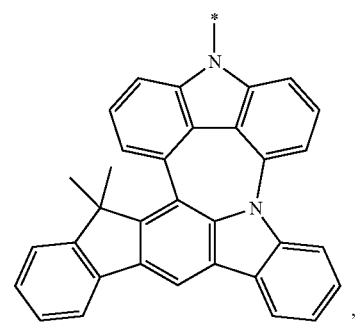
H1-68
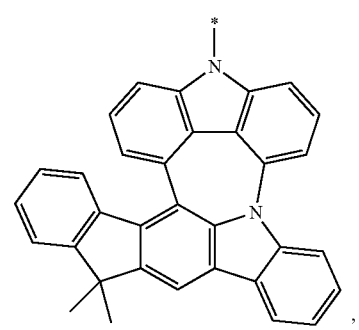
H1-102
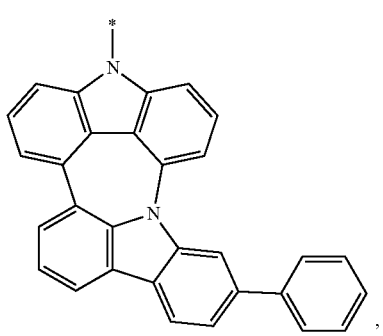
H1-103
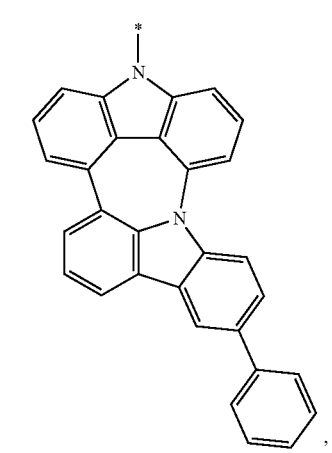
H1-104
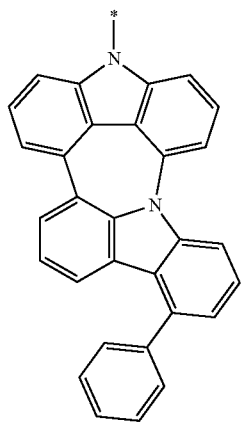
H1-105
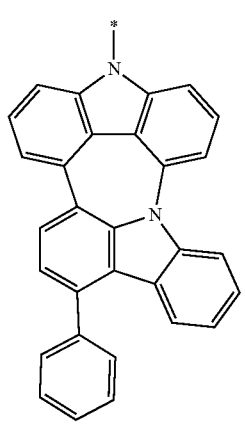
H1-106
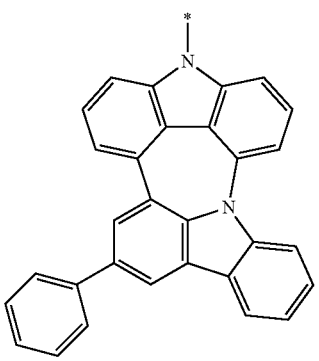
H1-107
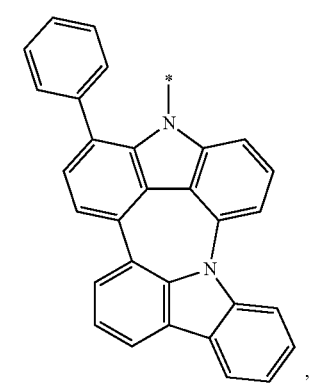

-continued
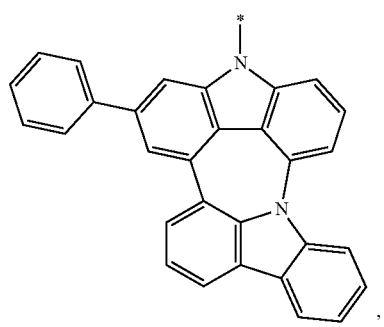
H1-108
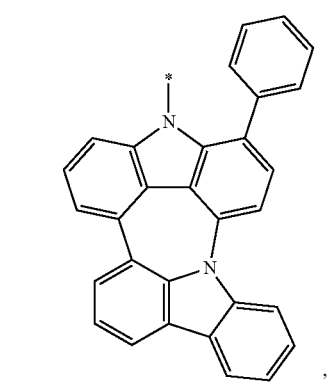
H1-109
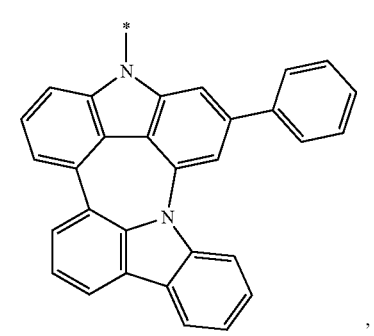
H1-110
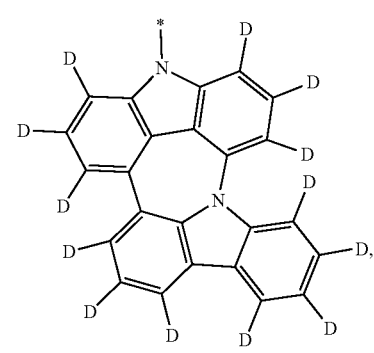
H1-111
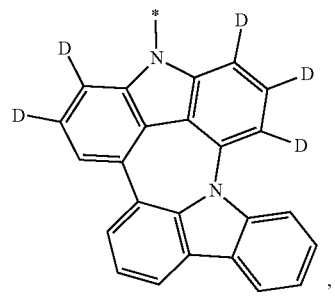
H1-112
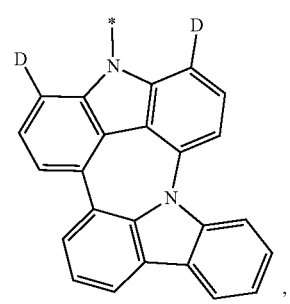
H1-113
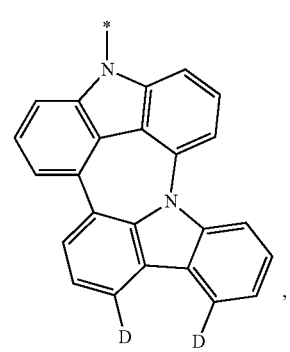
H1-114
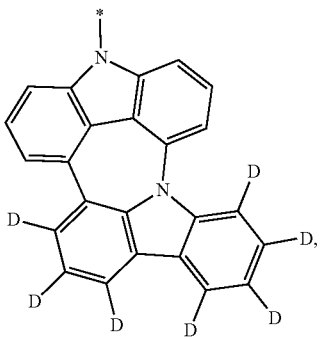
H1-115
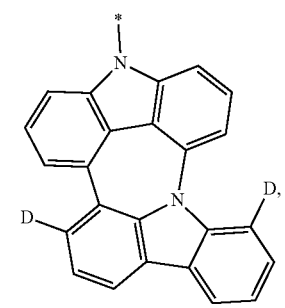
H1-116

H1-117 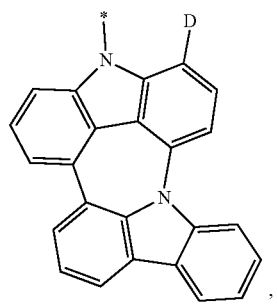
H1-118 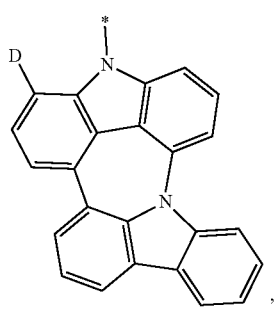
H1-119 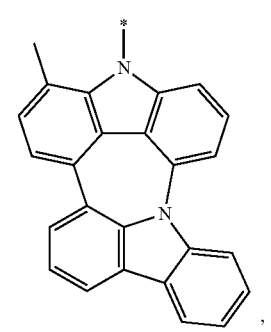
H1-120 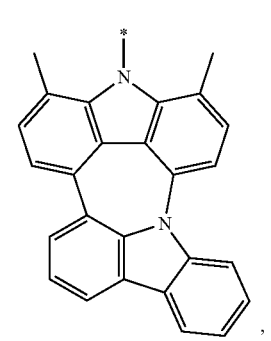
H1-121 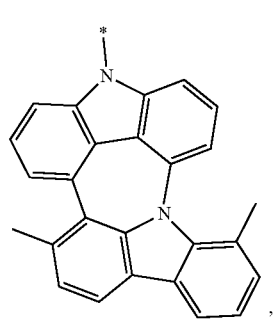
H1-122 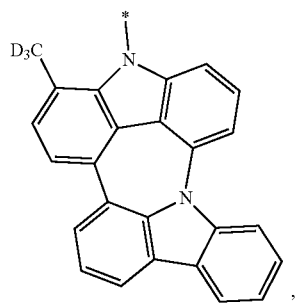
H1-123 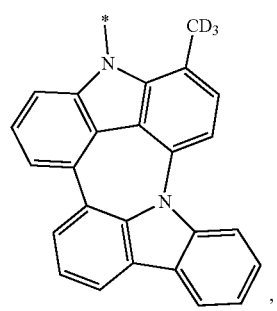
H1-124 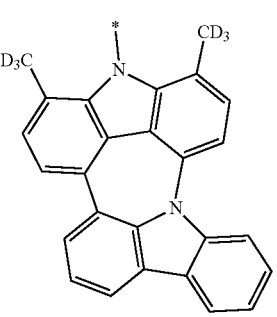
H1-125 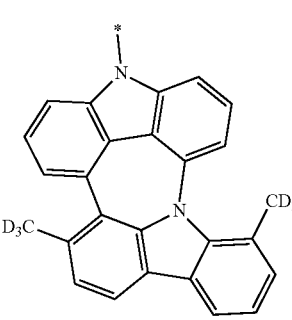
H1-126 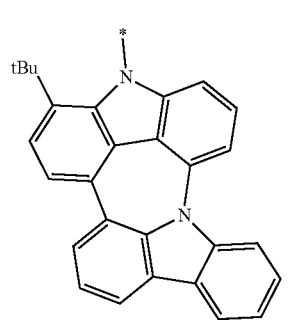

H1-127 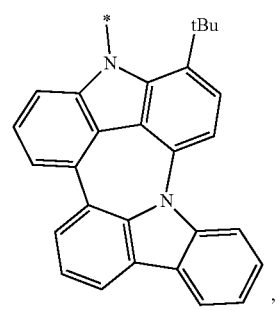
H1-128 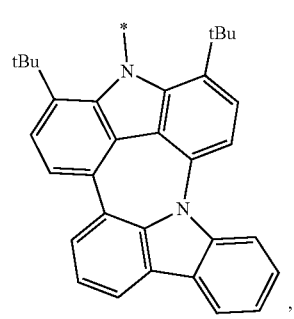
H1-129 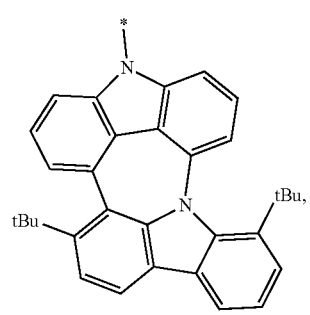
H1-130 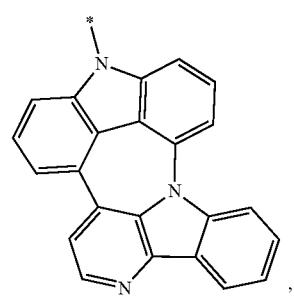
H1-131 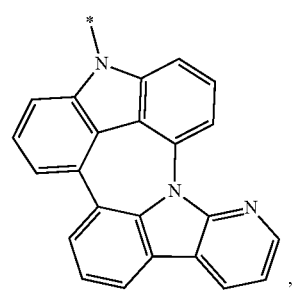
H1-132 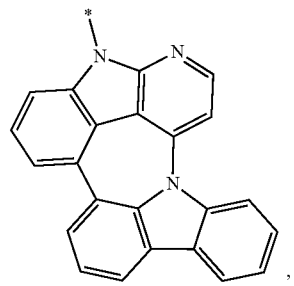
H1-133 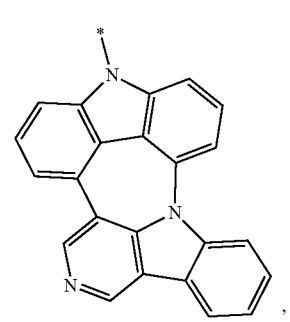
H1-134 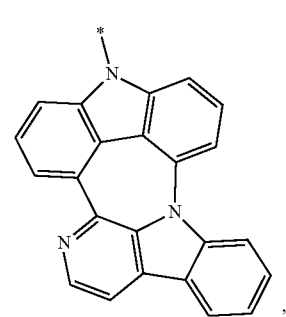
H1-138 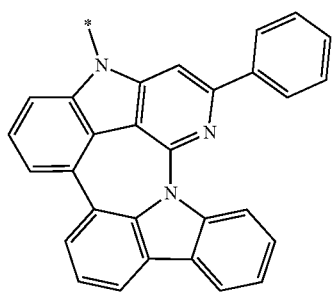
H1-139 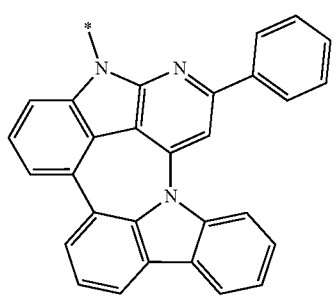

-continued

H1-140

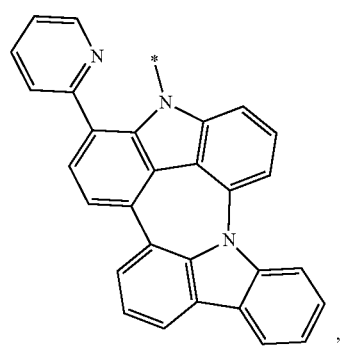

H1-141

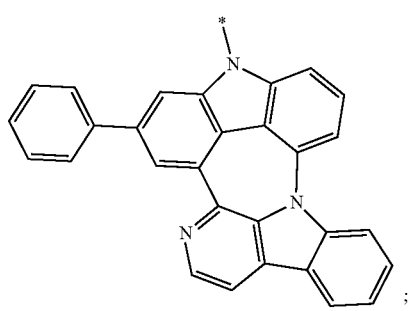

wherein "*" represents the position where a structure of the H1-1, H1-7, H1-8, H1-65 to H1-68, H1-102 to H1-134, and H1-138 to H1-141 is joined to the $L_1$;

optionally, hydrogens in the structures of the H1-1, H1-7, H1-8, H1-65 to H1-68, H1-102 to H1-134, and H1-138 to H1-141 can be partially or fully substituted with deuterium.

5. The electroluminescent device of claim 1, wherein the $E_1$ has a structure represented by Formula 1-4:

Formula 1-4

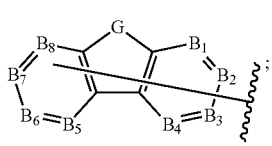

wherein in Formula 1-4, $B_1$ to $B_8$ are, at each occurrence identically or differently, selected from C, N or $CR_z$, and at least one of $B_1$ to $B_8$ is selected from N; and wherein G is selected from $CR_gR_g$, $SiR_gR_g$, $NR_g$, $BR_g$, $PR_g$, O, S or Se; when two $R_g$ are present at the same time, the two $R_g$ may be identical or different;

wherein $R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_z$, $R_g$ can be optionally joined to form a ring; and in Formula 1-4,

represents the position where the structure represented by Formula 1-4 is joined to the $L_1$.

6. The electroluminescent device of claim 1, wherein in Formula 1-2-a, Formula 1-2-d, Formula 1-2-h, and Formula 1-2-i, $B_1$ to $B_8$ are, at each occurrence identically or differently, selected from $CR_z$;

wherein the $R_z$ is, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to carbon atoms, substituted or unsubstituted aryl having 6 to 30 carbon atoms, substituted or unsubstituted heteroaryl having 3 to 30 carbon atoms and combinations thereof; and at least one $R_z$ in $B_1$ to $B_4$ is, at each occurrence identically or differently, selected from the group consisting of: deuterium, halogen, cyano, hydroxyl, sulfanyl, substituted or unsubstituted alkyl having 1 to carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof.

7. The electroluminescent device of claim 4, wherein the $E_1$ is, at each occurrence identically or differently, selected from any one of the group consisting of the following:

E1-31

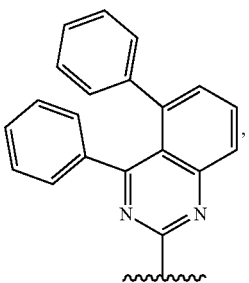

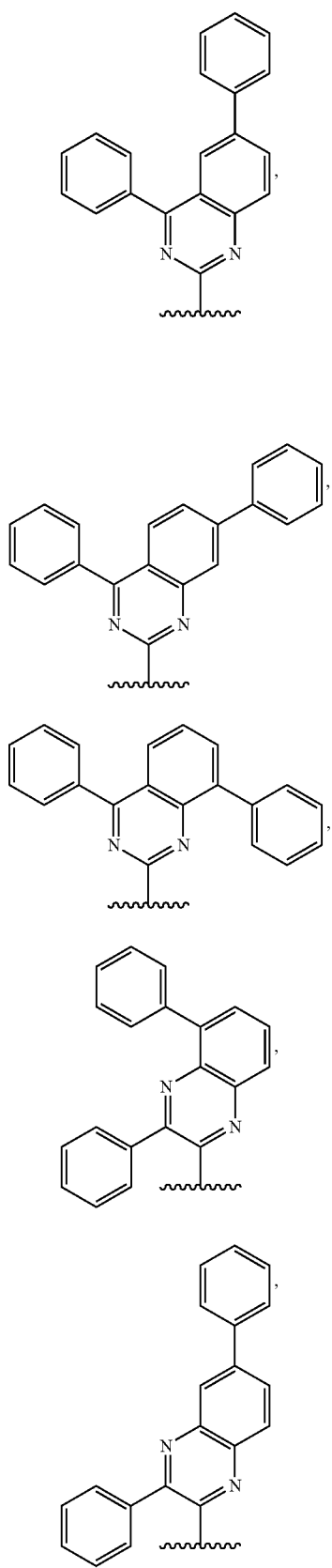
E1-32
E1-33
E1-34
E1-63
E1-64
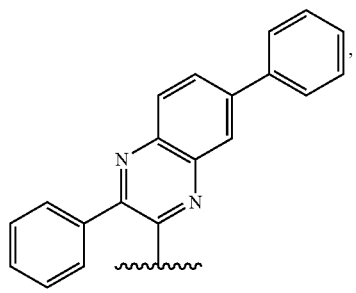
E1-65
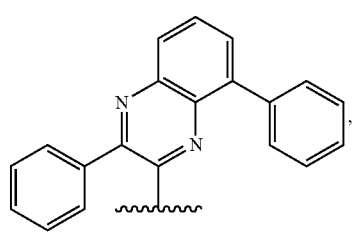
E1-66
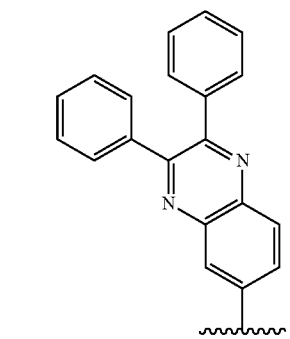
E1-108
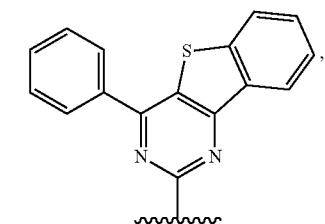
E1-135
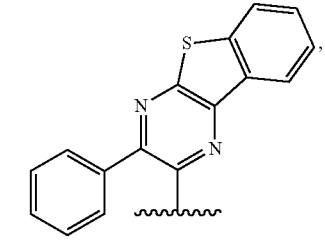
E1-136
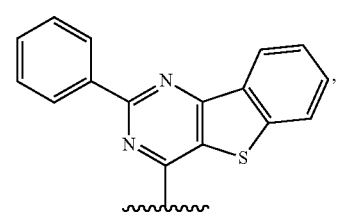
E1-137

-continued

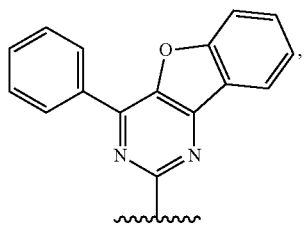 E1-138

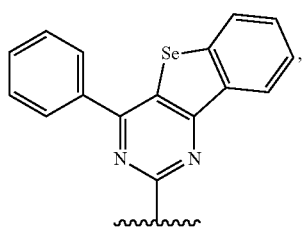 E1-139

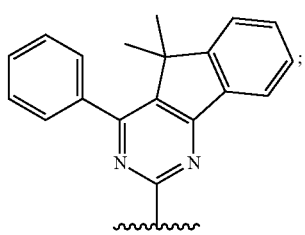 E1-140 wherein

"⸙"

represents the position where a structure of the E1-31 to E1-34, E1-63 to E1-66, E1-108, and E1-135 to E1-140 is joined to $L_1$;

optionally, hydrogens in the structures of the E1-31 to E1-34, E1-63 to E1-66, E1-108, and E1-135 to E1-140 can be partially or fully substituted with deuterium.

8. The electroluminescent device of claim 7, wherein the first compound has the structure of $H_1$-$L_1$-$E_1$, wherein the $H_1$ is selected from any one of the group consisting of H1-1, H1-7, H1-8, H1-65 to H1-68, H1-102 to H1-134, and H1-138 to H1-141, the $L_1$ is L1-0, and the $E_1$ is selected from any one of the group consisting of E1-31 to E1-34, E1-63 to E1-66, E1-108, and E1-135 to E1-140; optionally, hydrogens in the first compound can be partially or fully substituted with deuterium.

9. The electroluminescent device of claim 1, wherein in Formula 2-1, $Ar_1$ and $Ar_2$ are, at each occurrence identically or differently, selected from the group consisting of: substituted or unsubstituted aryl having 6 to 18 carbon atoms, substituted or unsubstituted heteroaryl having 3 to 18 carbon atoms and combinations thereof.

10. The electroluminescent device of claim 1, wherein in Formula 2-1, $L_m$ and $L_n$ are, at each occurrence identically or differently, selected from the group consisting of: a single bond, substituted or unsubstituted arylene having 6 to 18 carbon atoms, substituted or unsubstituted heteroarylene having 3 to 18 carbon atoms and combinations thereof.

11. The electroluminescent device of claim 1, wherein in the second compound, the $H_2$ is, at each occurrence identically or differently, selected from any one of the group consisting of the following:

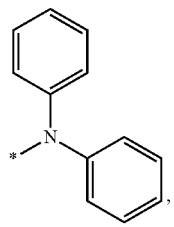 H2-1

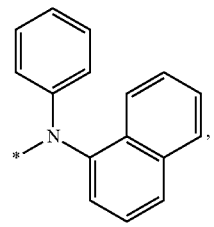 H2-2

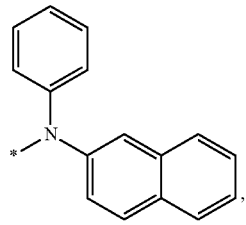 H2-3

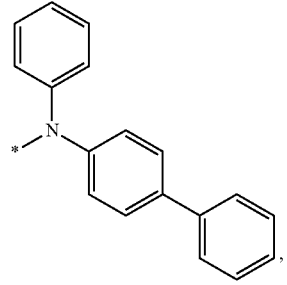 H2-4

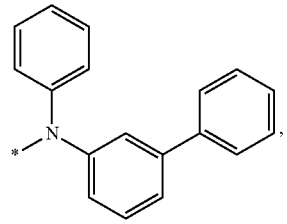 H2-5

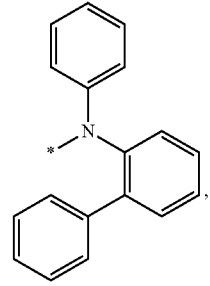 H2-6

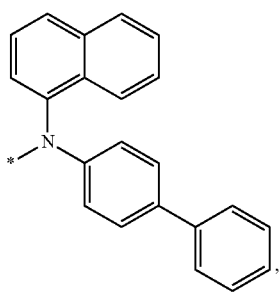
H2-7
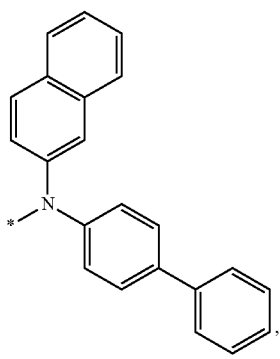
H2-8
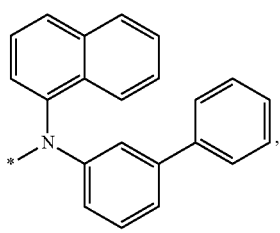
H2-9
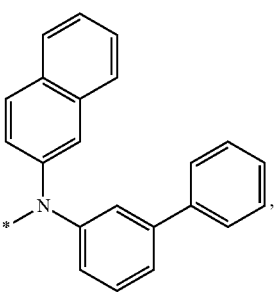
H2-10
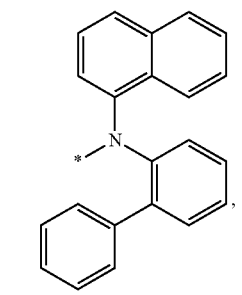
H2-11
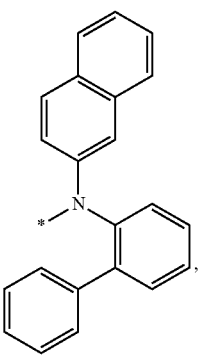
H2-12
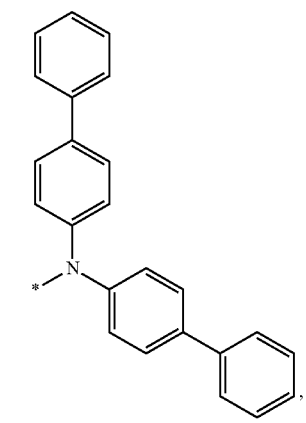
H2-13
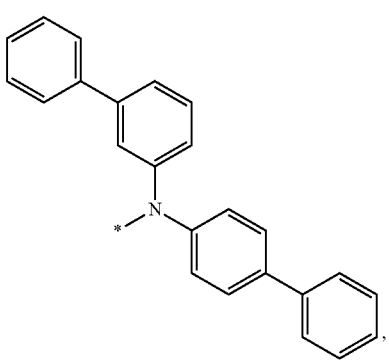
H2-14
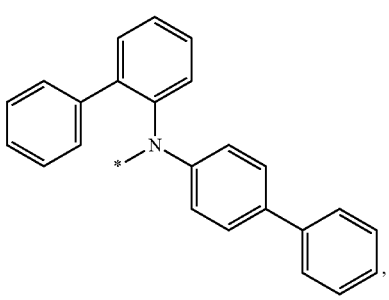
H2-15

H2-16
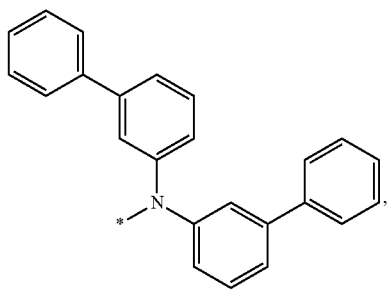
H2-17
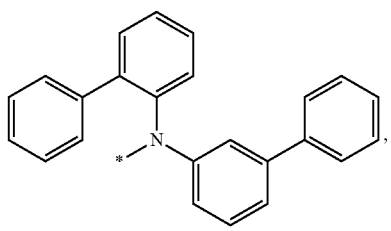
H2-18
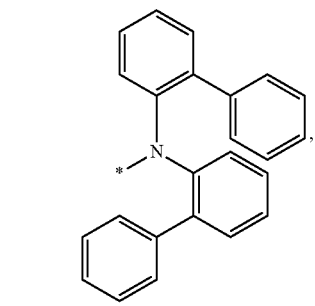
H2-19
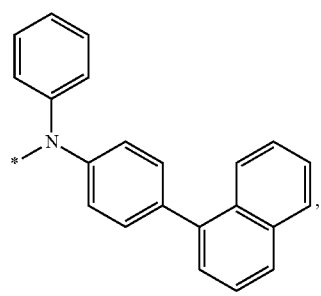
H2-20
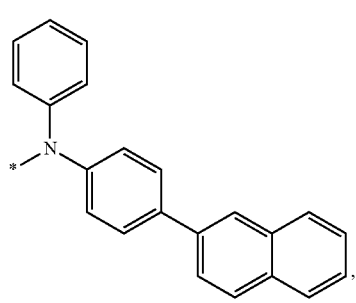
H2-21
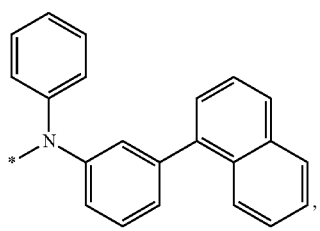
H2-22
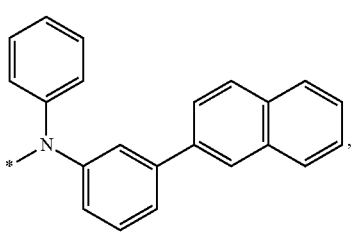
H2-23
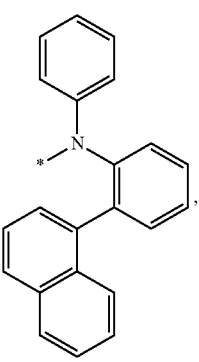
H2-24
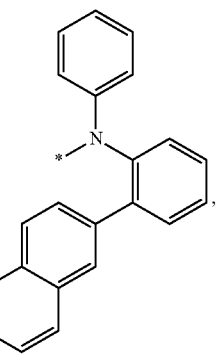
H2-25
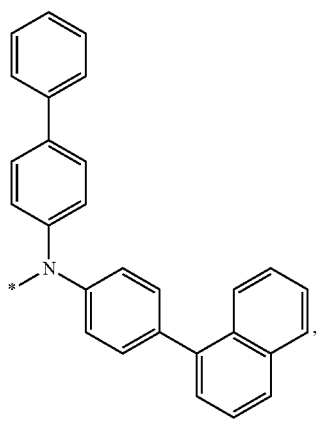

-continued
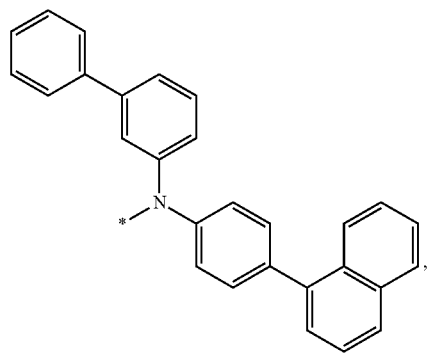
H2-26
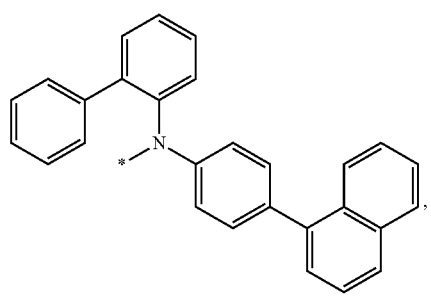
H2-27
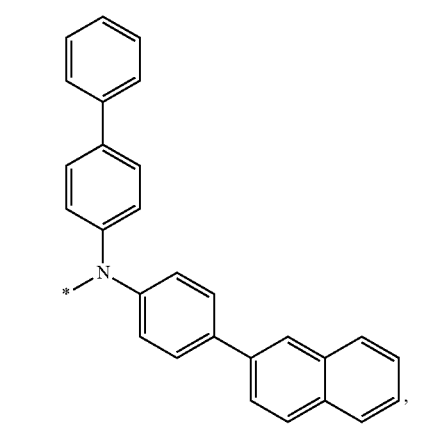
H2-28
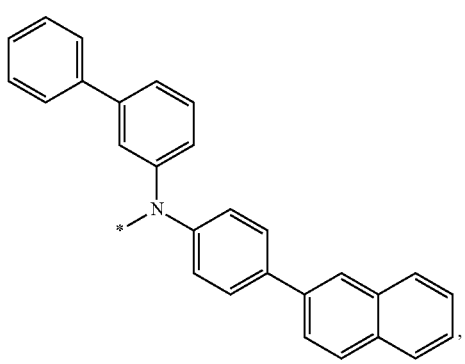
H2-29
-continued
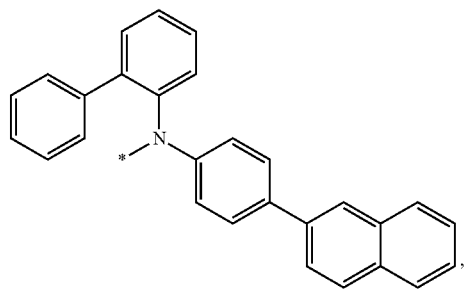
H2-30
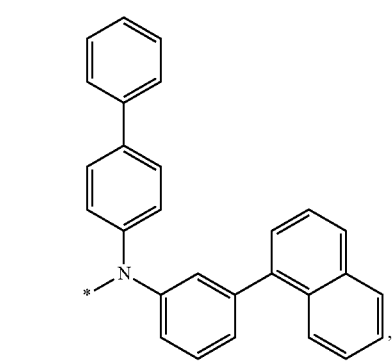
H2-31
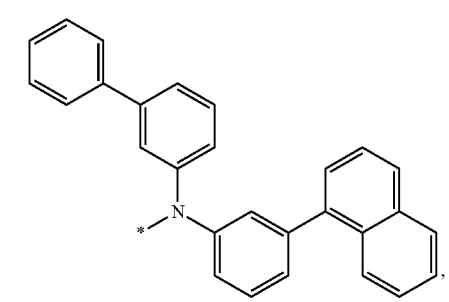
H2-32
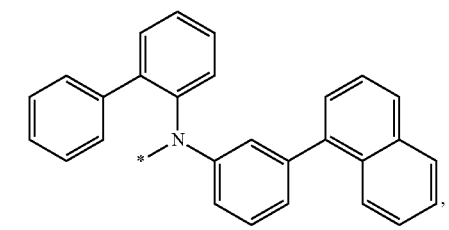
H2-33
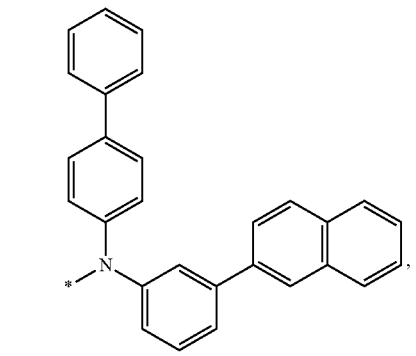
H2-34

H2-35
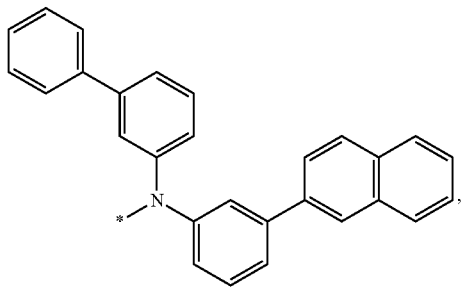
H2-36
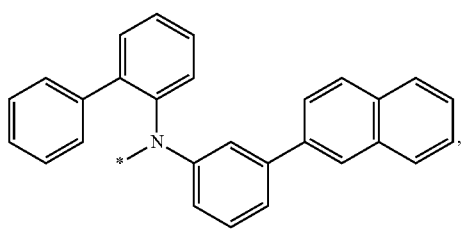
H2-37
H2-38
H2-39
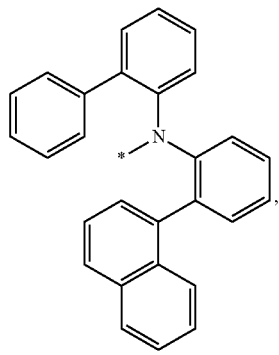
H2-40
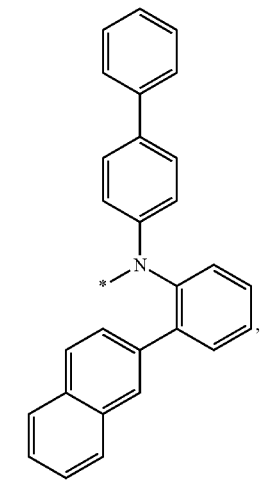
H2-41
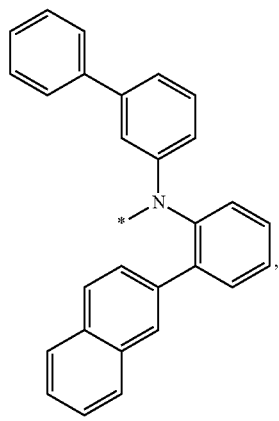
H2-42
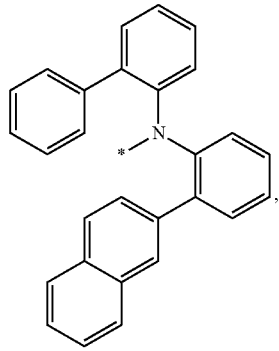

-continued
H2-43
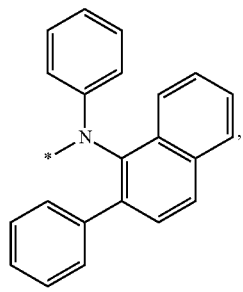
H2-44
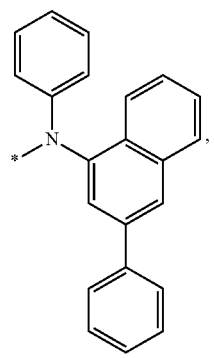
H2-45
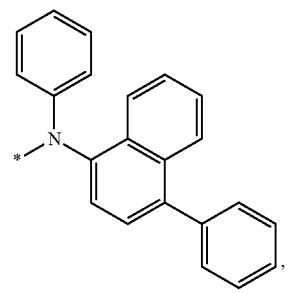
H2-46
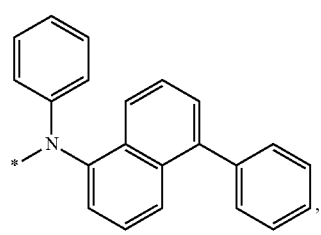
H2-47
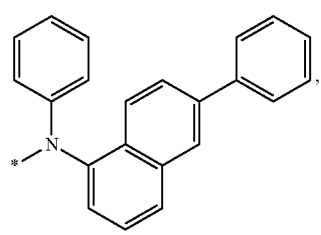
-continued
H2-48
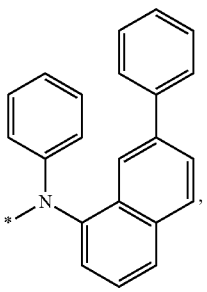
H2-49
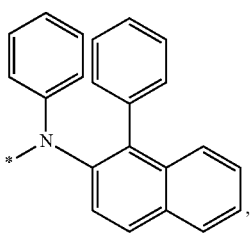
H2-50
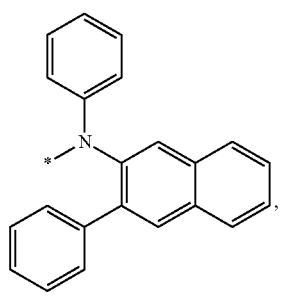
H2-51
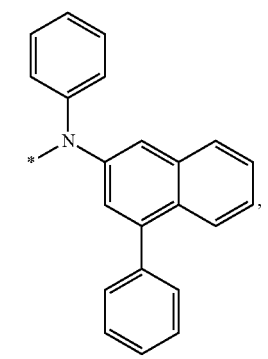
H2-52
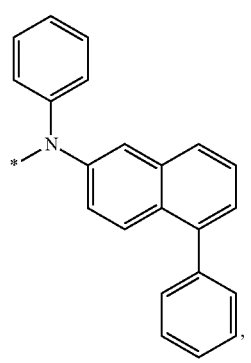

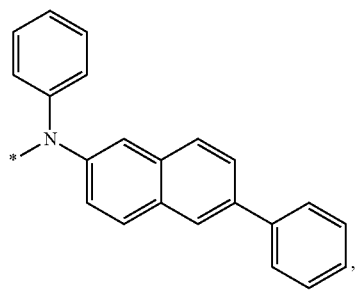
H2-53
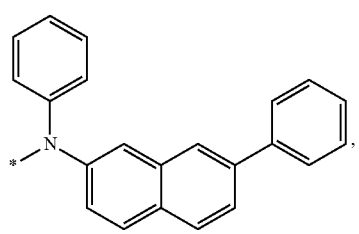
H2-54
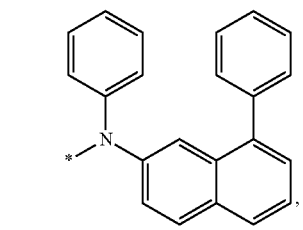
H2-55
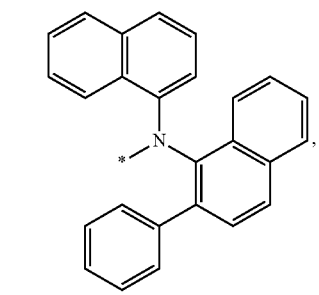
H2-56
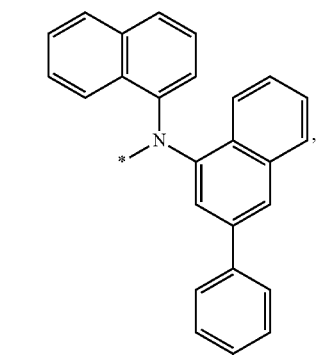
H2-57
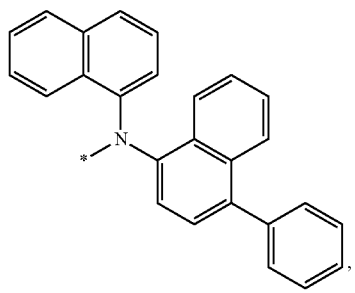
H2-58
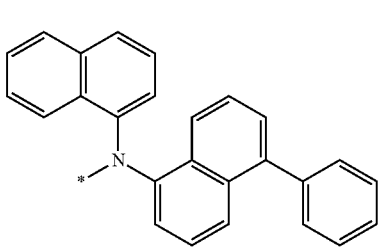
H2-59
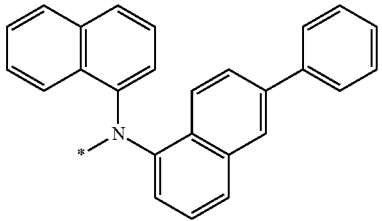
H2-60
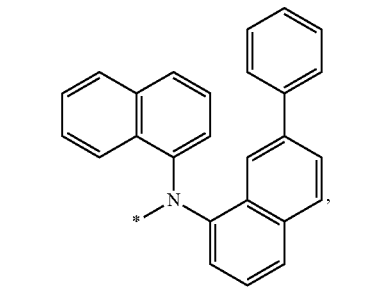
H2-61
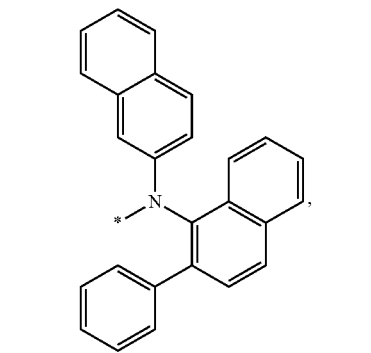
H2-62

H2-63
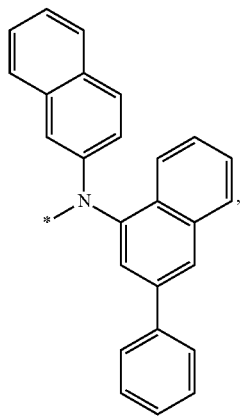
H2-64
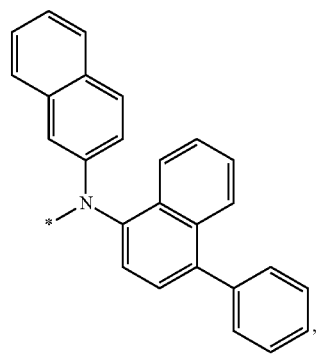
H2-65
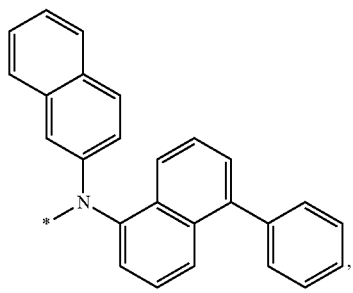
H2-66
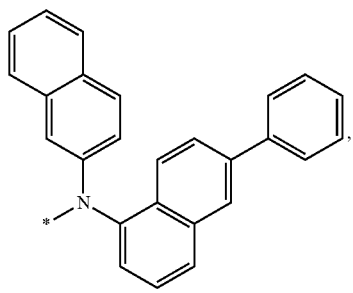
H2-67
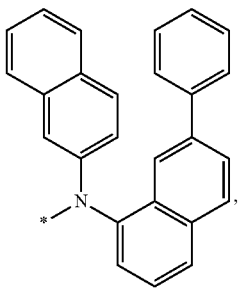
H2-68
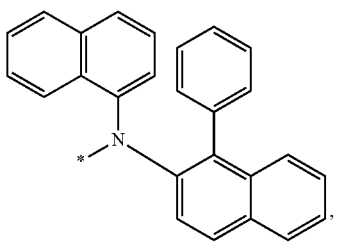
H2-69
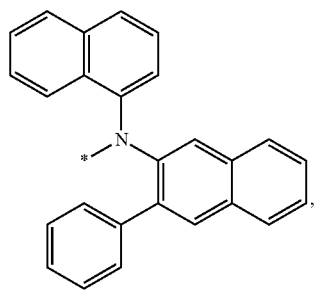
H2-70
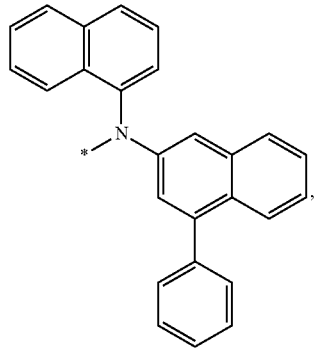
H2-71
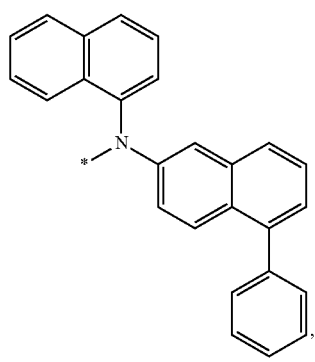

H2-72
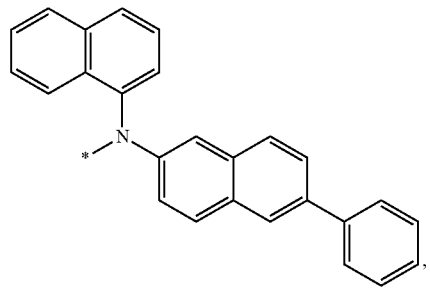
H2-73
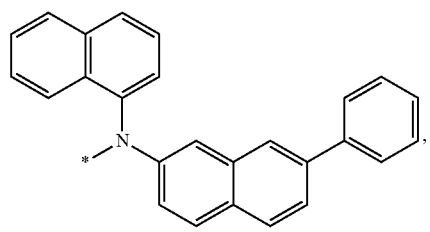
H2-74
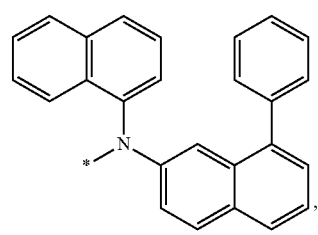
H2-75
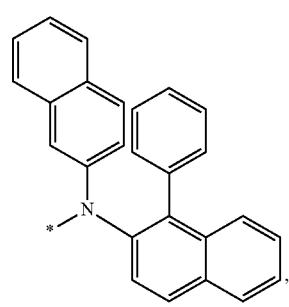
H2-76
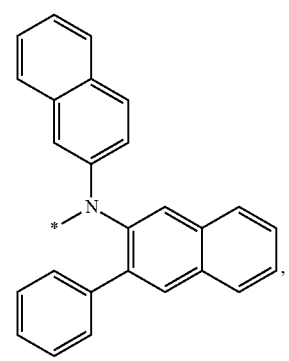
H2-77
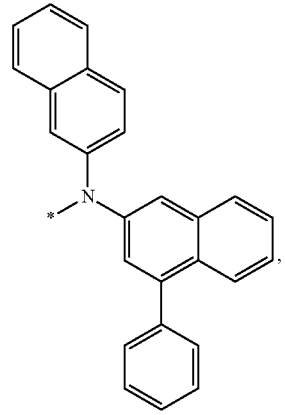
H2-78
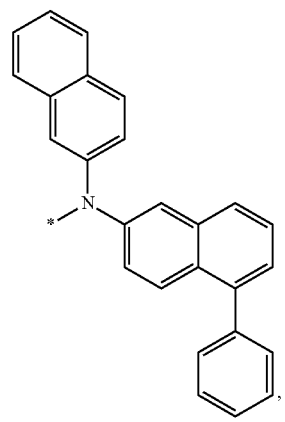
H2-79
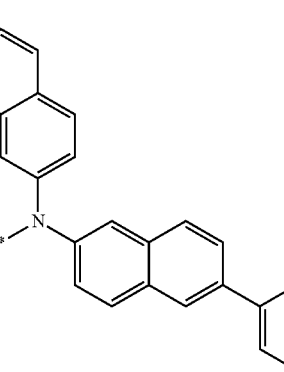
H2-80
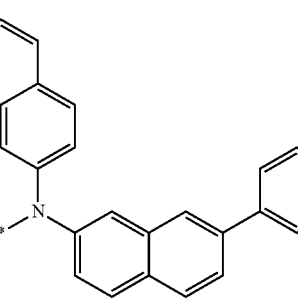

H2-81
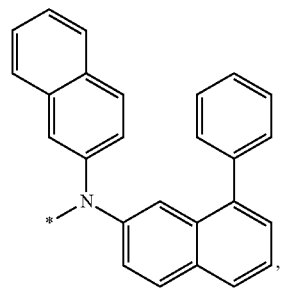
H2-82
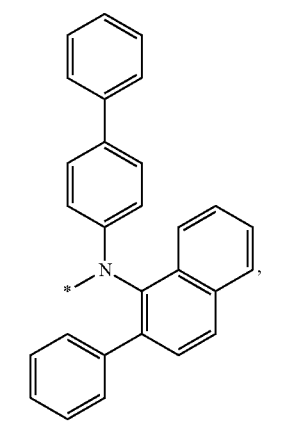
H2-83
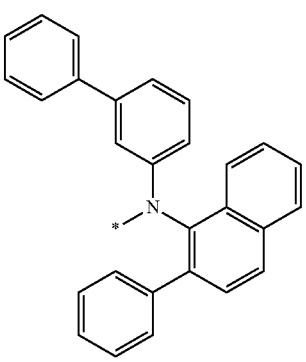
H2-84
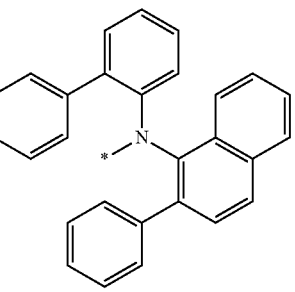
H2-85
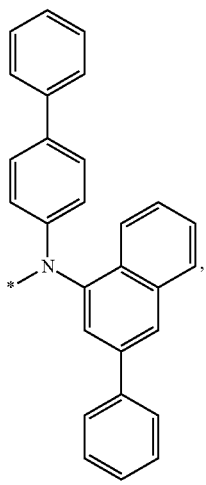
H2-86
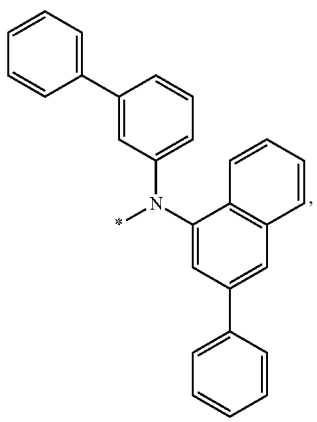
H2-87
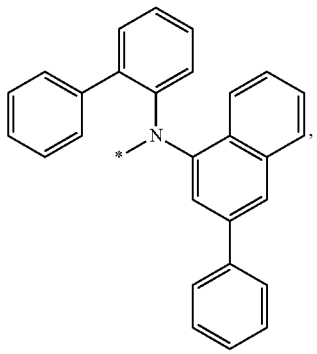

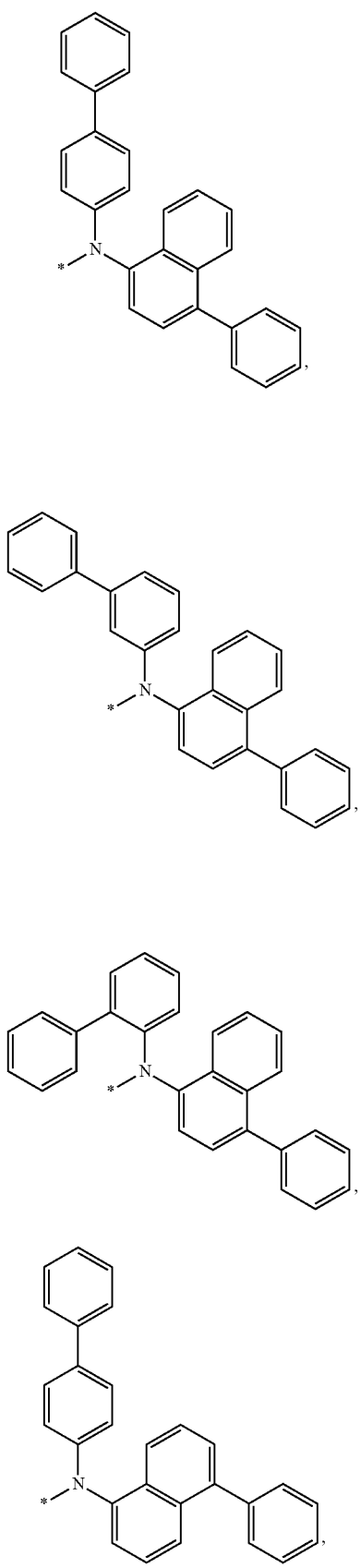
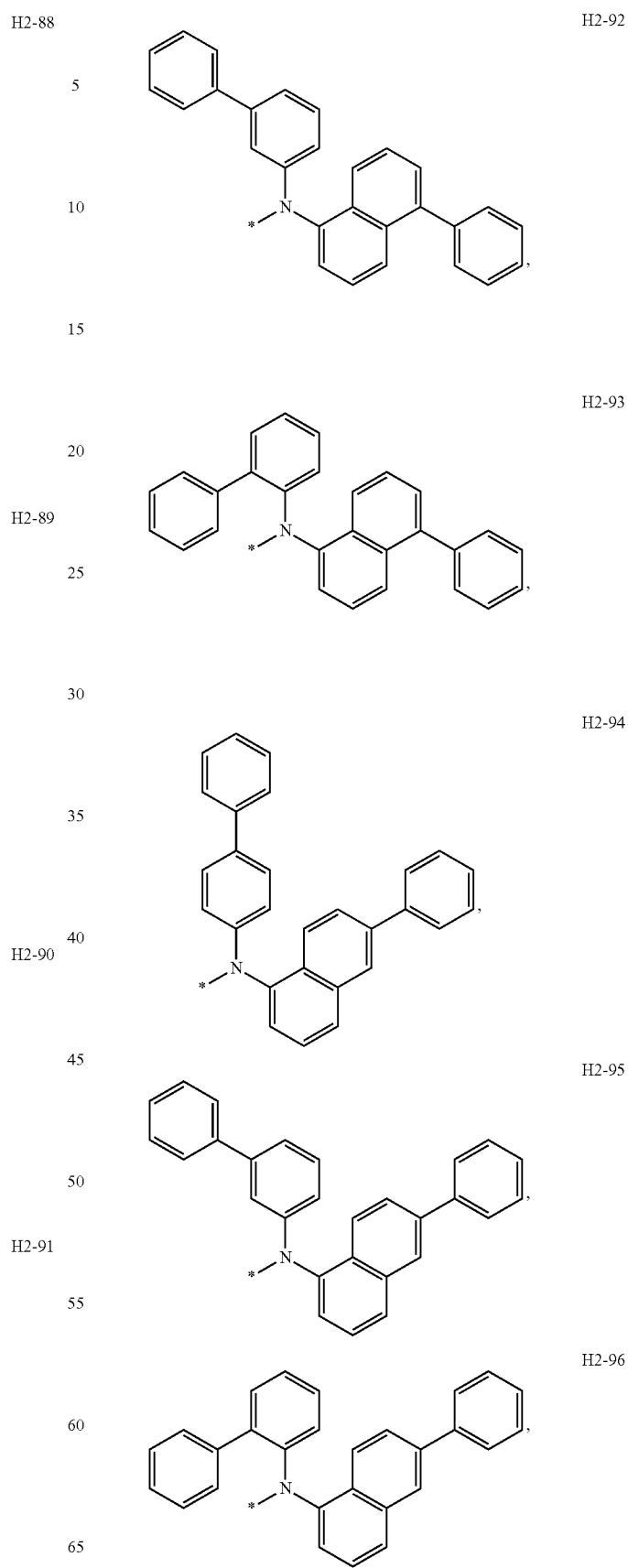

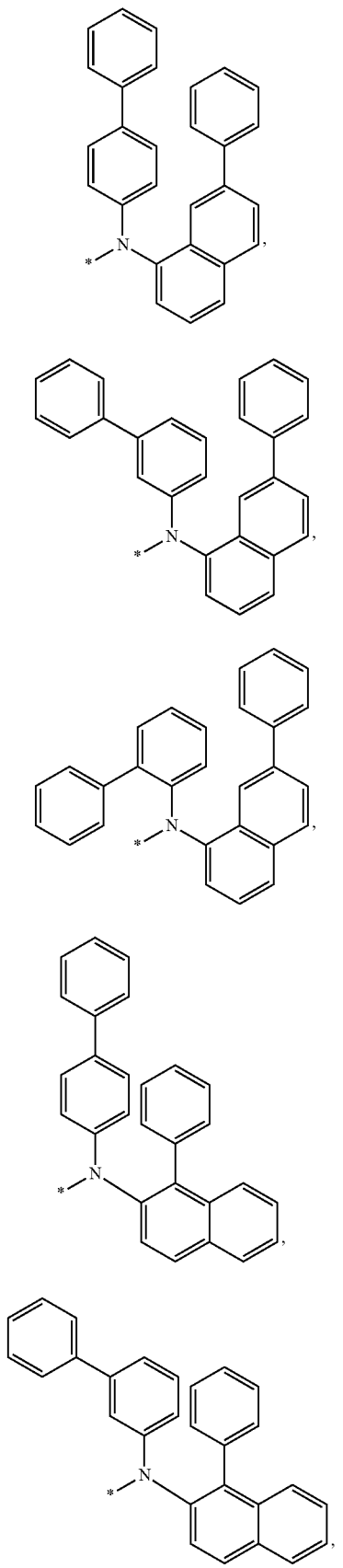
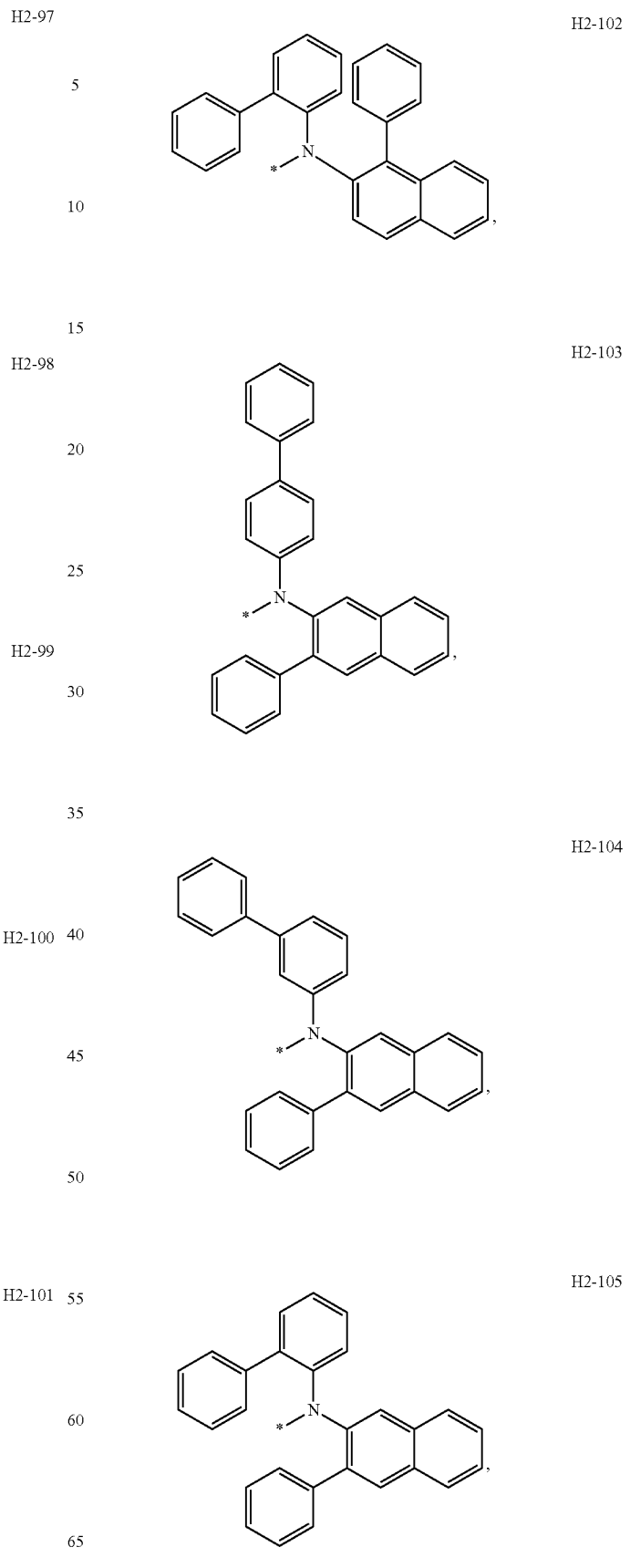

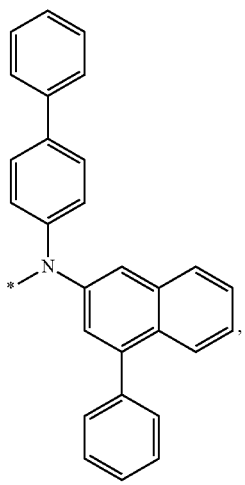
H2-106
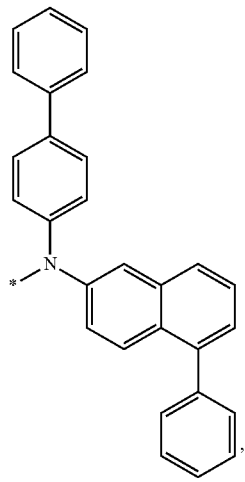
H2-109
H2-107
H2-110
H2-108
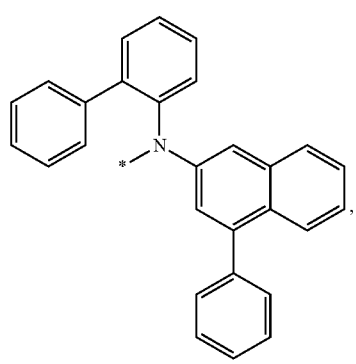
H2-111
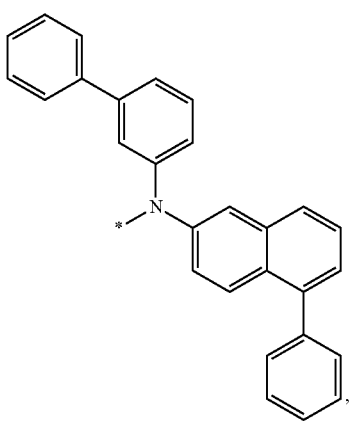

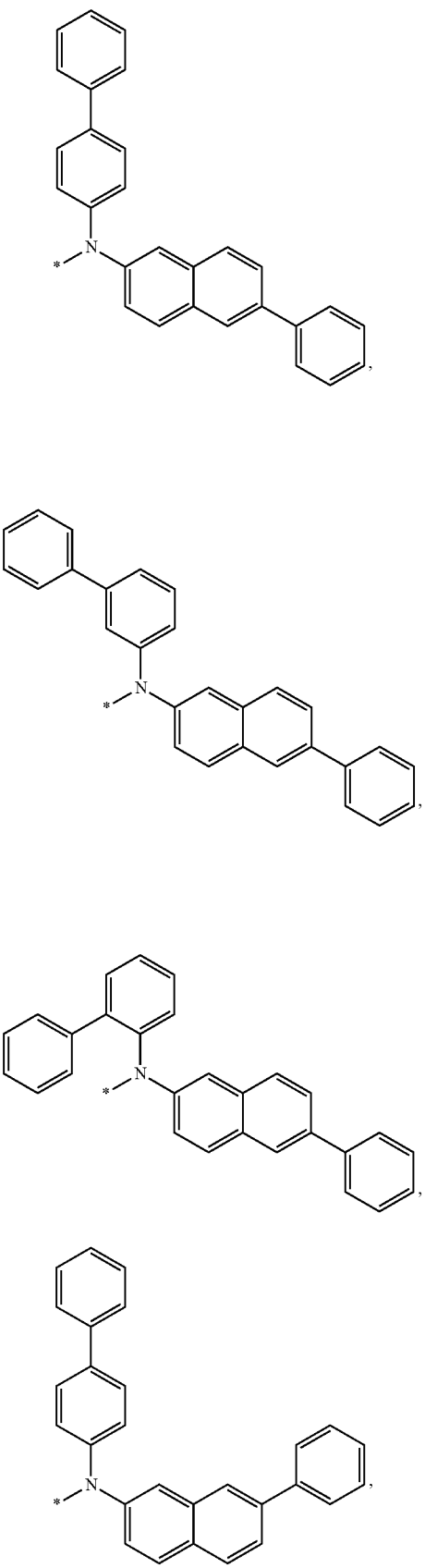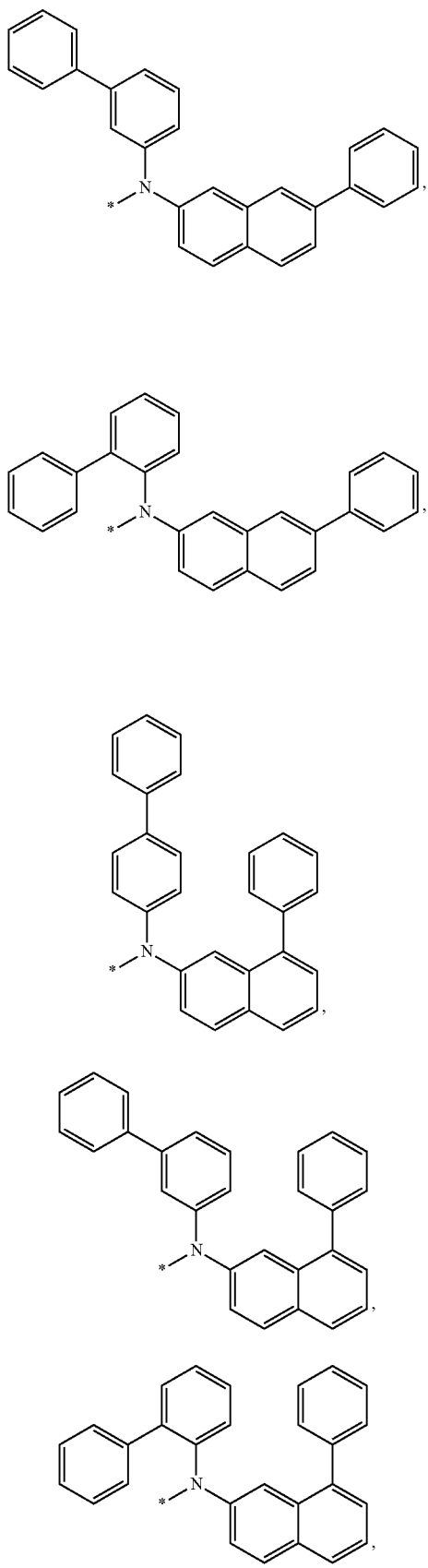

H2-121
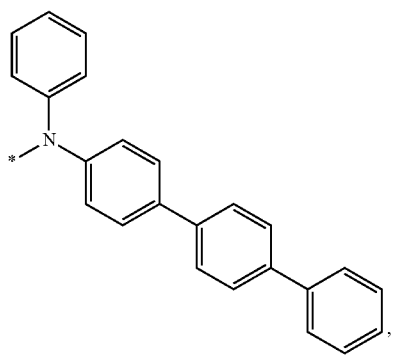
H2-122
H2-123
H2-124
H2-125
H2-126
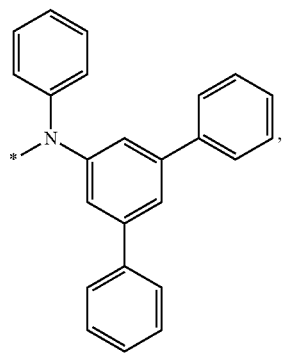
H2-127
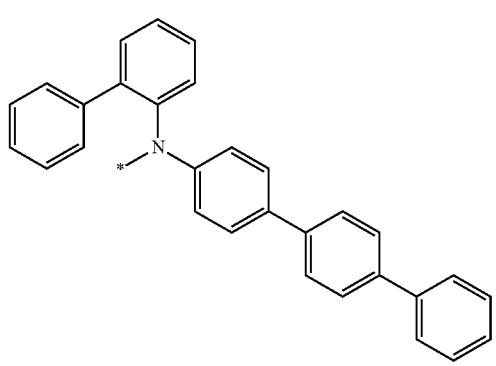
H2-128
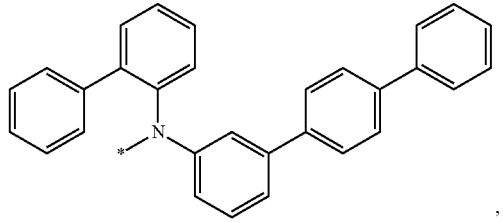
H2-129
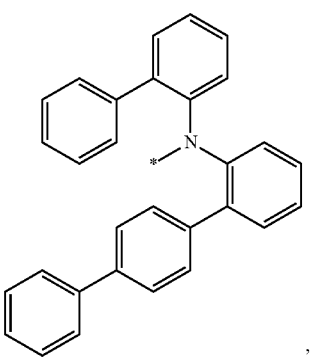

H2-130
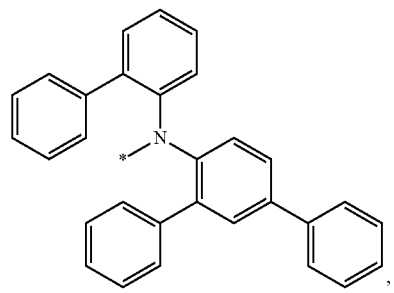
H2-131
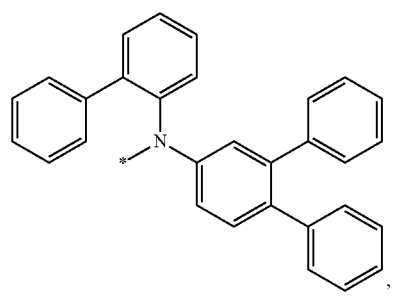
H2-132
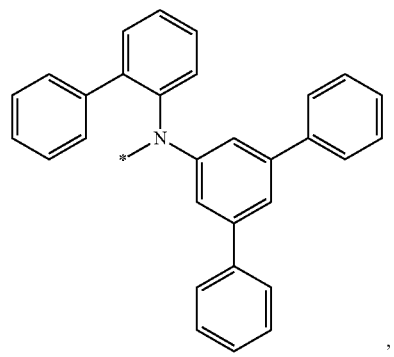
H2-133
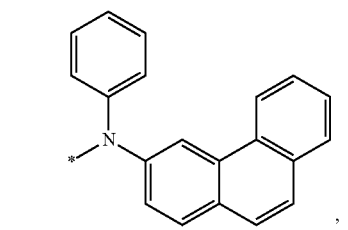
H2-134
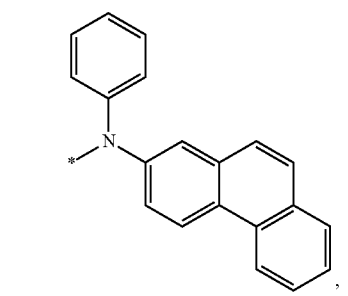
H2-135
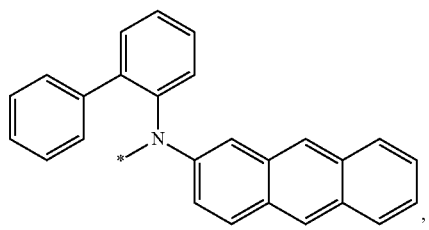
H2-136
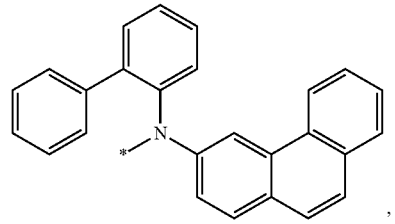
H2-137
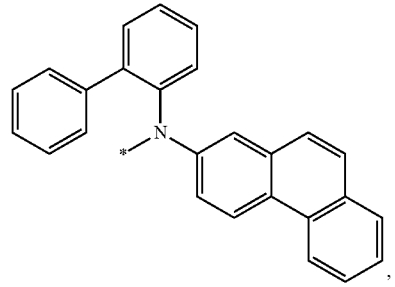
H2-138
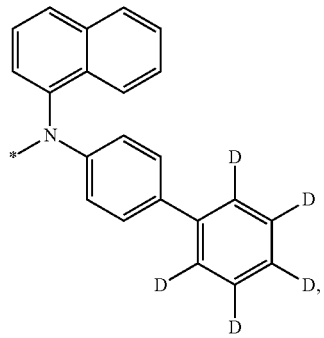
H2-139
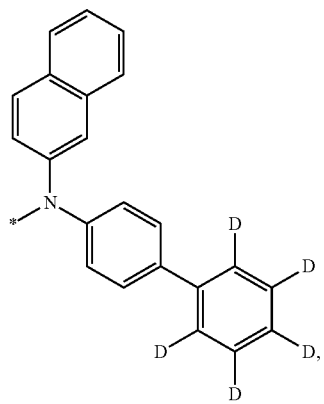

H2-140
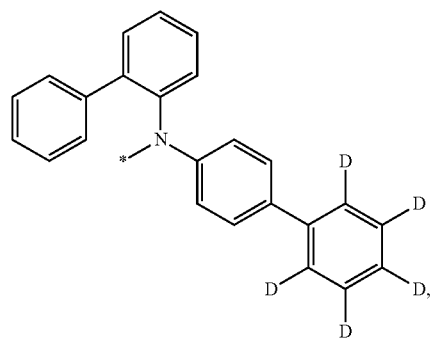
H2-144
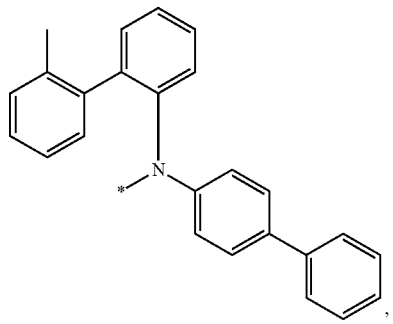
H2-141
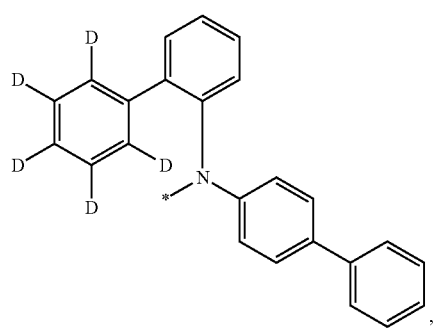
H2-145
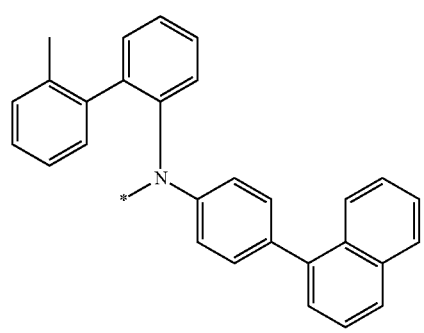
H2-142
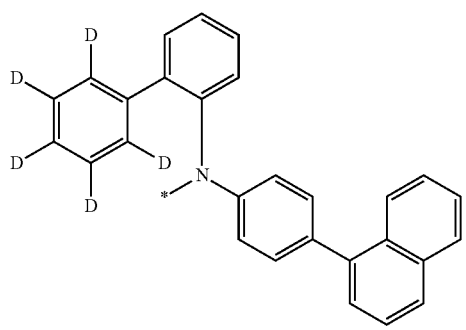
H2-146
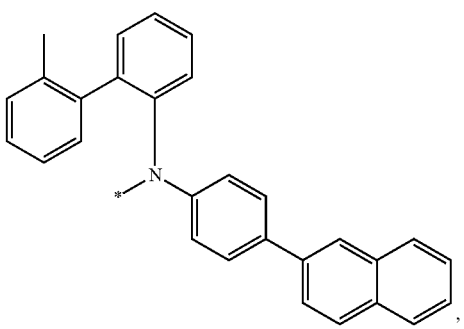
H2-143
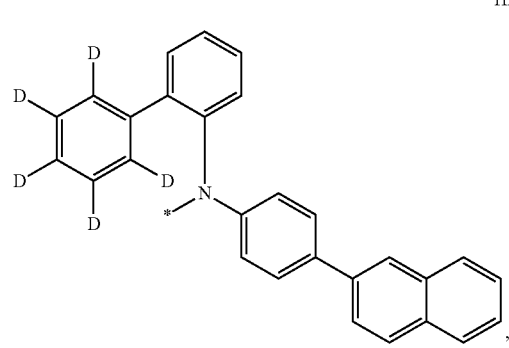
H2-147
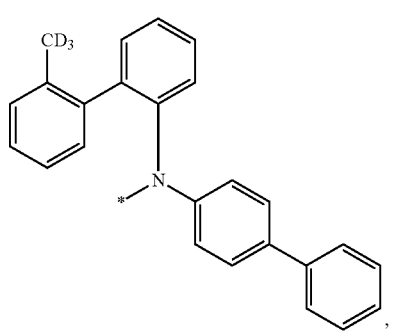

H2-148
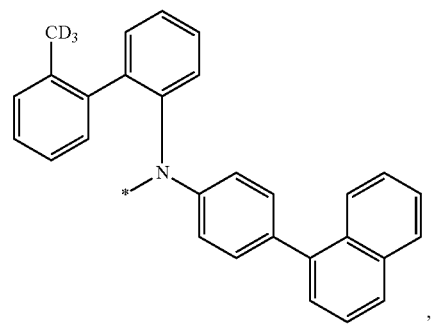
H2-149
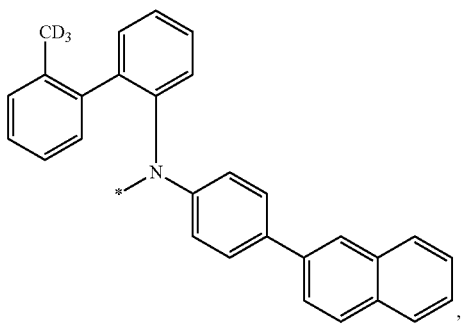
H2-150
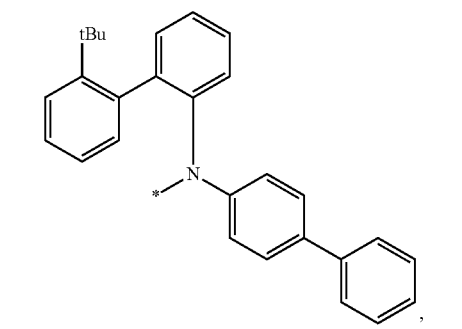
H2-151
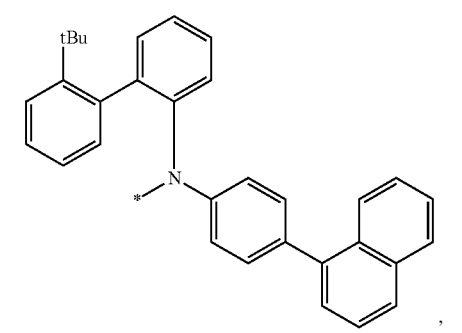
H2-152
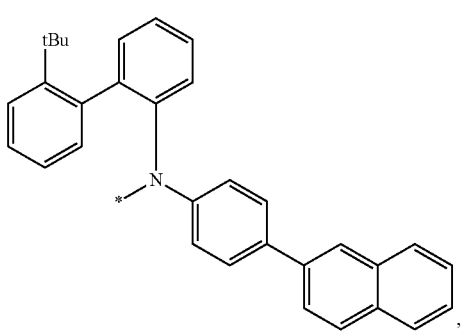
H2-153
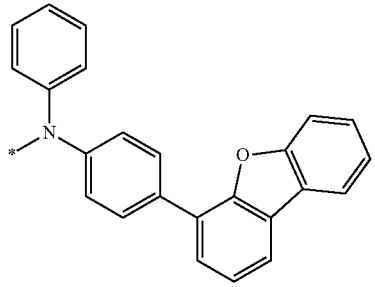
H2-154
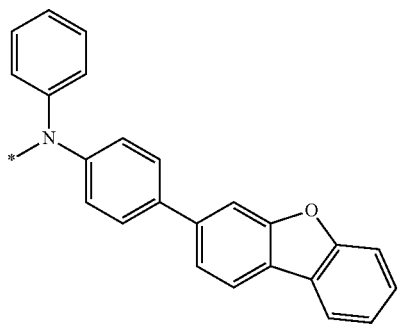
H2-155
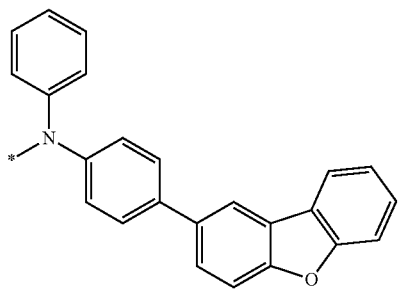
H2-156
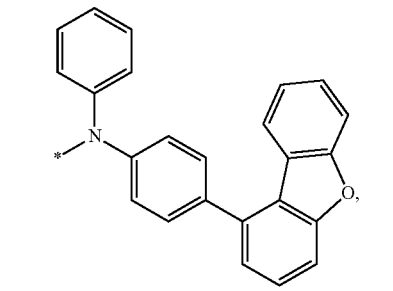
H2-157
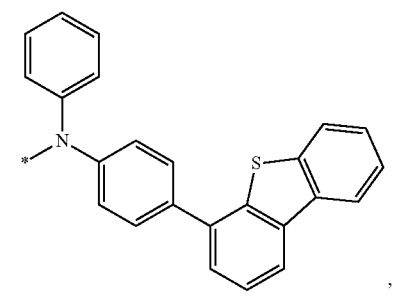

H2-158
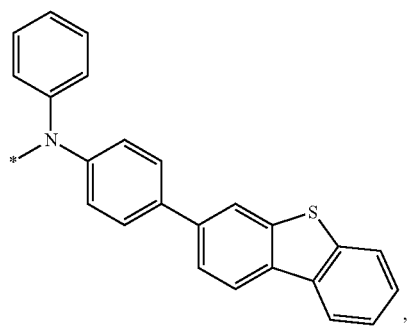
H2-159
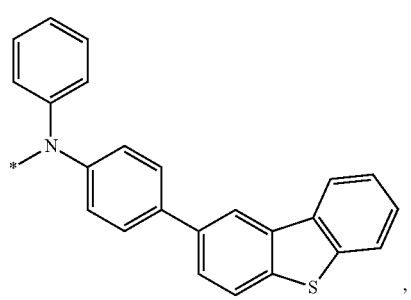
H2-160
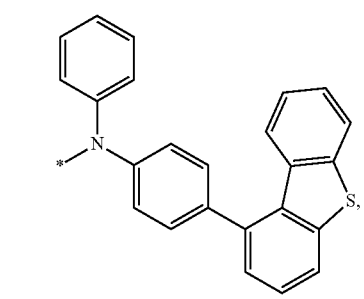
H2-161
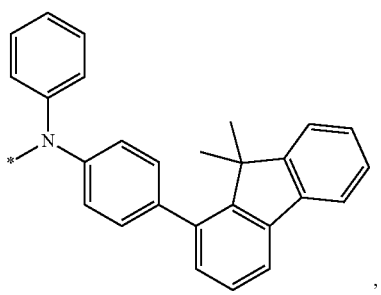
H2-162
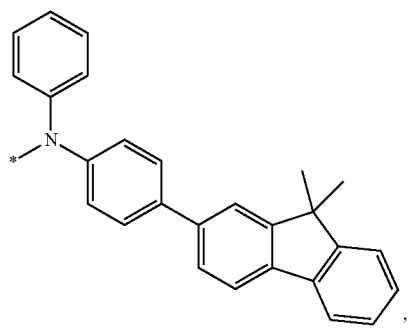
H2-163
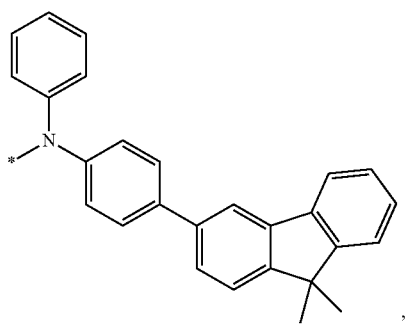
H2-164
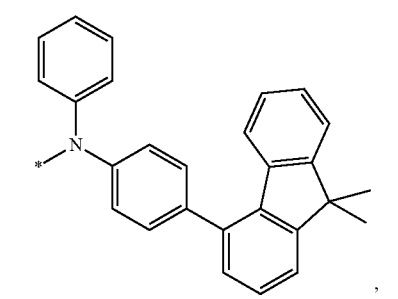
H2-165
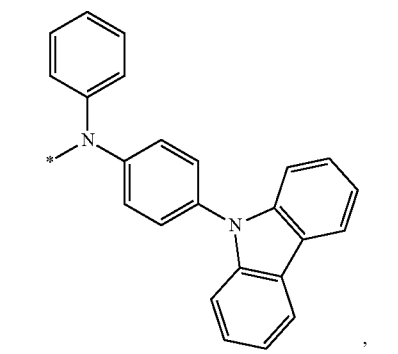
H2-166
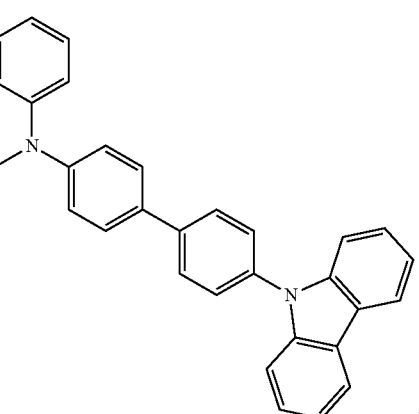

H2-167
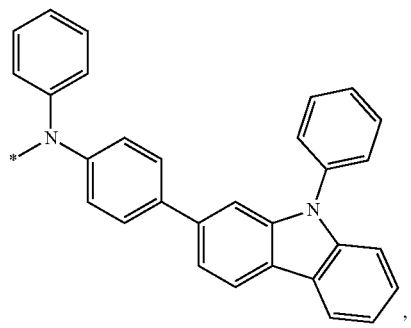
H2-168
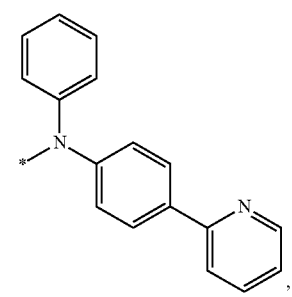
H2-169
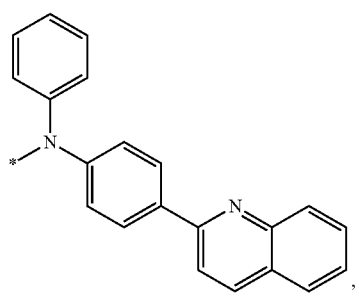
H2-170
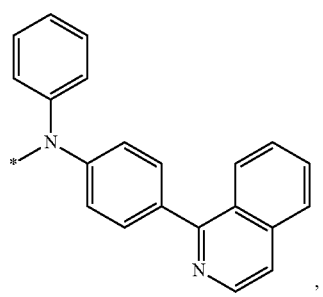
H2-171
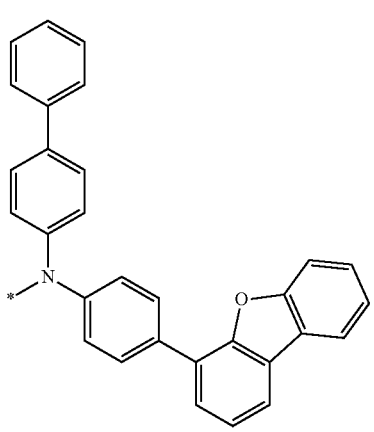
H2-172
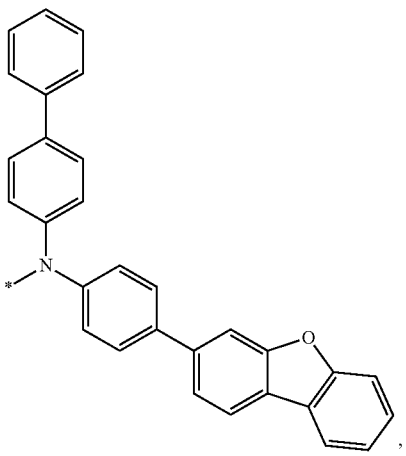
H2-173
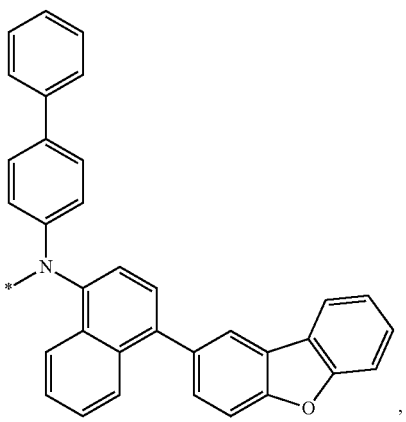
H2-174
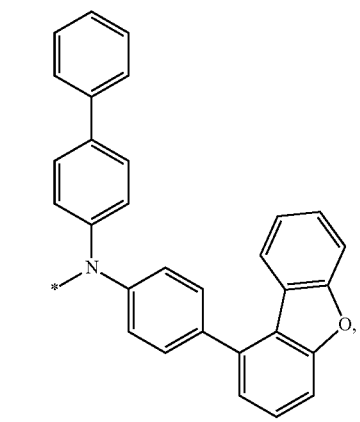

H2-175
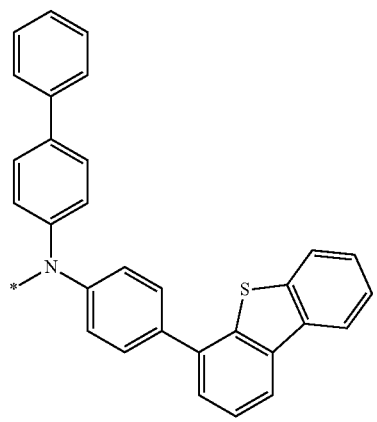
H2-176
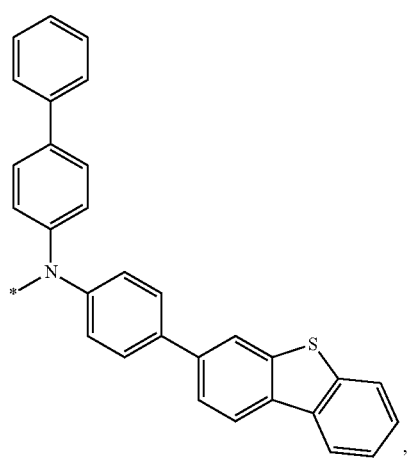
H2-177
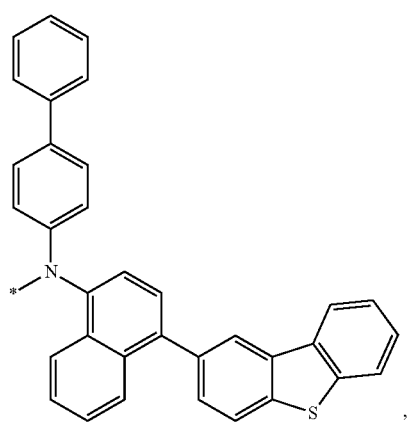
H2-178
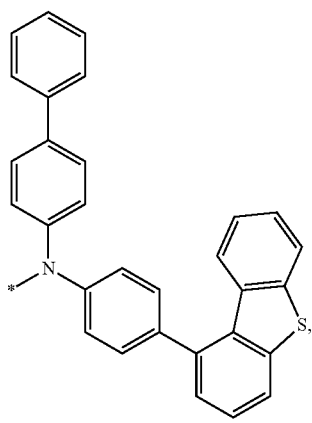
H2-179
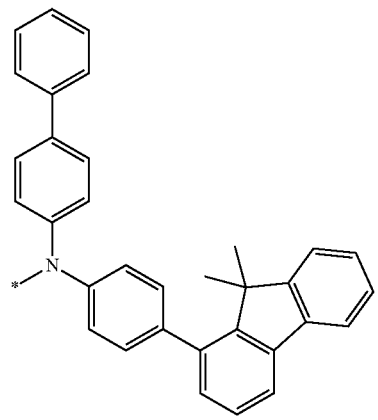
H2-180
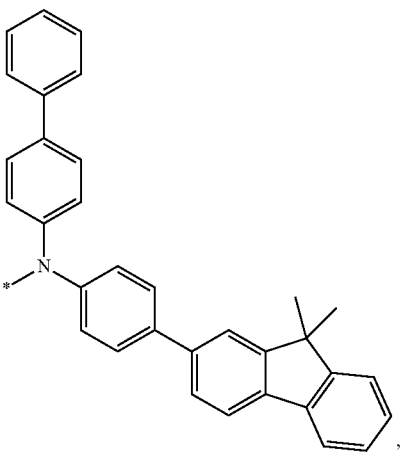

H2-181
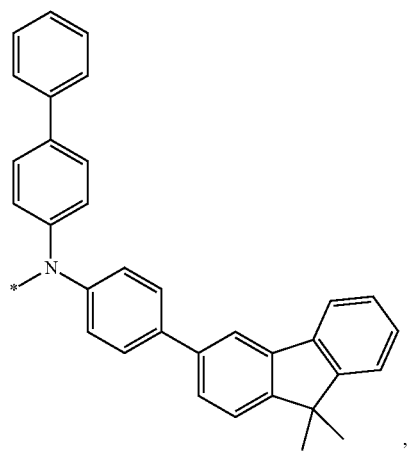
H2-182
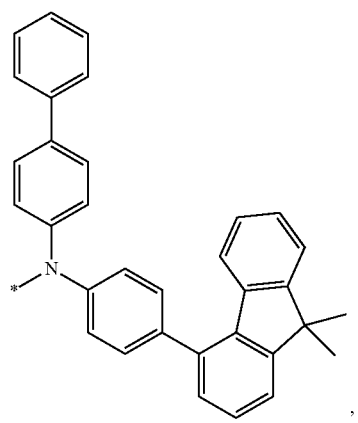
H2-183
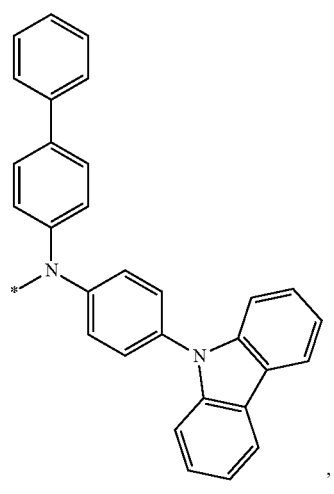
H2-184
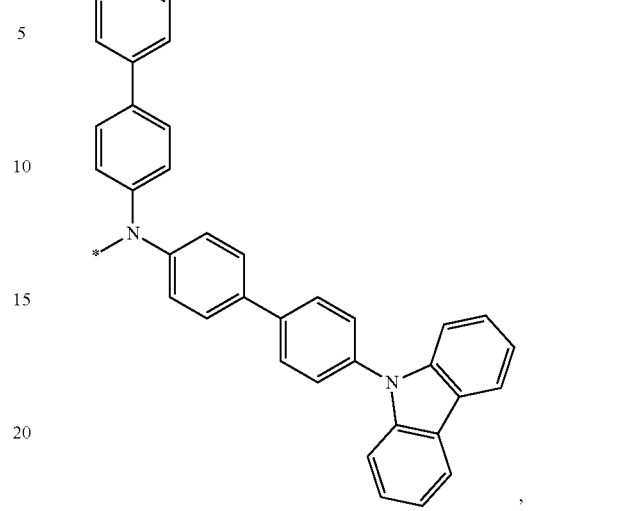
H2-185
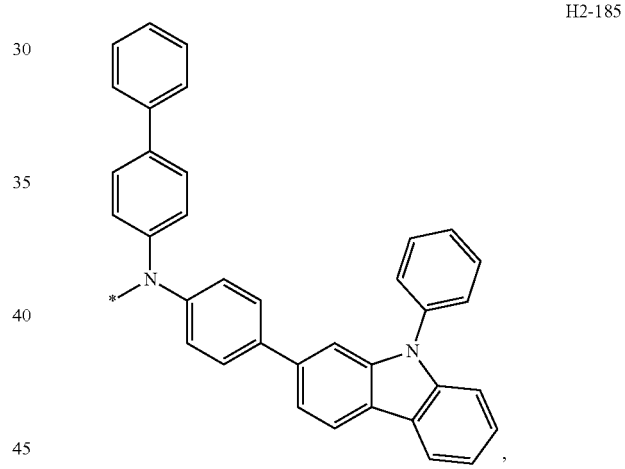
H2-186
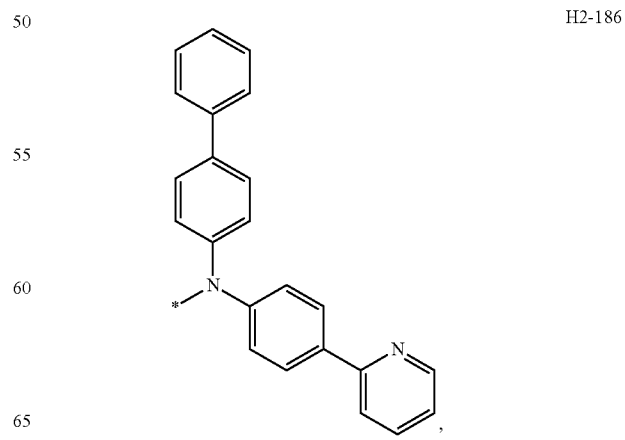

-continued
H2-187
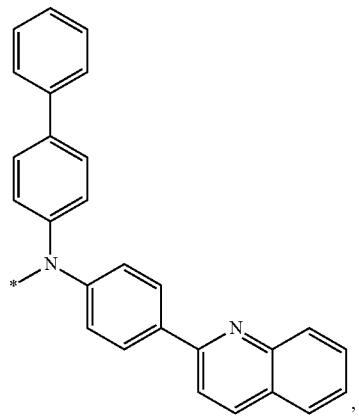
H2-188
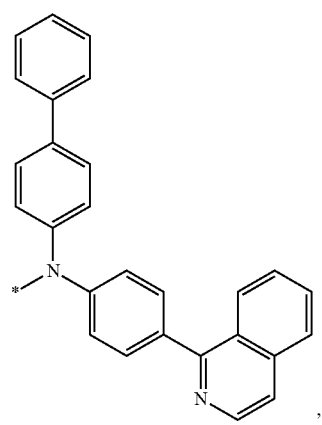
H2-189
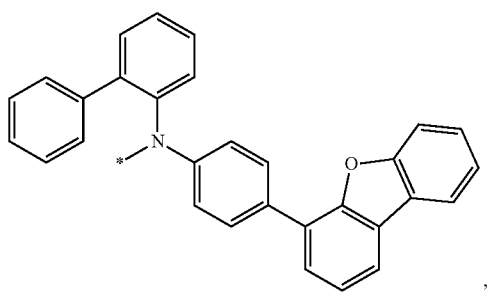
H2-190
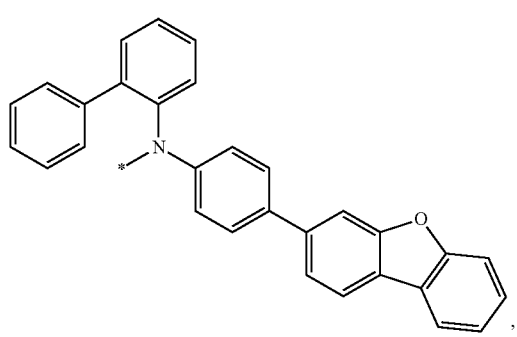
-continued
H2-191
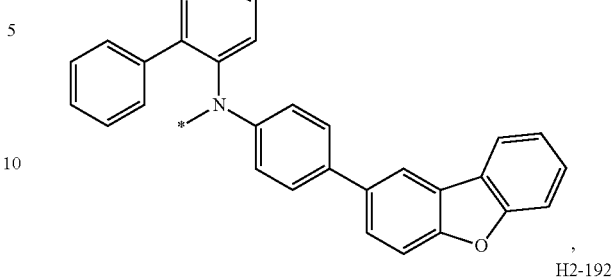
H2-192
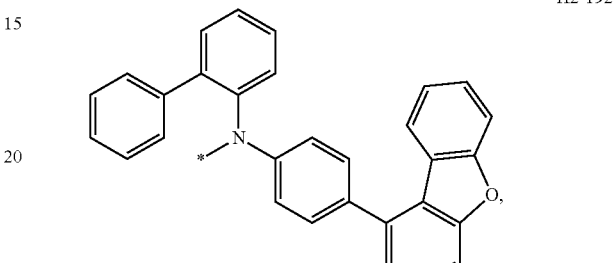
H2-193
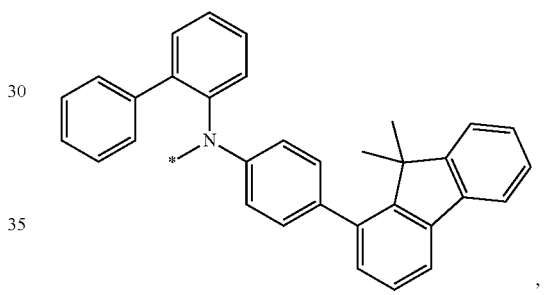
H2-194
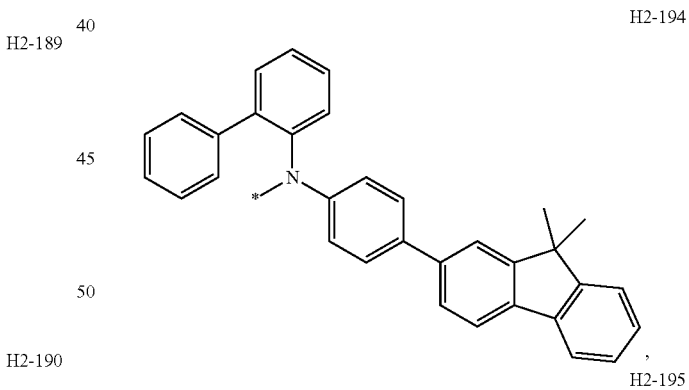
H2-195
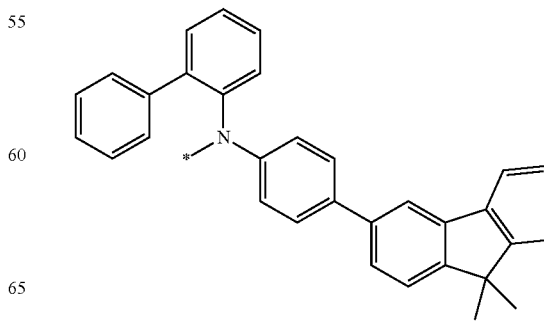

H2-196
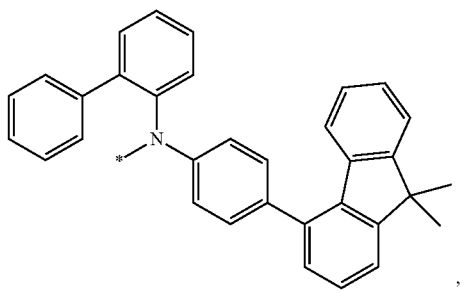
H2-197
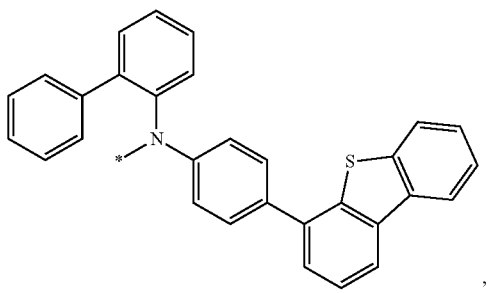
H2-198
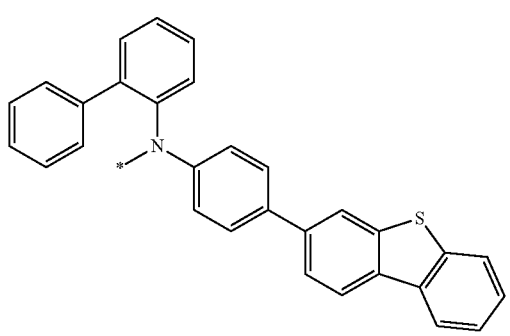
H2-199
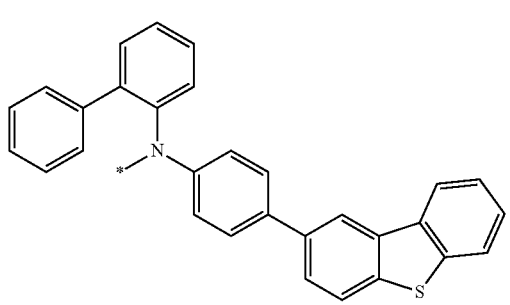
H2-200
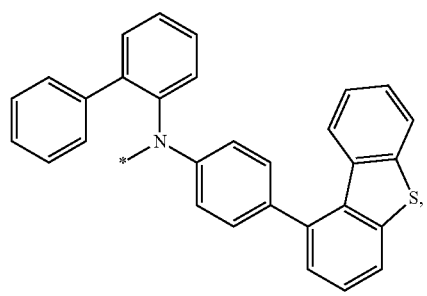
H2-201
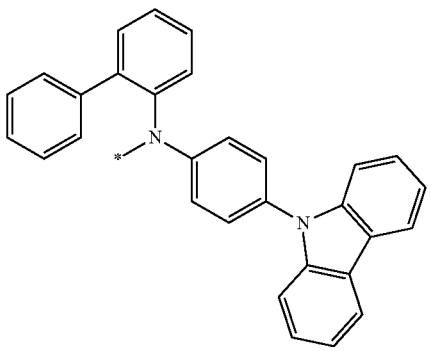
H2-202
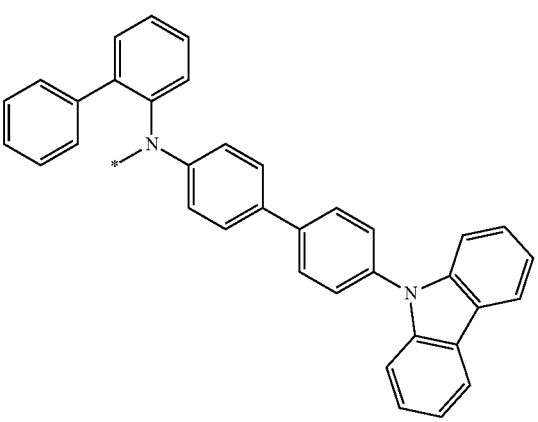
H2-203
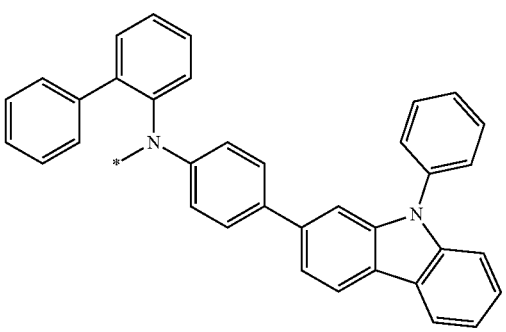
H2-204
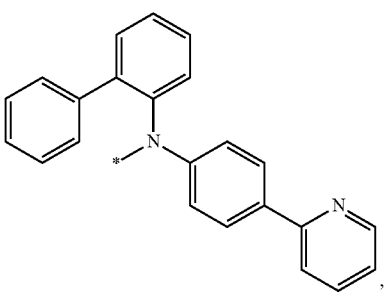

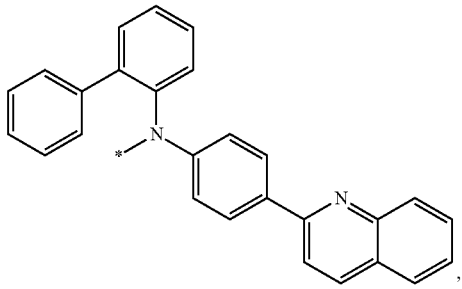
H2-205

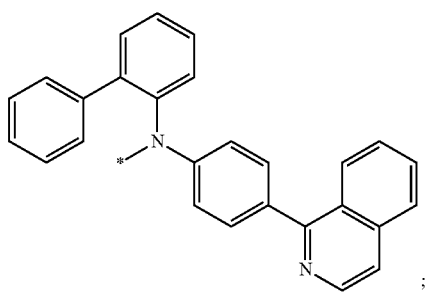
H2-206 wherein "*" represents the position where a structure of the H2-1 to H2-206 is joined to the L₂;

optionally, hydrogens in the structures of the H2-1 to H2-206 can be partially or fully substituted with deuterium.

12. The electroluminescent device of claim 1, wherein in Formula 2-2, the Ar₃ and Ar₄ are, at each occurrence identically or differently, selected from the group consisting of: substituted or unsubstituted aryl having 6 to 18 carbon atoms, substituted or unsubstituted heteroaryl having 3 to 18 carbon atoms and combinations thereof.

13. The electroluminescent device of claim 11, wherein the E₂ is, at each occurrence identically or differently, selected from any one of the group consisting of the following:

E2-1

E2-2

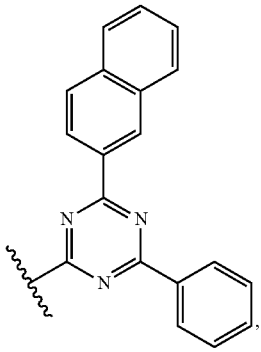
E2-3

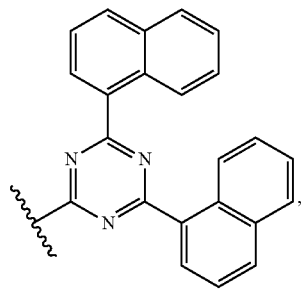
E2-4

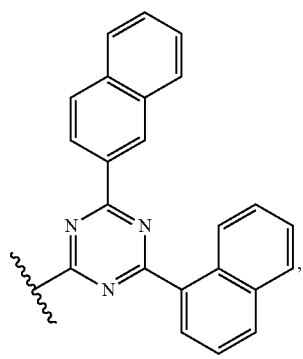
E2-5

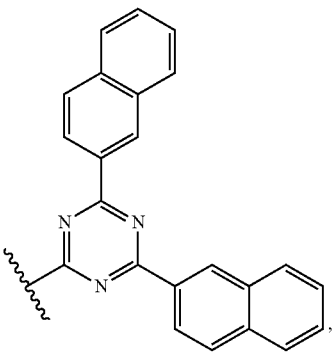
E2-6

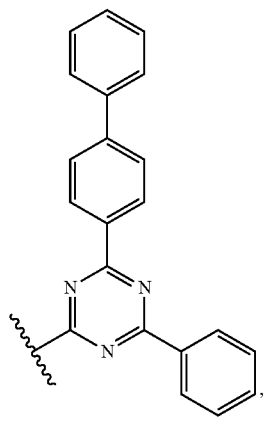
E2-7
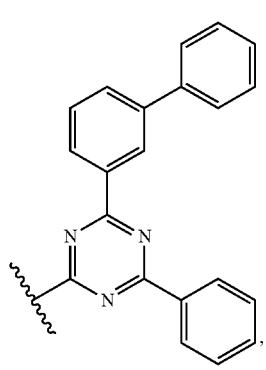
E2-8
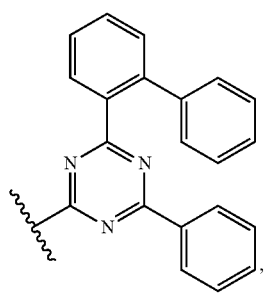
E2-9
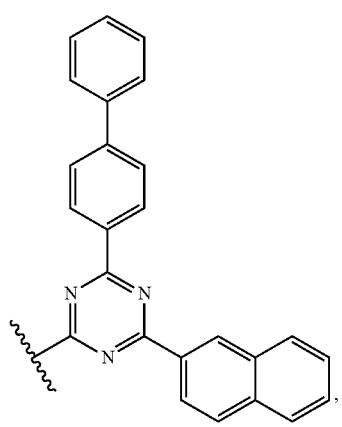
E2-10
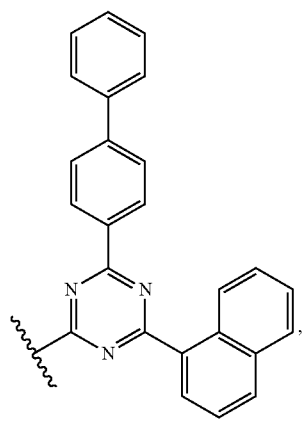
E2-11
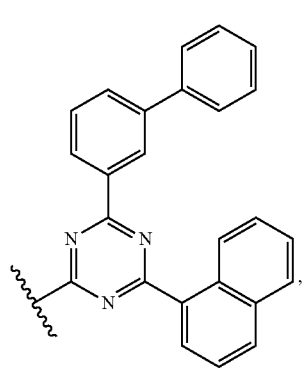
E2-12
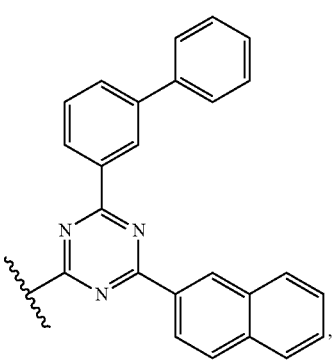
E2-13
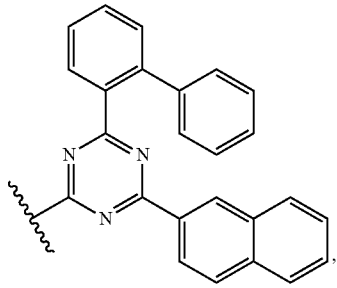
E2-14

E2-15
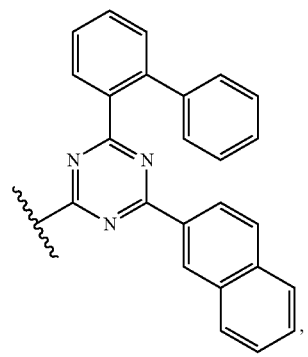
E2-16
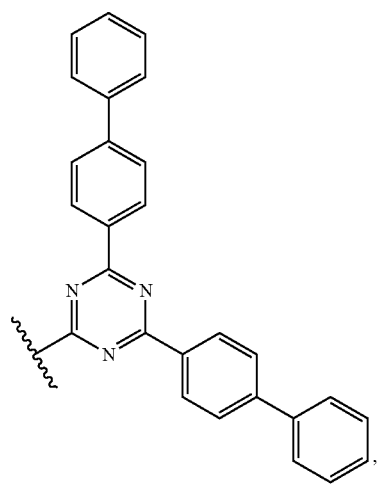
E2-17
E2-18
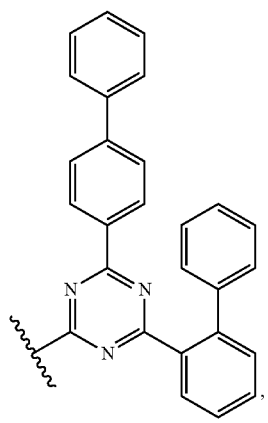
E2-19
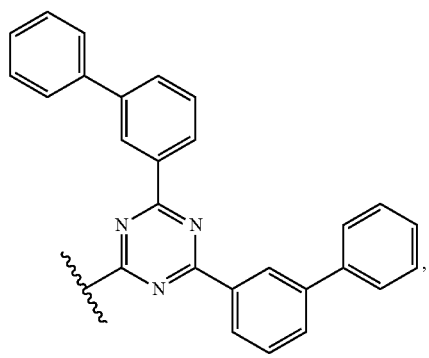
E2-20
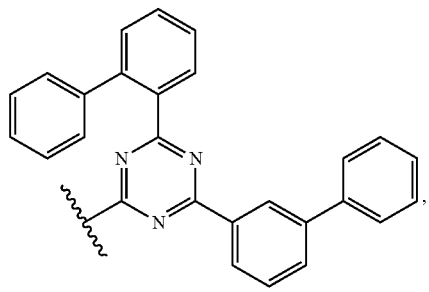
E2-21
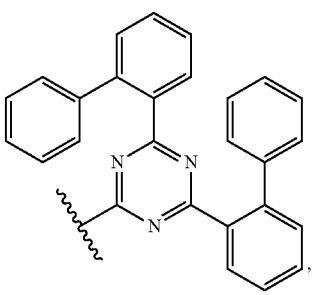

E2-22
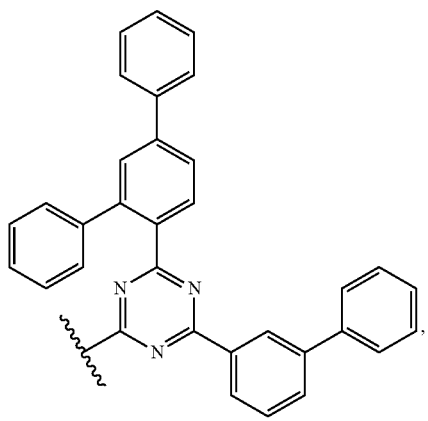
E2-23
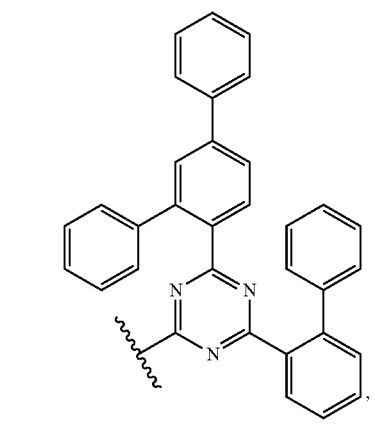
E2-24
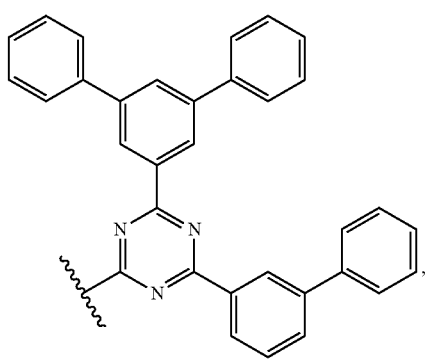
E2-25
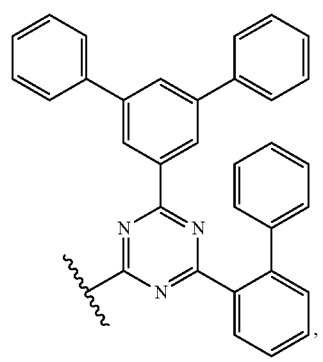
E2-26
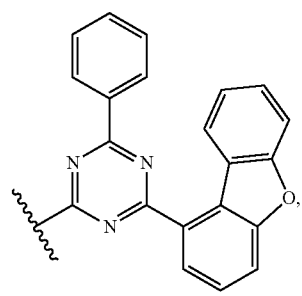
E2-27
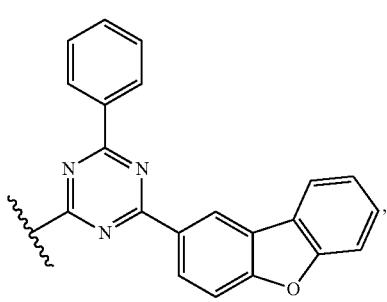
E2-28
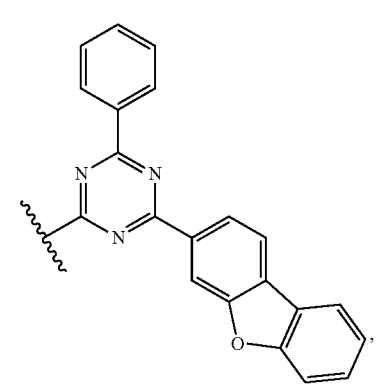
E2-29
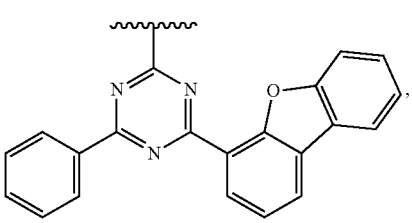
E2-30
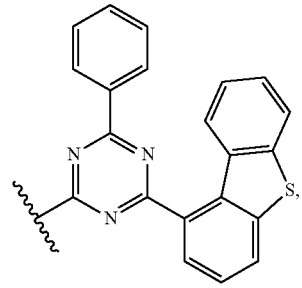

E2-31 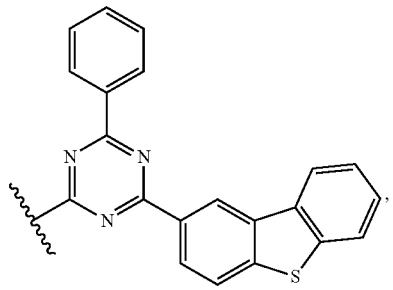
E2-32 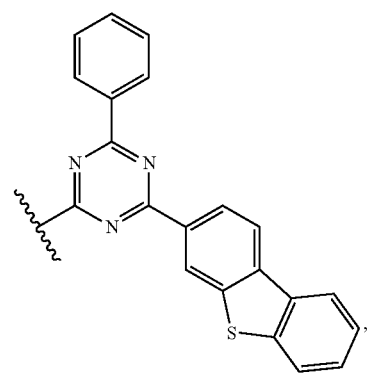
E2-33 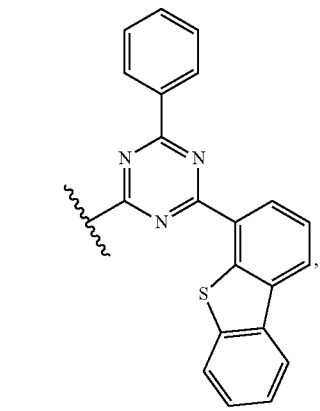
E2-34 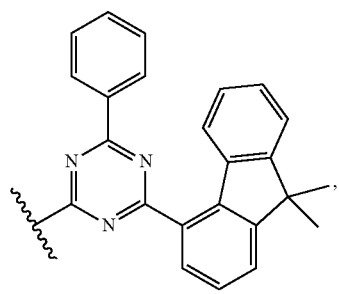
E2-35 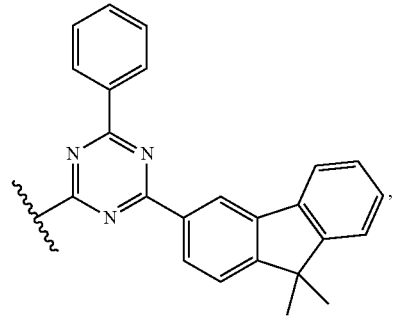
E2-36 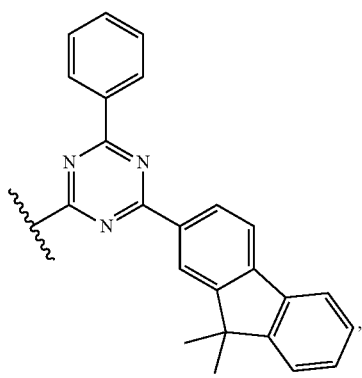
E2-37 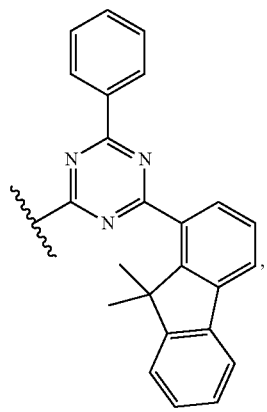
E2-38 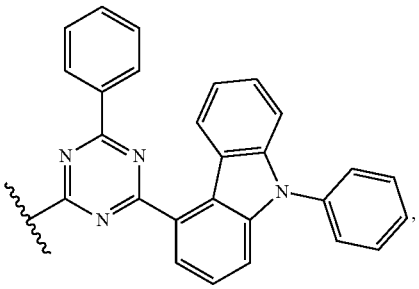

-continued
E2-39
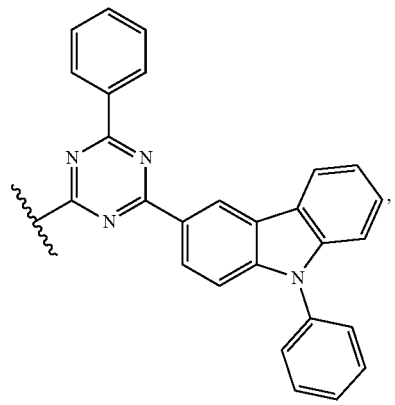
E2-40
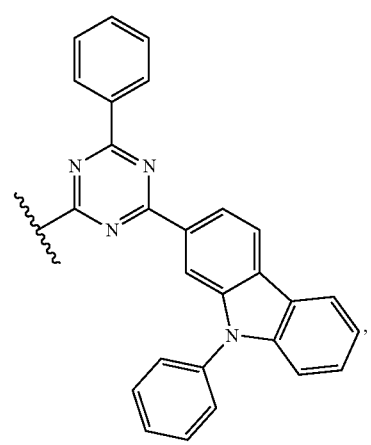
E2-41
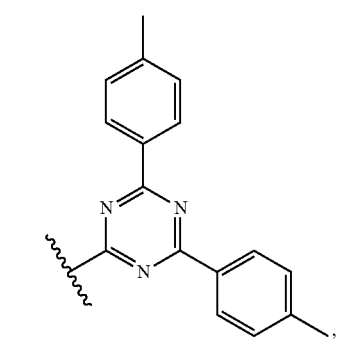
E2-42
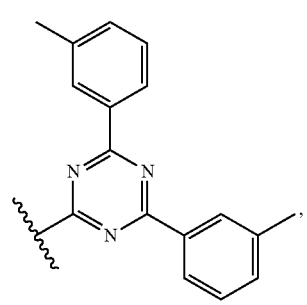
-continued
E2-43
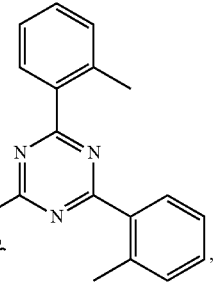
E2-44
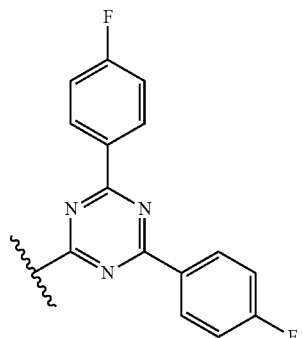
E2-45
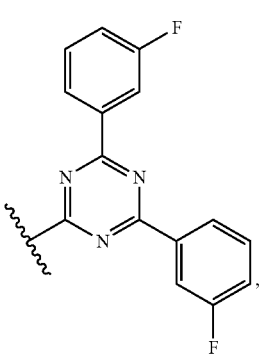
E2-46
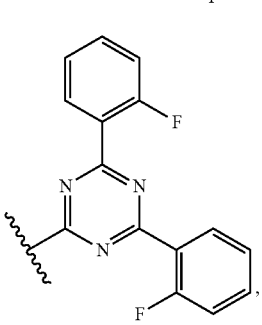
E2-47
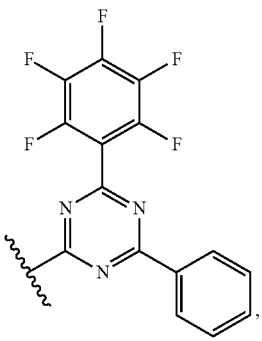

E2-48 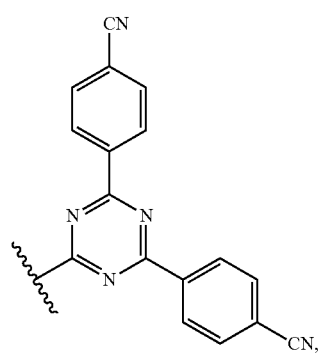
E2-49 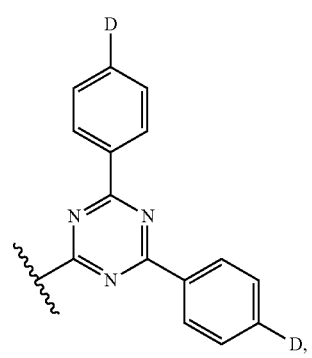
E2-50 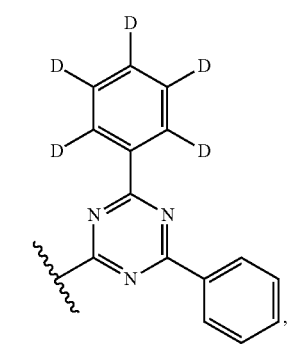
E2-51 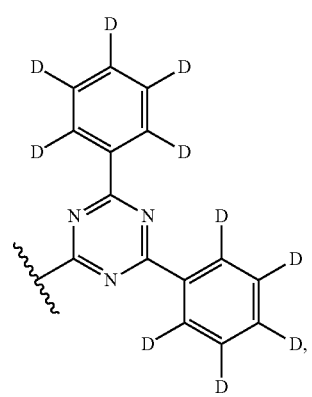
E2-52 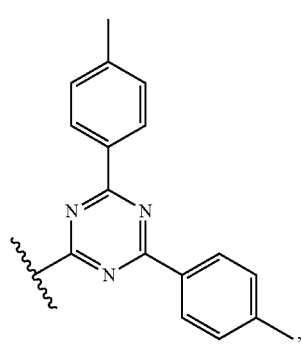
E2-53 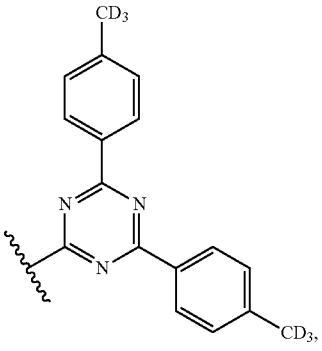
E2-54 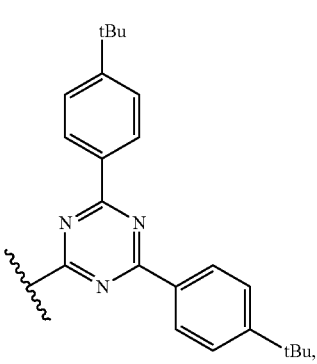
E2-55 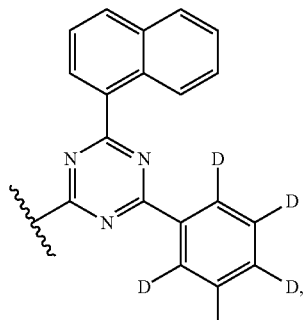

-continued

E2-56

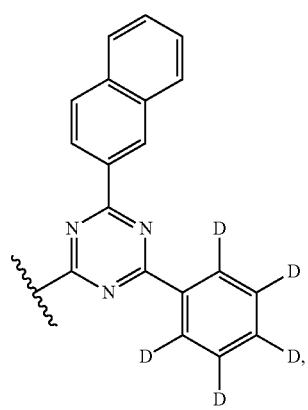

E2-57

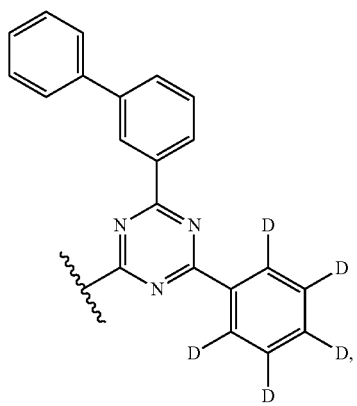

E2-58

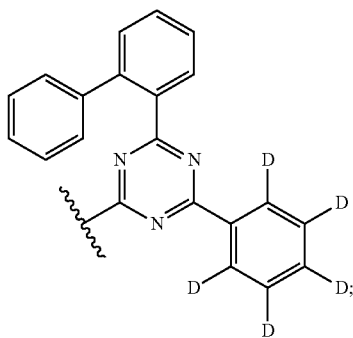

wherein

" ⌇ "

represents the position where a structure of the E2-1 to E2-58 is joined to the $L_2$;
optionally, hydrogens in the structures of the E2-1 to E2-58 can be partially or fully substituted with deuterium.

14. The electroluminescent device of claim 1, wherein $L_2$ is, at each occurrence identically or differently, selected from substituted or unsubstituted arylene having 6 to 18 carbon atoms, substituted or unsubstituted heteroarylene having 3 to 18 carbon atoms or a combination thereof.

15. The electroluminescent device of claim 1, wherein the organic layer is a light-emitting layer, and the first compound and the second compound are host materials.

16. The electroluminescent device of claim 15, wherein the light-emitting layer further comprises at least one phosphorescent material.

17. The electroluminescent device of claim 16, wherein the at least one phosphorescent material is a metal complex having a general formula of $M(L_a)_m(L_b)_n(L_c)_q$; wherein
the M is selected from a metal with a relative atomic mass greater than 40;
$L_a$, $L_b$ and $L_c$ are a first ligand, a second ligand and a third ligand coordinated to the M, respectively; $L_a$, $L_b$ and $L_c$ can be optionally joined to form a multidentate ligand;
$L_a$, $L_b$ and $L_c$ may be identical or different; m is 1, 2 or 3, n is 0, 1 or 2, q is 0 or 1, and m+n+q equals to the oxidation state of the M; wherein when m is greater than or equal to 2, the plurality of $L_a$ may be identical or different; when n is equal to 2, two $L_b$ may be identical or different;
$L_a$ has a structure represented by Formula 3:

Formula 3

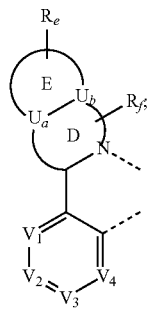

wherein
the ring D is selected from a five-membered heteroaromatic ring or a six-membered heteroaromatic ring;
the ring E is selected from a five-membered unsaturated carbocyclic ring, a benzene ring, a five-membered heteroaromatic ring or a six-membered heteroaromatic ring;
the ring D and the ring E are fused via $U_a$ and $U_b$;
$U_a$ and $U_b$ are, at each occurrence identically or differently, selected from C or N;
$R_f$ and $R_e$ represent, at each occurrence identically or differently, mono-substitution, multiple substitutions or non-substitution;
$V_1$ to $V_4$ are, at each occurrence identically or differently, selected from $CR_v$ or N;
$R_f$, $R_e$ and $R_v$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_f$, $R_e$, $R_v$ can be optionally joined to form a ring;

$L_b$ and $L_c$ are each independently selected from any one of the following structures:

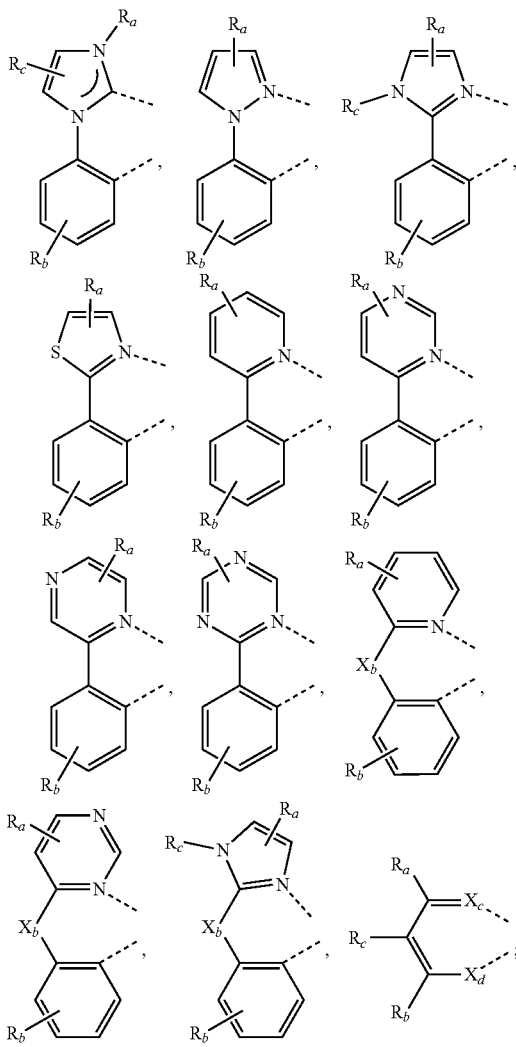

wherein
$R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in the structures of the ligands $L_b$ and $L_c$, adjacent substituents $R_a$, $R_b$, $R_c$, $R_{N1}$, $R_{N2}$, $R_{C1}$, $R_{C2}$ can be optionally joined to form a ring.

18. An electronic equipment, comprising the electroluminescent device of claim 1.

19. The electroluminescent device of claim 1, wherein in Formula 1-2-a and Formula 1-2-d, the $R_z$ is, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to carbon atoms, substituted or unsubstituted aryl having 6 to 30 carbon atoms, substituted or unsubstituted heteroaryl having 3 to 30 carbon atoms and combinations thereof.

20. The electroluminescent device of claim 5, wherein the $E_1$ has a structure represented by any one of the group consisting of Formula 1-4-a to 1-4-f:

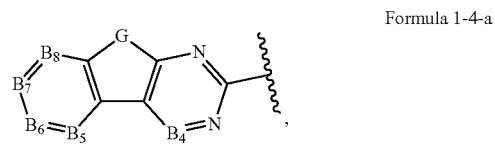

Formula 1-4-a

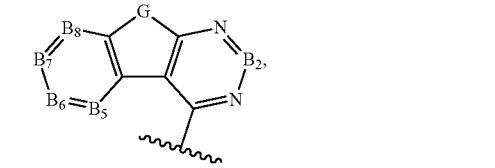

Formula 1-4-b

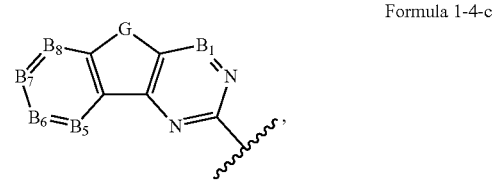

Formula 1-4-c

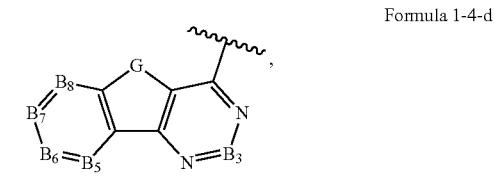

Formula 1-4-d

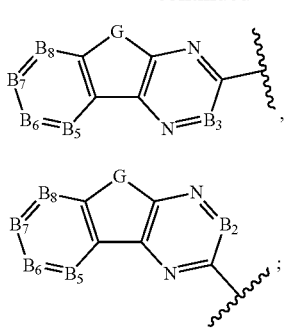

Formula 1-4-e

Formula 1-4-f wherein in Formula 1-4-a to Formula 1-4-f, $B_1$ to $B_8$ are, at each occurrence identically or differently, selected from $CR_z$; and wherein G is selected from $CR_gR_g$, $SiR_gR_g$, $NR_g$, $BR_g$, $PR_g$, O, S or Se; when two $R_g$ are present at the same time, the two $R_g$ may be identical or different;

wherein $R_z$ and $R_g$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

" $\xi$ "

represents the position where a structure represented by Formula 1-4-a to Formula 1-4-f is joined to the $L_1$.

21. The electroluminescent device of claim 20, wherein in Formula 1-4-a to Formula 1-4-f, G is selected from $CR_gR_g$, O, S or Se; when two $R_g$ are present at the same time, the two $R_g$ may be identical or different;

$B_1$ to $B_8$ are, at each occurrence identically or differently, selected from $CR_z$; wherein $R_z$ and $R_g$ are, at each occurrence identically or differently, selected from the group consisting of: hydrogen, deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof.

22. The electroluminescent device of claim 6, wherein the $R_z$ and $R_w$ are, at each occurrence identically or differently, selected from the group consisting of: hydrogen, deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylene, carbazolyl, 9-phenylcarbazolyl, 9,9-dimethylfluorenyl, pyridyl, phenylpyridyl and combinations thereof; and at least one $R_z$ in $B_1$ to $B_4$ is, at each occurrence identically or differently, selected from the group consisting of: deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylene, carbazolyl, 9-phenylcarbazolyl, 9,9-dimethylfluorenyl, pyridyl, phenylpyridyl and combinations thereof.

23. The electroluminescent device of claim 8, wherein the first compound is selected from the group consisting of Compound I-31 to Compound I-34, Compound I-63 to Compound I-66, Compound I-108, Compound 1-135 to Compound I-140, wherein the Compound I-31 to Compound I-34, Compound I-63 to Compound I-66, Compound I-108, Compound I-135 to Compound I-140 have the structure of H1-$L_1$-E1, and $H_1$, $L_1$ and E1 are respectively selected from structures in the following table:

| Compound | $H_1$ | $L_1$ | $E_1$ | Compound | $H_1$ | $L_1$ | $E_1$ |
|---|---|---|---|---|---|---|---|
| I-1 | H1-1 | L1-0 | E1-1 | I-2 | H1-1 | L1-0 | E1-2 |
| I-3 | H1-1 | L1-0 | E1-3 | I-4 | H1-1 | L1-0 | E1-4 |
| I-5 | H1-1 | L1-0 | E1-5 | I-6 | H1-1 | L1-0 | E1-6 |
| I-7 | H1-1 | L1-0 | E1-7 | I-8 | H1-1 | L1-0 | E1-8 |
| I-9 | H1-1 | L1-0 | E1-9 | I-10 | H1-1 | L1-0 | E1-10 |
| I-11 | H1-1 | L1-0 | E1-11 | I-12 | H1-1 | L1-0 | E1-12 |
| I-13 | H1-1 | L1-0 | E1-13 | I-14 | H1-1 | L1-0 | E1-14 |
| I-15 | H1-1 | L1-0 | E1-15 | I-16 | H1-1 | L1-0 | E1-16 |
| I-17 | H1-1 | L1-0 | E1-17 | I-18 | H1-1 | L1-0 | E1-18 |
| I-19 | H1-1 | L1-0 | E1-19 | I-20 | H1-1 | L1-0 | E1-20 |
| I-21 | H1-1 | L1-0 | E1-21 | I-22 | H1-1 | L1-0 | E1-22 |
| I-23 | H1-1 | L1-0 | E1-23 | I-24 | H1-1 | L1-0 | E1-24 |
| I-25 | H1-1 | L1-0 | E1-25 | I-26 | H1-1 | L1-0 | E1-26 |
| I-31 | H1-1 | L1-0 | E1-31 | I-32 | H1-1 | L1-0 | E1-32 |
| I-33 | H1-1 | L1-0 | E1-33 | I-34 | H1-1 | L1-0 | E1-34 |
| I-35 | H1-1 | L1-0 | E1-35 | I-36 | H1-1 | L1-0 | E1-36 |
| I-37 | H1-1 | L1-0 | E1-37 | I-38 | H1-1 | L1-0 | E1-38 |
| I-39 | H1-1 | L1-0 | E1-39 | I-40 | H1-1 | L1-0 | E1-40 |
| I-41 | H1-1 | L1-0 | E1-41 | I-42 | H1-1 | L1-0 | E1-42 |
| I-43 | H1-1 | L1-0 | E1-43 | I-44 | H1-1 | L1-0 | E1-44 |
| I-45 | H1-1 | L1-0 | E1-45 | I-46 | H1-1 | L1-0 | E1-46 |
| I-47 | H1-1 | L1-0 | E1-47 | I-48 | H1-1 | L1-0 | E1-48 |
| I-49 | H1-1 | L1-0 | E1-49 | I-50 | H1-1 | L1-0 | E1-50 |
| I-51 | H1-1 | L1-0 | E1-51 | | | | |
| I-53 | H1-1 | L1-0 | E1-53 | I-54 | H1-1 | L1-0 | E1-54 |
| I-55 | H1-1 | L1-0 | E1-55 | I-56 | H1-1 | L1-0 | E1-56 |
| | | | | I-60 | H1-1 | L1-0 | E1-60 |
| I-61 | H1-1 | L1-0 | E1-61 | I-62 | H1-1 | L1-0 | E1-62 |
| I-63 | H1-1 | L1-0 | E1-63 | I-64 | H1-1 | L1-0 | E1-64 |
| I-65 | H1-1 | L1-0 | E1-65 | I-66 | H1-1 | L1-0 | E1-66 |
| I-67 | H1-1 | L1-0 | E1-67 | I-68 | H1-1 | L1-0 | E1-68 |
| I-69 | H1-1 | L1-0 | E1-69 | I-70 | H1-1 | L1-0 | E1-70 |
| I-71 | H1-1 | L1-0 | E1-71 | I-72 | H1-1 | L1-0 | E1-72 |
| I-73 | H1-1 | L1-0 | E1-73 | I-74 | H1-1 | L1-0 | E1-74 |
| I-79 | H1-1 | L1-0 | E1-79 | I-80 | H1-1 | L1-0 | E1-80 |
| I-81 | H1-1 | L1-0 | E1-81 | I-82 | H1-1 | L1-0 | E1-82 |
| I-83 | H1-1 | L1-0 | E1-83 | I-84 | H1-1 | L1-0 | E1-84 |
| I-85 | H1-1 | L1-0 | E1-85 | I-86 | H1-1 | L1-0 | E1-86 |
| I-87 | H1-1 | L1-0 | E1-87 | I-88 | H1-1 | L1-0 | E1-88 |
| I-89 | H1-1 | L1-0 | E1-89 | I-90 | H1-1 | L1-0 | E1-90 |
| | | | | I-108 | H1-1 | L1-0 | E1-108 |
| I-109 | H1-1 | L1-0 | E1-109 | | | | |
| I-111 | H1-1 | L1-0 | E1-111 | I-112 | H1-1 | L1-0 | E1-112 |
| I-115 | H1-1 | L1-0 | E1-115 | I-116 | H1-1 | L1-0 | E1-116 |
| I-117 | H1-1 | L1-0 | E1-117 | I-118 | H1-1 | L1-0 | E1-118 |
| I-119 | H1-1 | L1-0 | E1-119 | I-120 | H1-1 | L1-0 | E1-120 |
| I-121 | H1-1 | L1-0 | E1-121 | I-122 | H1-1 | L1-0 | E1-122 |
| I-123 | H1-1 | L1-0 | E1-123 | I-124 | H1-1 | L1-0 | E1-124 |

-continued

| Compound | H₁ | L₁ | E₁ | Compound | H₁ | L₁ | E₁ |
|---|---|---|---|---|---|---|---|
| I-125 | H1-1 | L1-0 | E1-125 | I-126 | H1-1 | L1-0 | E1-126 |
| I-127 | H1-1 | L1-0 | E1-127 | I-128 | H1-1 | L1-0 | E1-128 |
| I-129 | H1-1 | L1-0 | E1-129 | I-130 | H1-1 | L1-0 | E1-130 |
| I-131 | H1-1 | L1-0 | E1-131 | I-132 | H1-1 | L1-0 | E1-132 |
| I-135 | H1-1 | L1-0 | E1-135 | I-136 | H1-1 | L1-0 | E1-136 |
| I-137 | H1-1 | L1-0 | E1-137 | I-138 | H1-1 | L1-0 | E1-138 |
| I-139 | H1-1 | L1-0 | E1-139 | I-140 | H1-1 | L1-0 | E1-140 |
|  |  |  |  | I-484 | H1-65 | L1-0 | E-1 |
| I-485 | H1-66 | L1-0 | E-1 | I-486 | H1-67 | L1-0 | E-1 |
| I-487 | H1-68 | L1-0 | E-1 |  |  |  |  |
| I-521 | H1-102 | L1-0 | E-1 | I-522 | H1-103 | L1-0 | E-1 |
| I-523 | H1-104 | L1-0 | E-1 | I-524 | H1-105 | L1-0 | E-1 |
| I-525 | H1-106 | L1-0 | E-1 | I-526 | H1-107 | L1-0 | E-1 |
| I-527 | H1-108 | L1-0 | E-1 | I-528 | H1-109 | L1-0 | E-1 |
| I-529 | H1-110 | L1-0 | E-1 | I-530 | H1-111 | L1-0 | E-1 |
| I-531 | H1-112 | L1-0 | E-1 | I-532 | H1-113 | L1-0 | E-1 |
| I-533 | H1-114 | L1-0 | E-1 | I-534 | H1-115 | L1-0 | E-1 |
| I-535 | H1-116 | L1-0 | E-1 | I-536 | H1-117 | L1-0 | E-1 |
| I-537 | H1-118 | L1-0 | E-1 | I-538 | H1-119 | L1-0 | E-1 |
| I-539 | H1-120 | L1-0 | E-1 | I-540 | H1-121 | L1-0 | E-1 |
| I-541 | H1-122 | L1-0 | E-1 | I-542 | H1-123 | L1-0 | E-1 |
| I-543 | H1-124 | L1-0 | E-1 | I-544 | H1-125 | L1-0 | E-1 |
| I-545 | H1-126 | L1-0 | E-1 | I-546 | H1-127 | L1-0 | E-1 |
| I-547 | H1-128 | L1-0 | E-1 | I-548 | H1-129 | L1-0 | E-1 |
| I-549 | H1-130 | L1-0 | E-1 | I-550 | H1-131 | L1-0 | E-1 |
| I-551 | H1-132 | L1-0 | E-1 | I-552 | H1-133 | L1-0 | E-1 |
| I-553 | H1-134 | L1-0 | E-1 |  |  | L1-0 |  |
| I-557 | H1-138 | L1-0 | E-1 | I-558 | H1-139 | L1-0 | E-1 |
| I-559 | H1-140 | L1-0 | E-1 | I-560 | H1-141 | L1-0 | E-1 |
|  |  |  |  | I-624 | H1-65 | L1-0 | E-23 |
| I-625 | H1-66 | L1-0 | E1-23 | I-626 | H1-67 | L1-0 | E-23 |
| I-627 | H1-68 | L1-0 | E1-23 |  |  |  |  |
| I-661 | H1-102 | L1-0 | E1-23 | I-662 | H1-103 | L1-0 | E-23 |
| I-663 | H1-104 | L1-0 | E1-23 | I-664 | H1-105 | L1-0 | E-23 |
| I-665 | H1-106 | L1-0 | E1-23 | I-666 | H1-107 | L1-0 | E-23 |
| I-667 | H1-108 | L1-0 | E1-23 | I-668 | H1-109 | L1-0 | E-23 |
| I-669 | H1-110 | L1-0 | E1-23 | I-670 | H1-111 | L1-0 | E-23 |
| I-671 | H1-112 | L1-0 | E1-23 | I-672 | H1-113 | L1-0 | E-23 |
| I-673 | H1-114 | L1-0 | E1-23 | I-674 | H1-115 | L1-0 | E-23 |
| I-675 | H1-116 | L1-0 | E1-23 | I-676 | H1-117 | L1-0 | E-23 |
| I-677 | H1-118 | L1-0 | E1-23 | I-678 | H1-119 | L1-0 | E-23 |
| I-679 | H1-120 | L1-0 | E1-23 | I-680 | H1-121 | L1-0 | E-23 |
| I-681 | H1-122 | L1-0 | E1-23 | I-682 | H1-123 | L1-0 | E-23 |
| I-683 | H1-124 | L1-0 | E1-23 | I-684 | H1-125 | L1-0 | E-23 |
| I-685 | H1-126 | L1-0 | E1-23 | I-686 | H1-127 | L1-0 | E-23 |
| I-687 | H1-128 | L1-0 | E1-23 | I-688 | H1-129 | L1-0 | E-23 |
| I-689 | H1-130 | L1-0 | E1-23 | I-690 | H1-131 | L1-0 | E-23 |
| I-691 | H1-132 | L1-0 | E1-23 | I-692 | H1-133 | L1-0 | E-23 |
| I-693 | H1-134 | L1-0 | E1-23 |  |  |  |  |
| I-697 | H1-138 | L1-0 | E1-23 | I-698 | H1-139 | L1-0 | E-23 |
| I-699 | H1-140 | L1-0 | E1-23 | I-700 | H1-141 | L1-0 | E-23 | optionally, hydrogens in Compound I-31 to Compound I-34, Compound I-63 to Compound I-66, Compound I-108, Compound I-135 to Compound I-140 can be partially or fully substituted with deuterium.

24. The electroluminescent device of claim 9, wherein $Ar_1$ and $Ar_2$ are, at each occurrence identically or differently, selected from the group consisting of: phenyl, deuterated phenyl, methylphenyl, fluorophenyl, t-butylphenyl, trideuteromethylphenyl, biphenyl, naphthyl, deuterated naphthyl, phenanthryl, anthracenyl, dibenzofuryl, dibenzothienyl, 9,9-dimethylfluorenyl, carbazolyl, pyridyl, pyrimidinyl, 4-cyanophenyl, 3-cyanophenyl, triphenylene, quinolinyl, isoquinolinyl and combinations thereof.

25. The electroluminescent device of claim 10, wherein $L_m$ and $L_n$ are, at each occurrence identically or differently, selected from the group consisting of: a single bond, substituted or unsubstituted phenylene, substituted or unsubstituted naphthylene, substituted or unsubstituted biphenylene, substituted or unsubstituted pyridylene, substituted or unsubstituted thienylene, substituted or unsubstituted dibenzofurylene, substituted or unsubstituted dibenzothienylene and combinations thereof.

26. The electroluminescent device of claim 12, wherein $Ar_3$ and $Ar_4$ are, at each occurrence identically or differently, selected from the group consisting of: phenyl, deuterated phenyl, methylphenyl, fluorophenyl, t-butylphenyl, trideuteromethylphenyl, biphenyl, naphthyl, deuterated naphthyl, dibenzofuryl, dibenzothienyl, 9,9-dimethylfluorenyl, carbazolyl, pyridyl, pyrimidinyl, 4-cyanophenyl, 3-cyanophenyl, triphenylene and combinations thereof.

27. The electroluminescent device of claim 13, wherein the $L_2$ is selected from any one of the group consisting of the following structures:

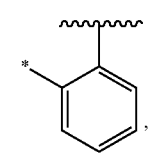

L-1

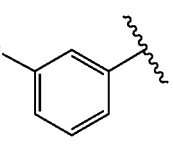

L-2

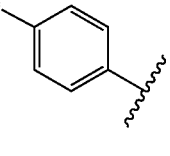

L-3

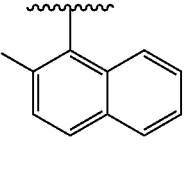

L-4

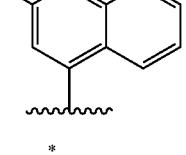

L-5

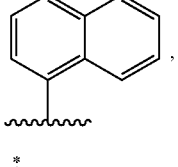

L-6

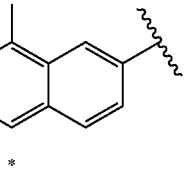

L-7

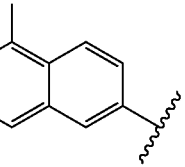

L-8

-continued
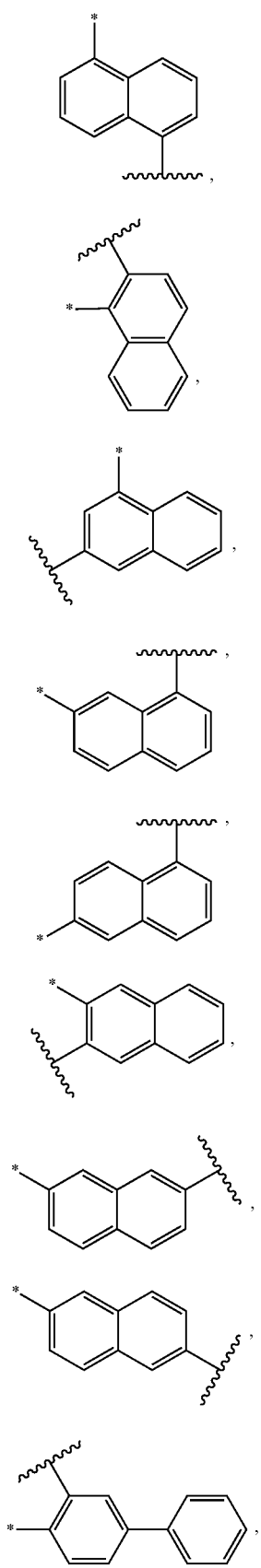
L-9,
L-10,
L-11,
L-12,
L-13,
L-14,
L-15,
L-16,
L-17
-continued
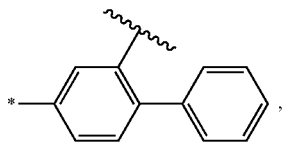 L-18,
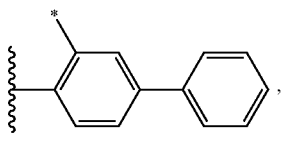 L-19,
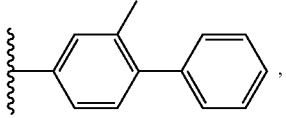 L-20,
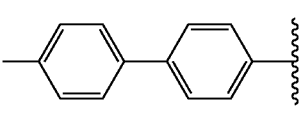 L-21,
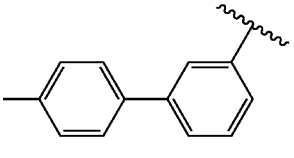 L-22,
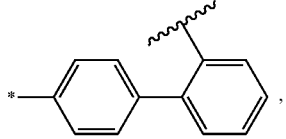 L-23,
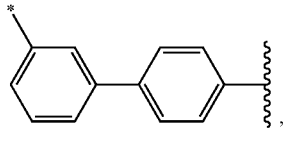 L-24,
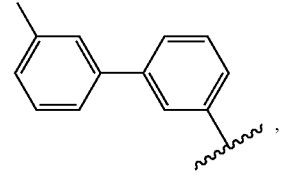 L-25,
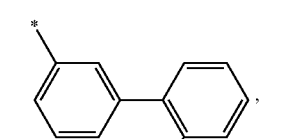 L-26,
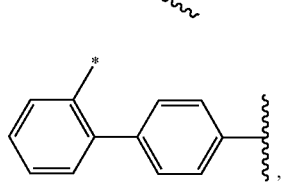 L-27,

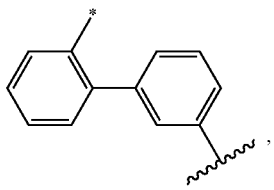
L-28
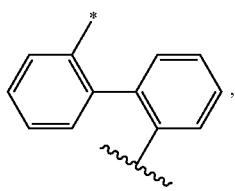
L-29
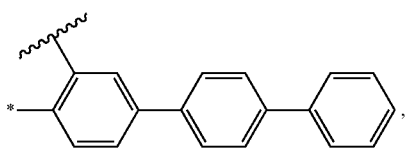
L-30
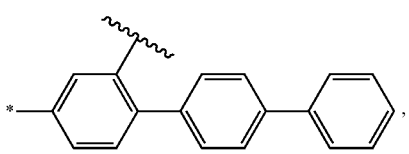
L-31
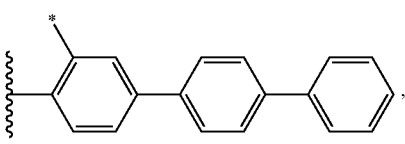
L-32
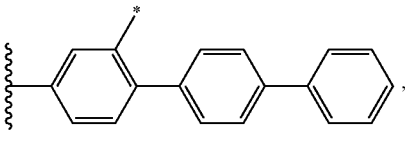
L-33
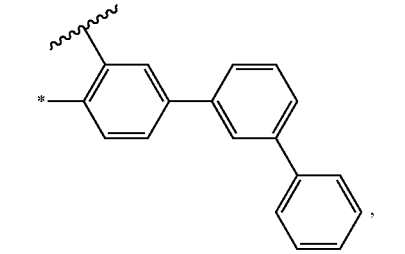
L-34
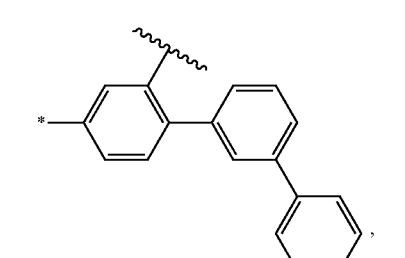
L-35
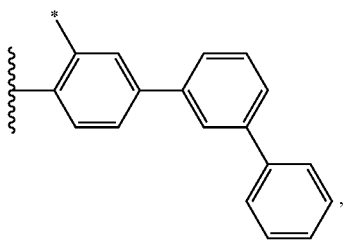
L-36
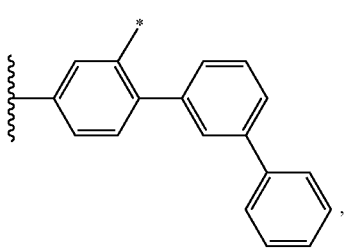
L-37
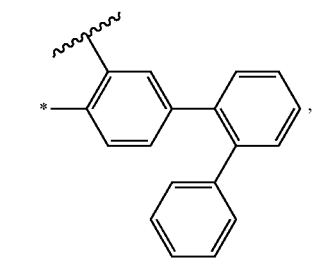
L-38
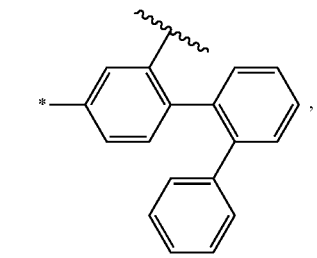
L-39
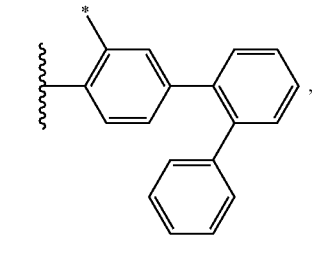
L-40
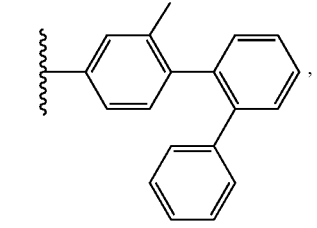
L-41

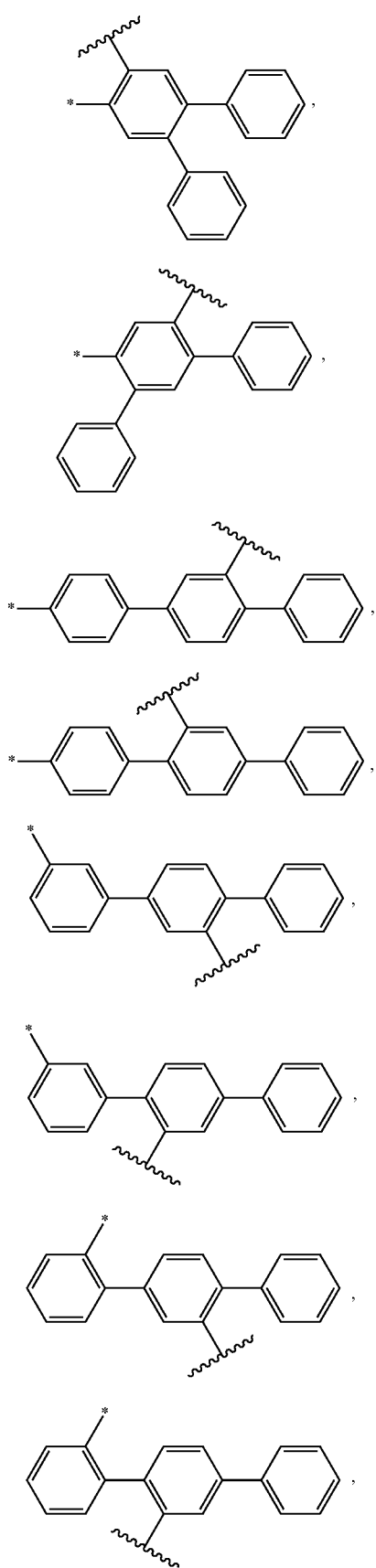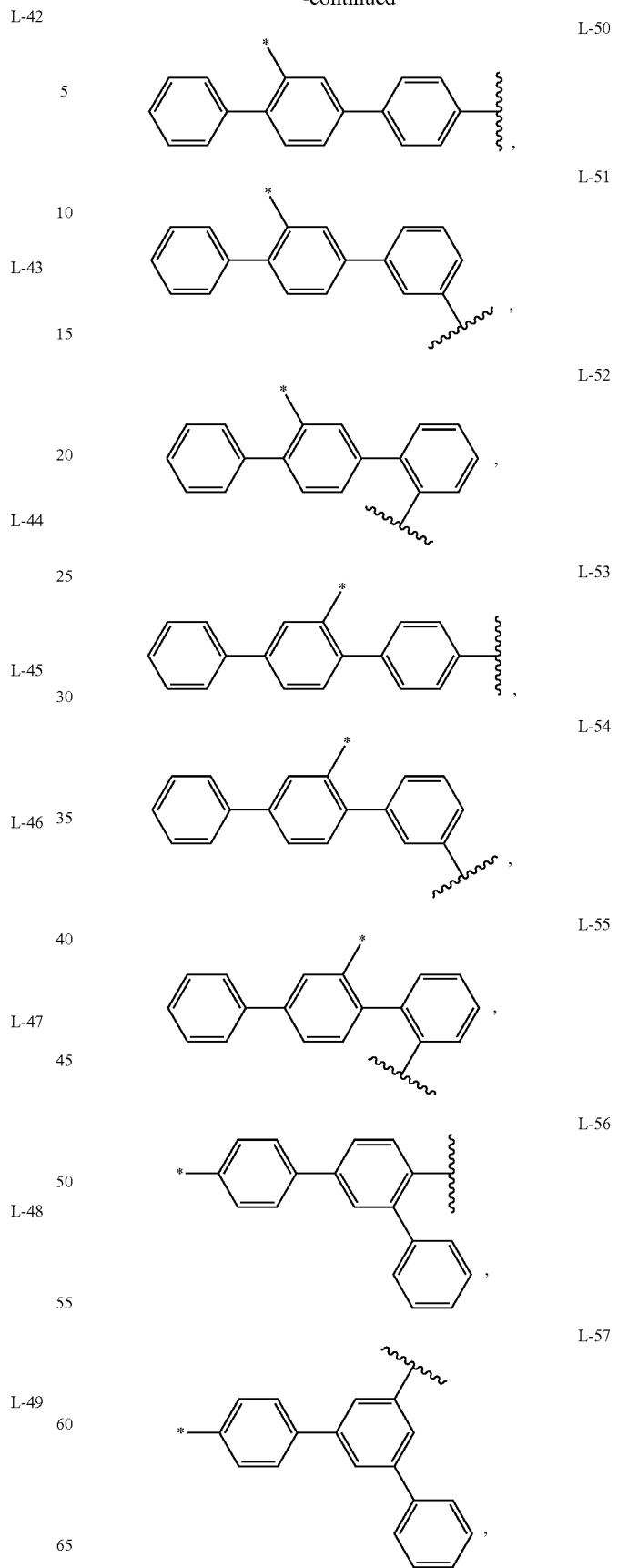

L-58
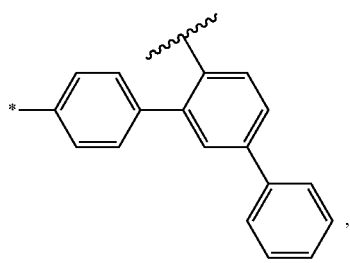
L-59
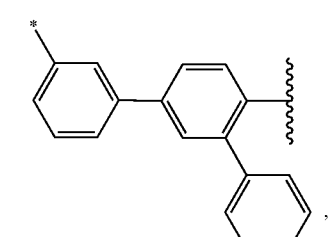
L-60
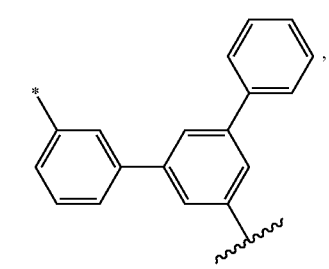
L-61
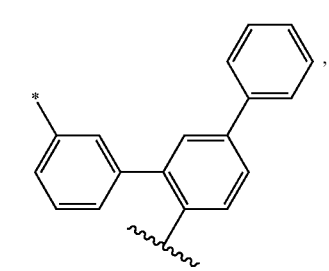
L-62
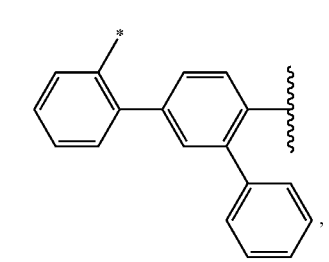
L-63
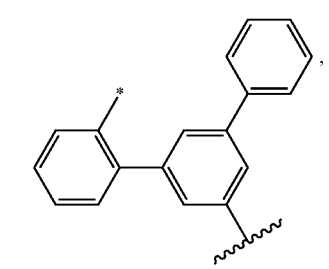
L-64
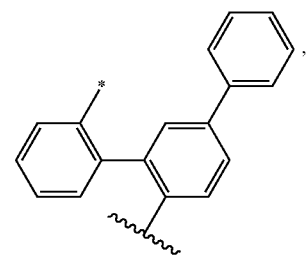
L-65
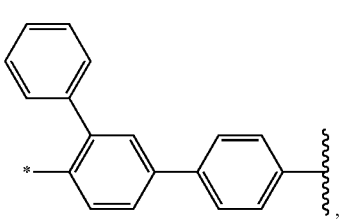
L-66
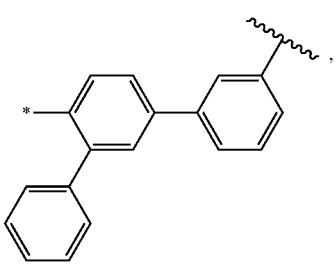
L-67
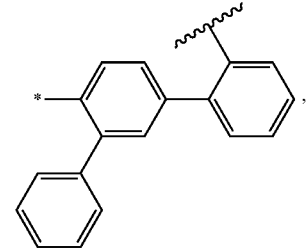
L-68
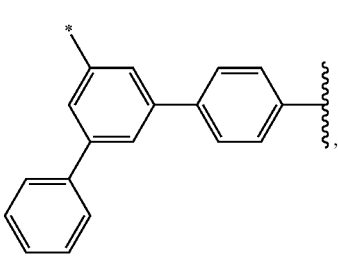
L-69
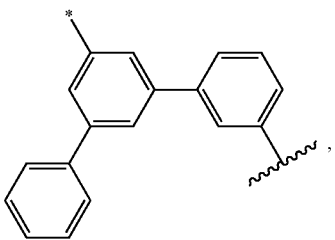

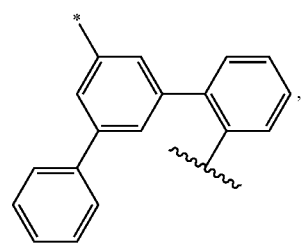 L-70,
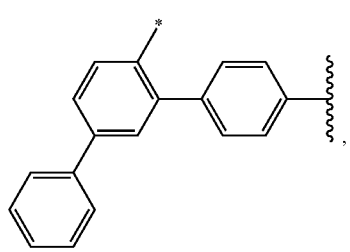 L-71,
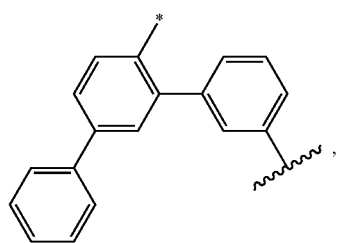 L-72,
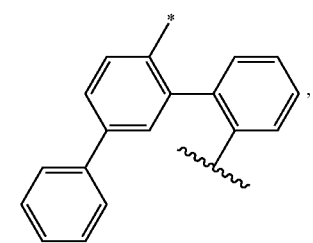 L-73,
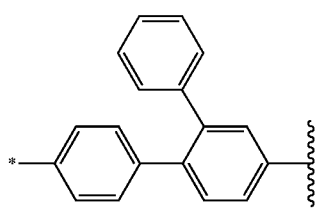 L-74,
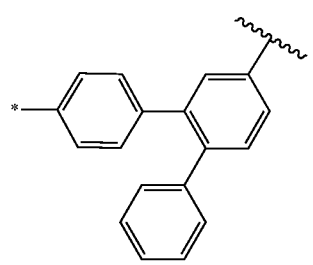 L-75,
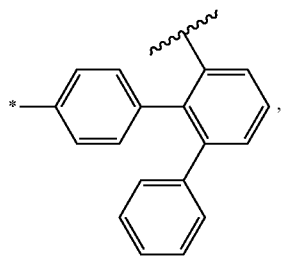 L-76,
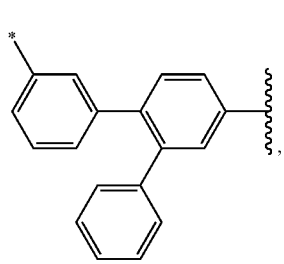 L-77,
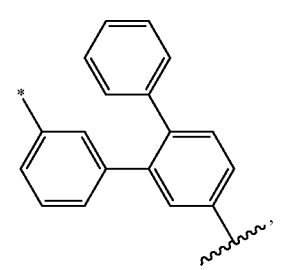 L-78,
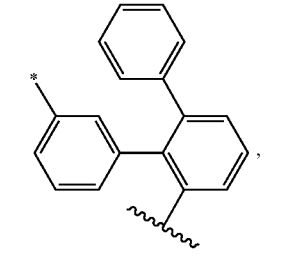 L-79,
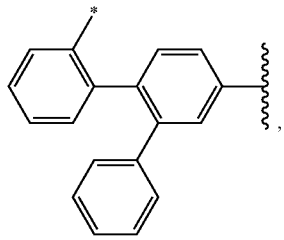 L-80,
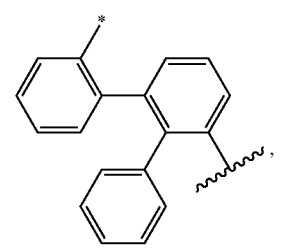 L-81, L-82
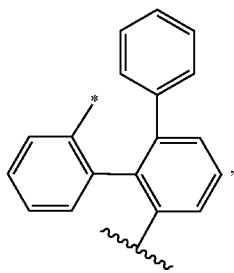
L-83
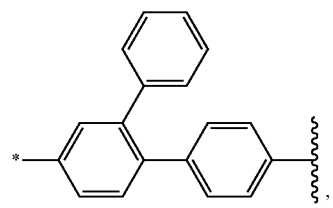
L-84
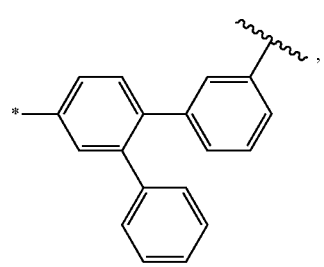
L-85
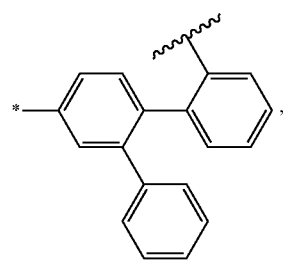
L-86
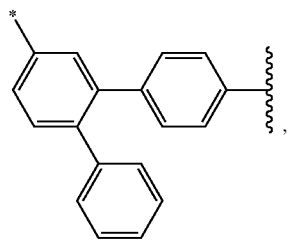
L-87
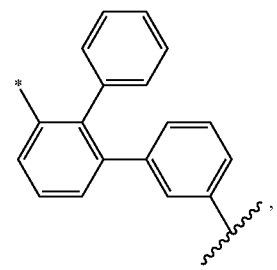
L-88
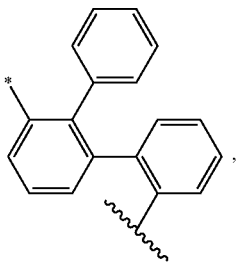
L-89
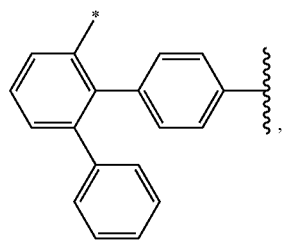
L-90
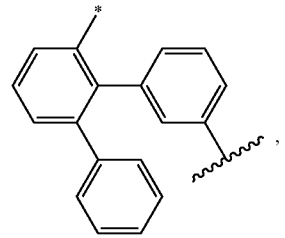
L-91
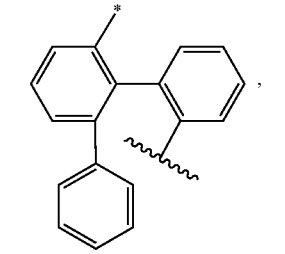
L-92
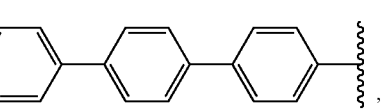
L-93
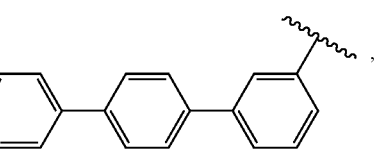
L-94
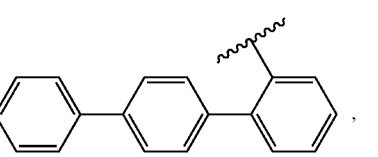
L-95
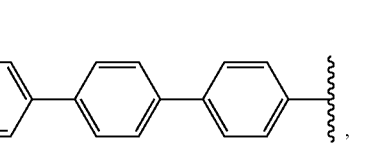

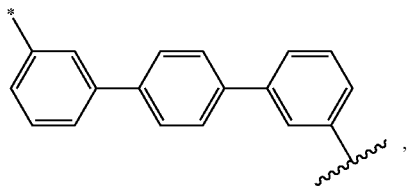
L-96
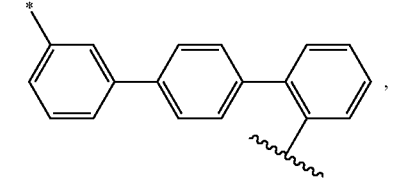
L-97
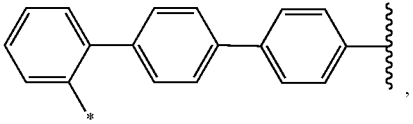
L-98
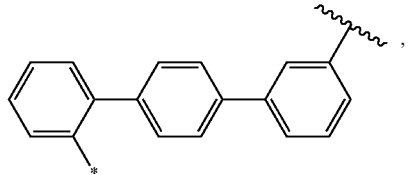
L-99
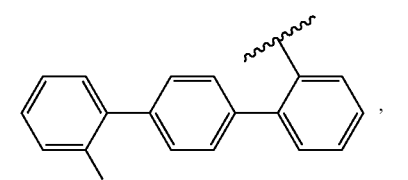
L-100
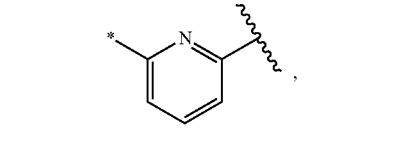
L-101
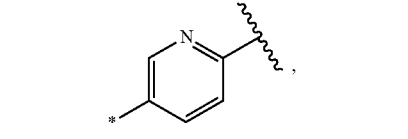
L-102
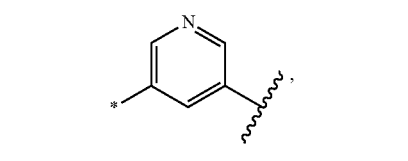
L-103
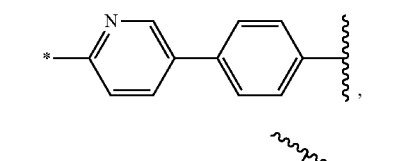
L-104
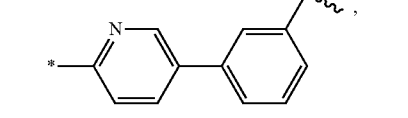
L-105
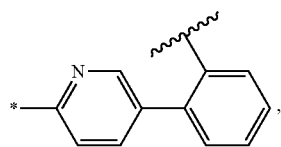
L-106
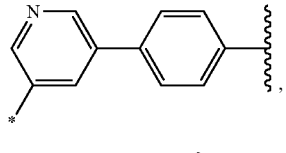
L-107
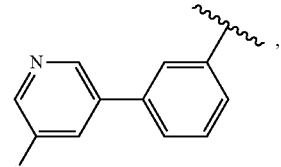
L-108
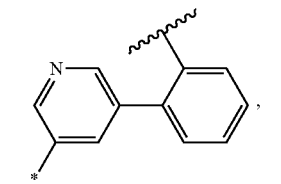
L-109
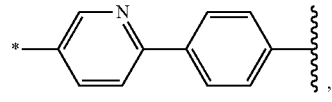
L-110
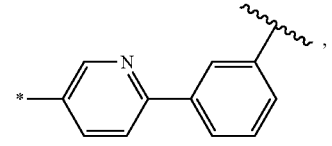
L-111
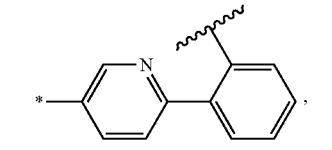
L-112
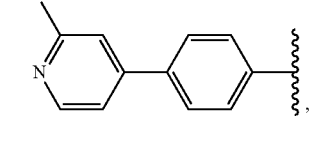
L-113
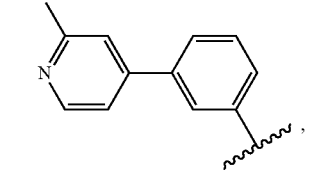
L-114
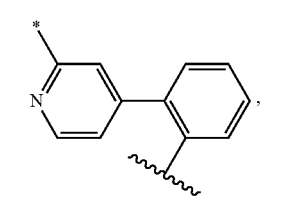
L-115

-continued
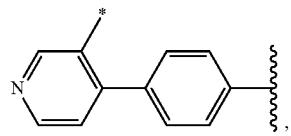
L-116
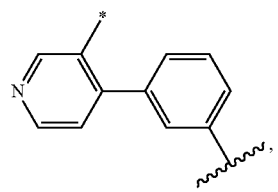
L-117
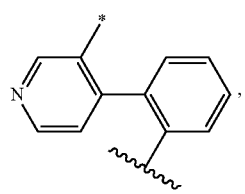
L-118
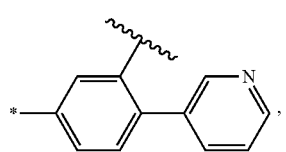
L-119
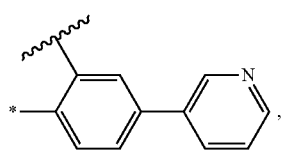
L-120
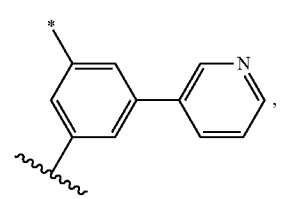
L-121
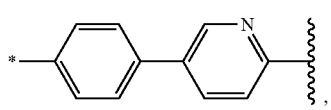
L-122
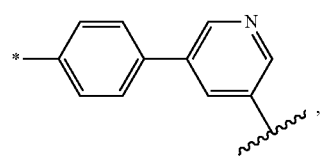
L-123
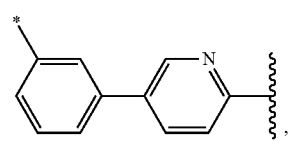
L-124
-continued
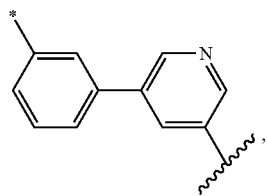
L-125
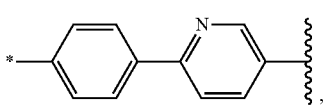
L-126
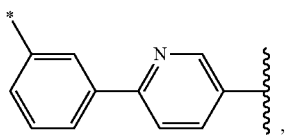
L-127
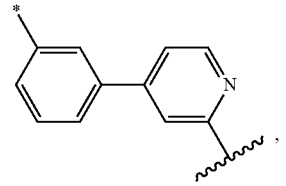
L-128
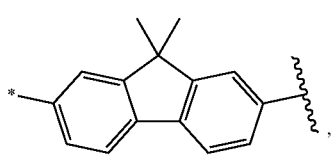
L-129
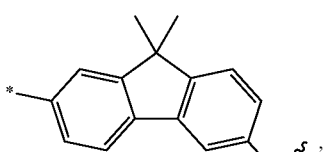
L-130
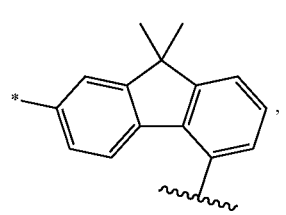
L-131
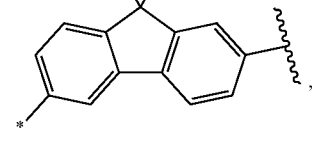
L-132
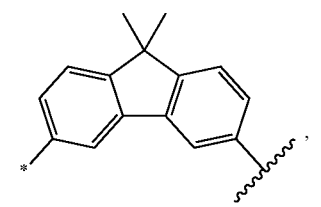
L-133

L-134 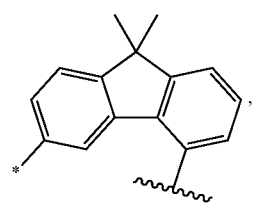
L-135 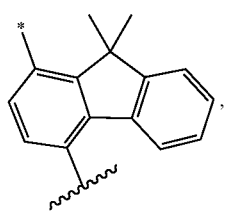
L-136 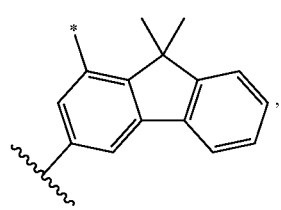
L-137 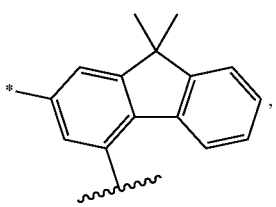
L-138 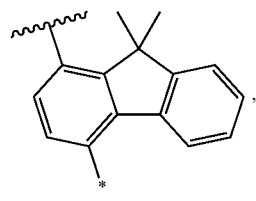
L-139 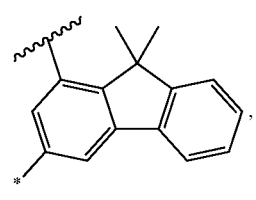
L-140 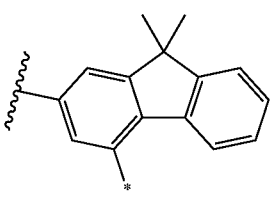
L-141 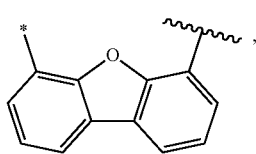
L-142 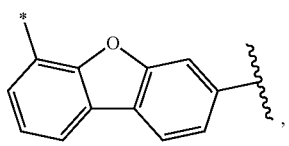
L-143 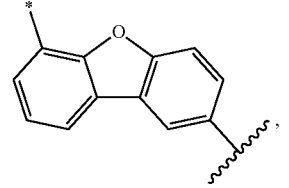
L-144 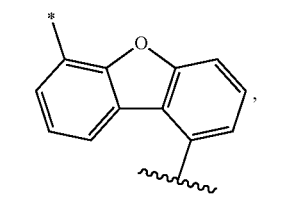
L-145 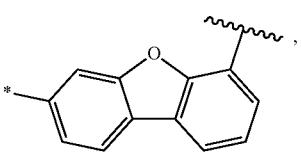
L-146 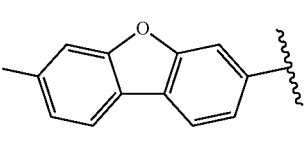
L-147 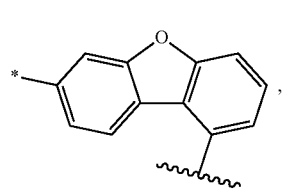
L-148 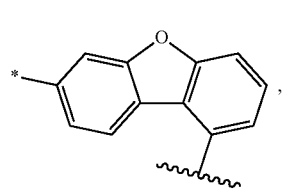
L-149 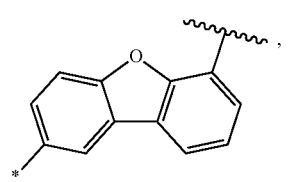
L-150 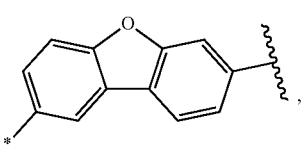

L-151 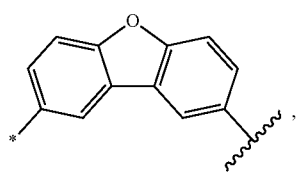
L-152 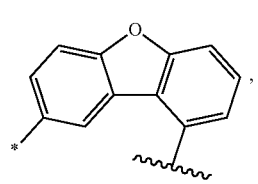
L-153 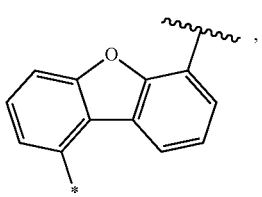
L-154 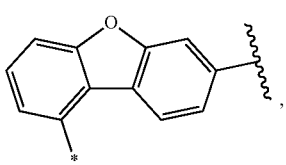
L-155 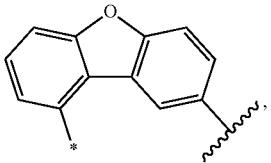
L-156 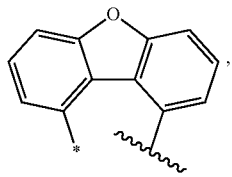
L-157 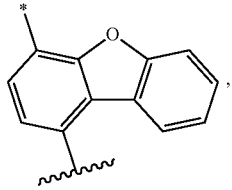
L-158 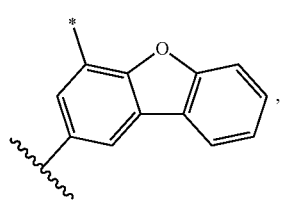
L-159 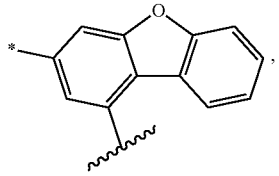
L-160 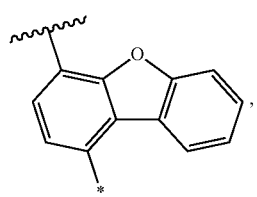
L-161 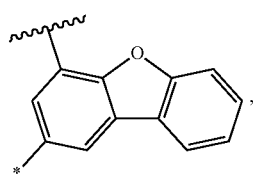
L-162 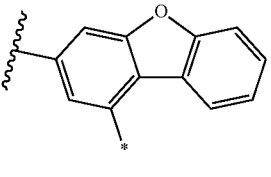
Ll-163 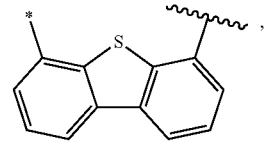
l-164 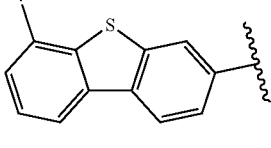
L-165 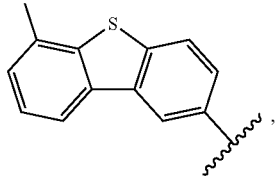
L-166 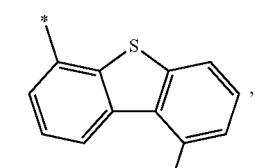
L-167 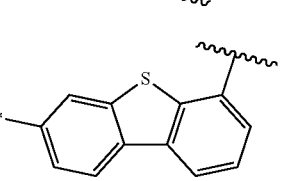

-continued
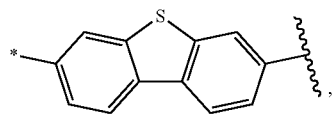  L-168
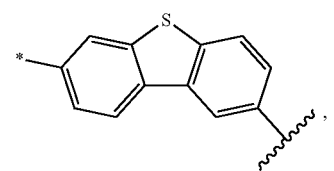  L-169
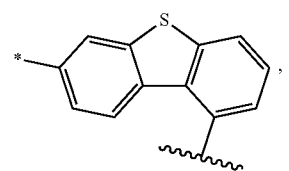  L-170
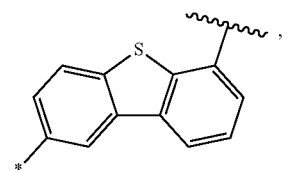  L-171
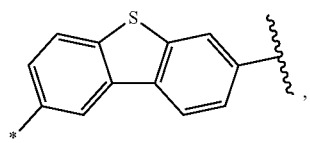  L-172
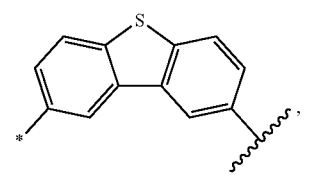  L-173
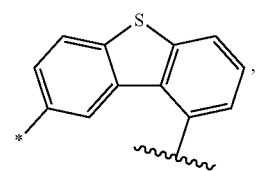  L-174
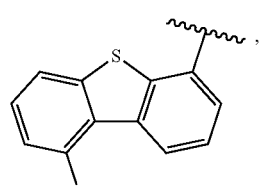  L-175
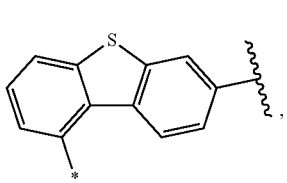  L-176
-continued
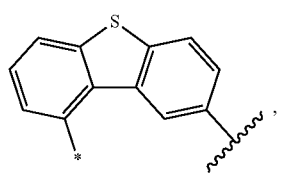  L-177
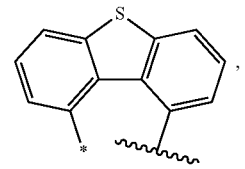  L-178
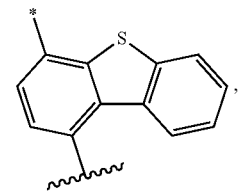  L-179
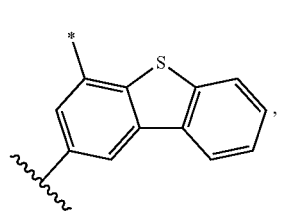  L-180
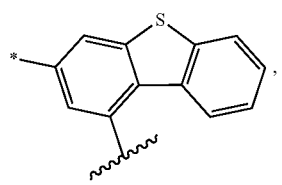  L-181
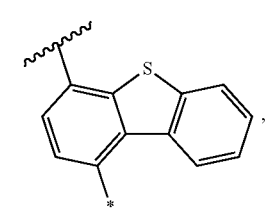  L-182
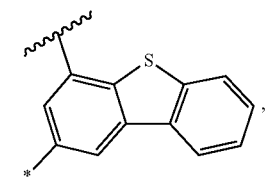  L-183
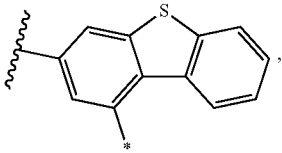  L-184

-continued
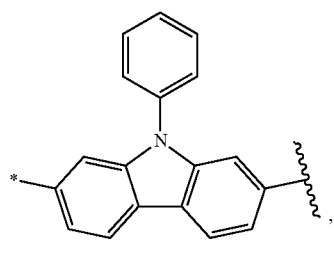
L-185
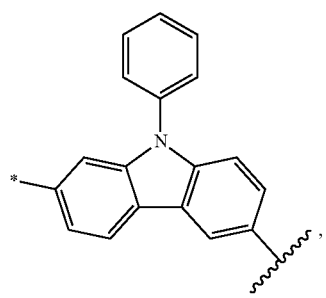
L-186
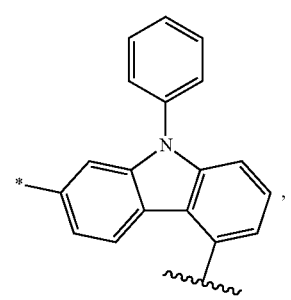
L-187
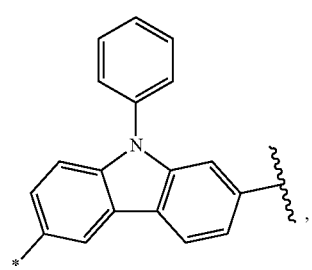
L-188
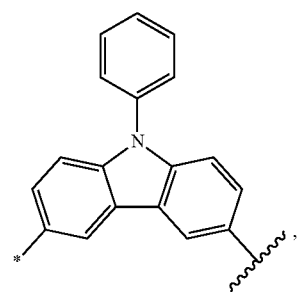
L-189
-continued
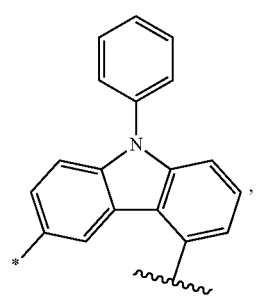
L-190
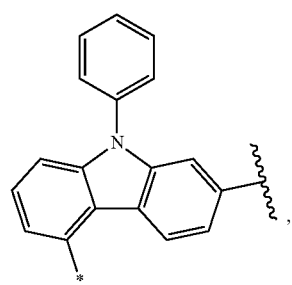
L-191
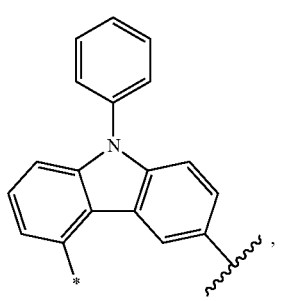
L-192
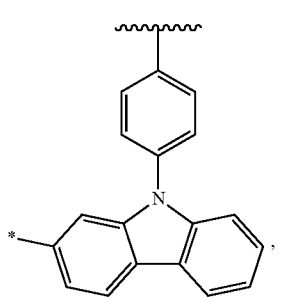
L-193
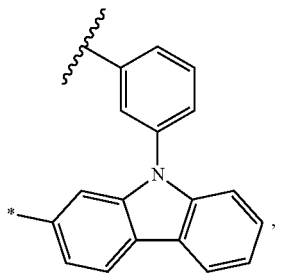
L-194

L-195

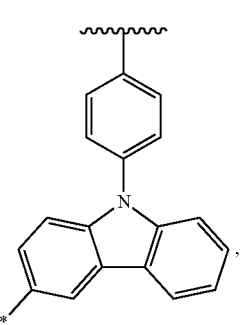, L-196

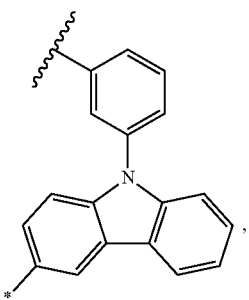, L-197

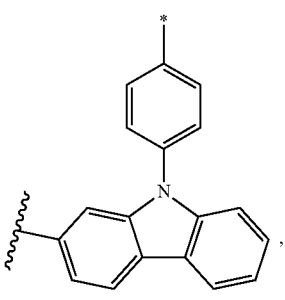, L-198

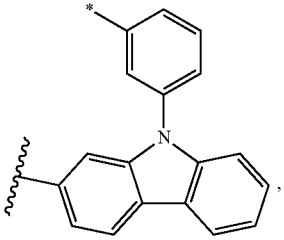, L-199

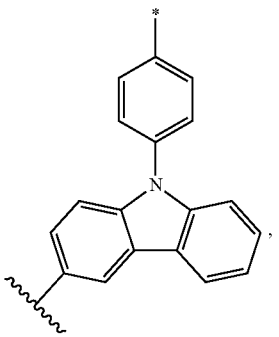,

L-200

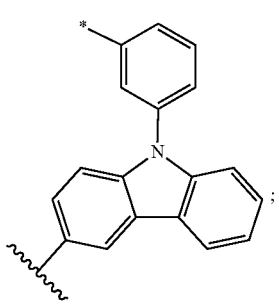;

wherein "*" represents the position where a structure of the L-1 to L-200 is joined to the H₂; and

represents the position where the structure of the L-1 to L-200 is joined to the E₂;
optionally, hydrogens in the structures of the L-1 to L-200 can be partially or fully substituted with deuterium.

28. The electroluminescent device of claim 27, wherein the second compound has the structure of H₂-L₂-E₂, wherein H₂ is selected from any one of the group consisting of H2-1 to H2-206, L₂ is selected from any one of the group consisting of L-1 to L-200, and E₂ is selected from any one of the group consisting of E2-1 to E2-58; optionally, hydrogens in the second compound can be partially or fully substituted with deuterium.

29. The electroluminescent device of claim 28, wherein the second compound is selected from the group consisting of Compound II-1 to Compound II-457, Compound II-468 to Compound II-504, Compound II-515 to Compound II-551, Compound II-563 to Compound 11-757, Compound 11-759 to Compound 11-953, and Compound 11-955 to Compound 11-1351, wherein the Compound 11-1 to Compound II-457, Compound II-468 to Compound II-504, Compound II-515 to Compound II-551, Compound II-563 to Compound II-757, Compound 11-759 to Compound 11-953, and Compound 11-955 to Compound 11-1351 have the structure of H₂-L₂-E₂, and 112, L₂ and E₂ are respectively selected from structures in the following table:

| Compound | H₂ | L₂ | E₂ | Compound | H₂ | L₂ | E₂ |
|---|---|---|---|---|---|---|---|
| II-1 | H2-13 | L-1 | E2-1 | II-2 | H2-13 | L-1 | E2-2 |
| II-3 | H2-13 | L-1 | E2-3 | II-4 | H2-13 | L-1 | E2-4 |
| II-5 | H2-13 | L-1 | E2-5 | II-6 | H2-13 | L-1 | E2-6 |
| II-7 | H2-13 | L-1 | E2-7 | II-8 | H2-13 | L-1 | E2-8 |
| II-9 | H2-13 | L-1 | E2-9 | II-10 | H2-13 | L-1 | E2-10 |
| II-11 | H2-13 | L-1 | E2-11 | II-12 | H2-13 | L-1 | E2-12 |
| II-13 | H2-13 | L-1 | E2-13 | II-14 | H2-13 | L-1 | E2-14 |
| II-15 | H2-13 | L-1 | E2-15 | II-16 | H2-13 | L-1 | E2-16 |
| II-17 | H2-13 | L-1 | E2-17 | II-18 | H2-13 | L-1 | E2-18 |
| II-19 | H2-13 | L-1 | E2-19 | II-20 | H2-13 | L-1 | E2-20 |
| II-21 | H2-13 | L-1 | E2-21 | II-22 | H2-13 | L-2 | E2-1 |
| II-23 | H2-13 | L-2 | E2-2 | II-24 | H2-13 | L-2 | E2-3 |
| II-25 | H2-13 | L-2 | E2-4 | II-26 | H2-13 | L-2 | E2-5 |
| II-27 | H2-13 | L-2 | E2-6 | II-28 | H2-13 | L-2 | E2-7 |
| II-29 | H2-13 | L-2 | E2-8 | II-30 | H2-13 | L-2 | E2-9 |
| II-31 | H2-13 | L-2 | E2-10 | II-32 | H2-13 | L-2 | E2-11 |
| II-33 | H2-13 | L-2 | E2-12 | II-34 | H2-13 | L-2 | E2-13 |
| II-35 | H2-13 | L-2 | E2-14 | II-36 | H2-13 | L-2 | E2-15 |
| II-37 | H2-13 | L-2 | E2-16 | II-38 | H2-13 | L-2 | E2-17 |

-continued

| Compound | H₂ | L₂ | E₂ | Compound | H₂ | L₂ | E₂ |
|---|---|---|---|---|---|---|---|
| II-39 | H2-13 | L-2 | E2-18 | II-40 | H2-13 | L-2 | E2-19 |
| II-41 | H2-13 | L-2 | E2-20 | II-42 | H2-13 | L-2 | E2-21 |
| II-43 | H2-13 | L-3 | E2-1 | II-44 | H2-13 | L-3 | E2-2 |
| II-45 | H2-13 | L-3 | E2-3 | II-46 | H2-13 | L-3 | E2-4 |
| II-47 | H2-13 | L-3 | E2-5 | II-48 | H2-13 | L-3 | E2-6 |
| II-49 | H2-13 | L-3 | E2-7 | II-50 | H2-13 | L-3 | E2-8 |
| II-51 | H2-13 | L-3 | E2-9 | II-52 | H2-13 | L-3 | E2-10 |
| II-53 | H2-13 | L-3 | E2-11 | II-54 | H2-13 | L-3 | E2-12 |
| II-55 | H2-13 | L-3 | E2-13 | II-56 | H2-13 | L-3 | E2-14 |
| II-57 | H2-13 | L-3 | E2-15 | II-58 | H2-13 | L-3 | E2-16 |
| II-59 | H2-13 | L-3 | E2-17 | II-60 | H2-13 | L-3 | E2-18 |
| II-61 | H2-13 | L-3 | E2-19 | II-62 | H2-13 | L-3 | E2-20 |
| II-63 | H2-13 | L-3 | E2-21 | II-64 | H2-13 | L-21 | E2-1 |
| II-65 | H2-13 | L-21 | E2-2 | II-66 | H2-13 | L-21 | E2-3 |
| II-67 | H2-13 | L-21 | E2-4 | II-68 | H2-13 | L-21 | E2-5 |
| II-69 | H2-13 | L-21 | E2-6 | II-70 | H2-13 | L-21 | E2-7 |
| II-71 | H2-13 | L-21 | E2-8 | II-72 | H2-13 | L-21 | E2-9 |
| II-73 | H2-13 | L-21 | E2-10 | II-74 | H2-13 | L-21 | E2-11 |
| II-75 | H2-13 | L-21 | E2-12 | II-76 | H2-13 | L-21 | E2-13 |
| II-77 | H2-13 | L-21 | E2-14 | II-78 | H2-13 | L-21 | E2-15 |
| II-79 | H2-13 | L-21 | E2-16 | II-80 | H2-13 | L-21 | E2-17 |
| II-81 | H2-13 | L-21 | E2-18 | II-82 | H2-13 | L-21 | E2-19 |
| II-83 | H2-13 | L-21 | E2-20 | II-84 | H2-13 | L-21 | E2-21 |
| II-85 | H2-13 | L-22 | E2-1 | II-86 | H2-13 | L-22 | E2-2 |
| II-87 | H2-13 | L-22 | E2-3 | II-88 | H2-13 | L-22 | E2-4 |
| II-89 | H2-13 | L-22 | E2-5 | II-90 | H2-13 | L-22 | E2-6 |
| II-91 | H2-13 | L-22 | E2-7 | II-92 | H2-13 | L-22 | E2-8 |
| II-93 | H2-13 | L-22 | E2-9 | II-94 | H2-13 | L-22 | E2-10 |
| II-95 | H2-13 | L-22 | E2-11 | II-96 | H2-13 | L-22 | E2-12 |
| II-97 | H2-13 | L-22 | E2-13 | II-98 | H2-13 | L-22 | E2-14 |
| II-99 | H2-13 | L-22 | E2-15 | II-100 | H2-13 | L-22 | E2-16 |
| II-101 | H2-13 | L-22 | E2-17 | II-102 | H2-13 | L-22 | E2-18 |
| II-103 | H2-13 | L-22 | E2-19 | II-104 | H2-13 | L-22 | E2-20 |
| II-105 | H2-13 | L-22 | E2-21 | II-106 | H2-15 | L-1 | E2-1 |
| II-107 | H2-15 | L-1 | E2-2 | II-108 | H2-15 | L-1 | E2-3 |
| II-109 | H2-15 | L-1 | E2-4 | II-110 | H2-15 | L-1 | E2-5 |
| II-111 | H2-15 | L-1 | E2-6 | II-112 | H2-15 | L-1 | E2-7 |
| II-113 | H2-15 | L-1 | E2-8 | II-114 | H2-15 | L-1 | E2-9 |
| II-115 | H2-15 | L-1 | E2-10 | II-116 | H2-15 | L-1 | E2-11 |
| II-117 | H2-15 | L-1 | E2-12 | II-118 | H2-15 | L-1 | E2-13 |
| II-119 | H2-15 | L-1 | E2-14 | II-120 | H2-15 | L-1 | E2-15 |
| II-121 | H2-15 | L-1 | E2-16 | II-122 | H2-15 | L-1 | E2-17 |
| II-123 | H2-15 | L-1 | E2-18 | II-124 | H2-15 | L-1 | E2-19 |
| II-125 | H2-15 | L-1 | E2-20 | II-126 | H2-15 | L-1 | E2-21 |
| II-127 | H2-15 | L-2 | E2-1 | II-128 | H2-15 | L-2 | E2-2 |
| II-129 | H2-15 | L-2 | E2-3 | II-130 | H2-15 | L-2 | E2-4 |
| II-131 | H2-15 | L-2 | E2-5 | II-132 | H2-15 | L-2 | E2-6 |
| II-133 | H2-15 | L-2 | E2-7 | II-134 | H2-15 | L-2 | E2-8 |
| II-135 | H2-15 | L-2 | E2-9 | II-136 | H2-15 | L-2 | E2-10 |
| II-137 | H2-15 | L-2 | E2-11 | II-138 | H2-15 | L-2 | E2-12 |
| II-139 | H2-15 | L-2 | E2-13 | II-140 | H2-15 | L-2 | E2-14 |
| II-141 | H2-15 | L-2 | E2-15 | II-142 | H2-15 | L-2 | E2-16 |
| II-143 | H2-15 | L-2 | E2-17 | II-144 | H2-15 | L-2 | E2-18 |
| II-145 | H2-15 | L-2 | E2-19 | II-146 | H2-15 | L-2 | E2-20 |
| II-147 | H2-15 | L-2 | E2-21 | II-148 | H2-15 | L-3 | E2-1 |
| II-149 | H2-15 | L-3 | E2-2 | II-150 | H2-15 | L-3 | E2-3 |
| II-151 | H2-15 | L-3 | E2-4 | II-152 | H2-15 | L-3 | E2-5 |
| II-153 | H2-15 | L-3 | E2-6 | II-154 | H2-15 | L-3 | E2-7 |
| II-155 | H2-15 | L-3 | E2-8 | II-156 | H2-15 | L-3 | E2-9 |
| II-157 | H2-15 | L-3 | E2-10 | II-158 | H2-15 | L-3 | E2-11 |
| II-159 | H2-15 | L-3 | E2-12 | II-160 | H2-15 | L-3 | E2-13 |
| II-161 | H2-15 | L-3 | E2-14 | II-162 | H2-15 | L-3 | E2-15 |
| II-163 | H2-15 | L-3 | E2-16 | II-164 | H2-15 | L-3 | E2-17 |
| II-165 | H2-15 | L-3 | E2-18 | II-166 | H2-15 | L-3 | E2-19 |
| II-167 | H2-15 | L-3 | E2-20 | II-168 | H2-15 | L-3 | E2-21 |
| II-169 | H2-15 | L-21 | E2-1 | II-170 | H2-15 | L-21 | E2-2 |
| II-171 | H2-15 | L-21 | E2-3 | II-172 | H2-15 | L-21 | E2-4 |
| II-173 | H2-15 | L-21 | E2-5 | II-174 | H2-15 | L-21 | E2-6 |
| II-175 | H2-15 | L-21 | E2-7 | II-176 | H2-15 | L-21 | E2-8 |
| II-177 | H2-15 | L-21 | E2-9 | II-178 | H2-15 | L-21 | E2-10 |
| II-179 | H2-15 | L-21 | E2-11 | II-180 | H2-15 | L-21 | E2-12 |
| II-181 | H2-15 | L-21 | E2-13 | II-182 | H2-15 | L-21 | E2-14 |
| II-183 | H2-15 | L-21 | E2-15 | II-184 | H2-15 | L-21 | E2-16 |
| II-185 | H2-15 | L-21 | E2-17 | II-186 | H2-15 | L-21 | E2-18 |
| II-187 | H2-15 | L-21 | E2-19 | II-188 | H2-15 | L-21 | E2-20 |
| II-189 | H2-15 | L-21 | E2-21 | II-190 | H2-15 | L-22 | E2-1 |
| II-191 | H2-15 | L-22 | E2-2 | II-192 | H2-15 | L-22 | E2-3 |
| II-193 | H2-15 | L-22 | E2-4 | II-194 | H2-15 | L-22 | E2-5 |
| II-195 | H2-15 | L-22 | E2-6 | II-196 | H2-15 | L-22 | E2-7 |
| II-197 | H2-15 | L-22 | E2-8 | II-198 | H2-15 | L-22 | E2-9 |
| II-199 | H2-15 | L-22 | E2-10 | II-200 | H2-15 | L-22 | E2-11 |
| II-201 | H2-15 | L-22 | E2-12 | II-202 | H2-15 | L-22 | E2-13 |
| II-203 | H2-15 | L-22 | E2-14 | II-204 | H2-15 | L-22 | E2-15 |
| II-205 | H2-15 | L-22 | E2-16 | II-206 | H2-15 | L-22 | E2-17 |
| II-207 | H2-15 | L-22 | E2-18 | II-208 | H2-15 | L-22 | E2-19 |
| II-209 | H2-15 | L-22 | E2-20 | II-210 | H2-15 | L-22 | E2-21 |
| II-211 | H2-27 | L-1 | E2-1 | II-212 | H2-27 | L-1 | E2-2 |
| II-213 | H2-27 | L-1 | E2-3 | II-214 | H2-27 | L-1 | E2-4 |
| II-215 | H2-27 | L-1 | E2-5 | II-216 | H2-27 | L-1 | E2-6 |
| II-217 | H2-27 | L-1 | E2-7 | II-218 | H2-27 | L-1 | E2-8 |
| II-219 | H2-27 | L-1 | E2-9 | II-220 | H2-27 | L-1 | E2-10 |
| II-221 | H2-27 | L-1 | E2-11 | II-222 | H2-27 | L-1 | E2-12 |
| II-223 | H2-27 | L-1 | E2-13 | II-224 | H2-27 | L-1 | E2-14 |
| II-225 | H2-27 | L-1 | E2-15 | II-226 | H2-27 | L-1 | E2-16 |
| II-227 | H2-27 | L-1 | E2-17 | II-228 | H2-27 | L-1 | E2-18 |
| II-229 | H2-27 | L-1 | E2-19 | II-230 | H2-27 | L-1 | E2-20 |
| II-231 | H2-27 | L-1 | E2-21 | II-232 | H2-27 | L-2 | E2-1 |
| II-233 | H2-27 | L-2 | E2-2 | II-234 | H2-27 | L-2 | E2-3 |
| II-235 | H2-27 | L-2 | E2-4 | II-236 | H2-27 | L-2 | E2-5 |
| II-237 | H2-27 | L-2 | E2-6 | II-238 | H2-27 | L-2 | E2-7 |
| II-239 | H2-27 | L-2 | E2-8 | II-240 | H2-27 | L-2 | E2-9 |
| II-241 | H2-27 | L-2 | E2-10 | II-242 | H2-27 | L-2 | E2-11 |
| II-243 | H2-27 | L-2 | E2-12 | II-244 | H2-27 | L-2 | E2-13 |
| II-245 | H2-27 | L-2 | E2-14 | II-246 | H2-27 | L-2 | E2-15 |
| II-247 | H2-27 | L-2 | E2-16 | II-248 | H2-27 | L-2 | E2-17 |
| II-249 | H2-27 | L-2 | E2-18 | II-250 | H2-27 | L-2 | E2-19 |
| II-251 | H2-27 | L-2 | E2-20 | II-252 | H2-27 | L-2 | E2-21 |
| II-253 | H2-27 | L-3 | E2-1 | II-254 | H2-27 | L-3 | E2-2 |
| II-255 | H2-27 | L-3 | E2-3 | II-256 | H2-27 | L-3 | E2-4 |
| II-257 | H2-27 | L-3 | E2-5 | II-258 | H2-27 | L-3 | E2-6 |
| II-259 | H2-27 | L-3 | E2-7 | II-260 | H2-27 | L-3 | E2-8 |
| II-261 | H2-27 | L-3 | E2-9 | II-262 | H2-27 | L-3 | E2-10 |
| II-263 | H2-27 | L-3 | E2-11 | II-264 | H2-27 | L-3 | E2-12 |
| II-265 | H2-27 | L-3 | E2-13 | II-266 | H2-27 | L-3 | E2-14 |
| II-267 | H2-27 | L-3 | E2-15 | II-268 | H2-27 | L-3 | E2-16 |
| II-269 | H2-27 | L-3 | E2-17 | II-270 | H2-27 | L-3 | E2-18 |
| II-271 | H2-27 | L-3 | E2-19 | II-272 | H2-27 | L-3 | E2-20 |
| II-273 | H2-27 | L-3 | E2-21 | II-274 | H2-27 | L-21 | E2-1 |
| II-275 | H2-27 | L-21 | E2-2 | II-276 | H2-27 | L-21 | E2-3 |
| II-277 | H2-27 | L-21 | E2-4 | II-278 | H2-27 | L-21 | E2-5 |
| II-279 | H2-27 | L-21 | E2-6 | II-280 | H2-27 | L-21 | E2-7 |
| II-281 | H2-27 | L-21 | E2-8 | II-282 | H2-27 | L-21 | E2-9 |
| II-283 | H2-27 | L-21 | E2-10 | II-284 | H2-27 | L-21 | E2-11 |
| II-285 | H2-27 | L-21 | E2-12 | II-286 | H2-27 | L-21 | E2-13 |
| II-287 | H2-27 | L-21 | E2-14 | II-288 | H2-27 | L-21 | E2-15 |
| II-289 | H2-27 | L-21 | E2-16 | II-290 | H2-27 | L-21 | E2-17 |
| II-291 | H2-27 | L-21 | E2-18 | II-292 | H2-27 | L-21 | E2-19 |
| II-293 | H2-27 | L-21 | E2-20 | II-294 | H2-27 | L-21 | E2-21 |
| II-295 | H2-27 | L-22 | E2-1 | II-296 | H2-27 | L-22 | E2-2 |
| II-297 | H2-27 | L-22 | E2-3 | II-298 | H2-27 | L-22 | E2-4 |
| II-299 | H2-27 | L-22 | E2-5 | II-300 | H2-27 | L-22 | E2-6 |
| II-301 | H2-27 | L-22 | E2-7 | II-302 | H2-27 | L-22 | E2-8 |
| II-303 | H2-27 | L-22 | E2-9 | II-304 | H2-27 | L-22 | E2-10 |
| II-305 | H2-27 | L-22 | E2-11 | II-306 | H2-27 | L-22 | E2-12 |
| II-307 | H2-27 | L-22 | E2-13 | II-308 | H2-27 | L-22 | E2-14 |
| II-309 | H2-27 | L-22 | E2-15 | II-310 | H2-27 | L-22 | E2-16 |
| II-311 | H2-27 | L-22 | E2-17 | II-312 | H2-27 | L-22 | E2-18 |
| II-313 | H2-27 | L-22 | E2-19 | II-314 | H2-27 | L-22 | E2-20 |
| II-315 | H2-27 | L-22 | E2-21 | II-316 | H2-30 | L-1 | E2-1 |
| II-317 | H2-30 | L-1 | E2-2 | II-318 | H2-30 | L-1 | E2-3 |
| II-319 | H2-30 | L-1 | E2-4 | II-320 | H2-30 | L-1 | E2-5 |
| II-321 | H2-30 | L-1 | E2-6 | II-322 | H2-30 | L-1 | E2-7 |
| II-323 | H2-30 | L-1 | E2-8 | II-324 | H2-30 | L-1 | E2-9 |
| II-325 | H2-30 | L-1 | E2-10 | II-326 | H2-30 | L-1 | E2-11 |
| II-327 | H2-30 | L-1 | E2-12 | II-328 | H2-30 | L-1 | E2-13 |
| II-329 | H2-30 | L-1 | E2-14 | II-330 | H2-30 | L-1 | E2-15 |
| II-331 | H2-30 | L-1 | E2-16 | II-332 | H2-30 | L-1 | E2-17 |
| II-333 | H2-30 | L-1 | E2-18 | II-334 | H2-30 | L-1 | E2-19 |
| II-335 | H2-30 | L-1 | E2-20 | II-336 | H2-30 | L-1 | E2-21 |
| II-337 | H2-30 | L-2 | E2-1 | II-338 | H2-30 | L-2 | E2-2 |
| II-339 | H2-30 | L-2 | E2-3 | II-340 | H2-30 | L-2 | E2-4 |
| II-341 | H2-30 | L-2 | E2-5 | II-342 | H2-30 | L-2 | E2-6 |
| II-343 | H2-30 | L-2 | E2-7 | II-344 | H2-30 | L-2 | E2-8 |
| II-345 | H2-30 | L-2 | E2-9 | II-346 | H2-30 | L-2 | E2-10 |

| Compound | H₂ | L₂ | E₂ | Compound | H₂ | L₂ | E₂ | Compound | H₂ | L₂ | E₂ | Compound | H₂ | L₂ | E₂ |
|---|---|---|---|---|---|---|---|---|---|---|---|---|---|---|---|
| II-347 | H2-30 | L-2 | E2-11 | II-348 | H2-30 | L-2 | E2-12 | II-519 | H2-30 | L-22 | E2-26 | II-520 | H2-30 | L-22 | E2-27 |
| II-349 | H2-30 | L-2 | E2-13 | II-350 | H2-30 | L-2 | E2-14 | II-521 | H2-30 | L-22 | E2-28 | II-522 | H2-30 | L-22 | E2-29 |
| II-351 | H2-30 | L-2 | E2-15 | II-352 | H2-30 | L-2 | E2-16 | II-523 | H2-30 | L-22 | E2-30 | II-524 | H2-30 | L-22 | E2-31 |
| II-353 | H2-30 | L-2 | E2-17 | II-354 | H2-30 | L-2 | E2-18 | II-525 | H2-30 | L-22 | E2-32 | II-526 | H2-30 | L-22 | E2-33 |
| II-355 | H2-30 | L-2 | E2-19 | II-356 | H2-30 | L-2 | E2-20 | II-527 | H2-30 | L-22 | E2-34 | II-528 | H2-30 | L-22 | E2-35 |
| II-357 | H2-30 | L-2 | E2-21 | II-358 | H2-30 | L-3 | E2-1 | II-529 | H2-30 | L-22 | E2-36 | II-530 | H2-30 | L-22 | E2-37 |
| II-359 | H2-30 | L-3 | E2-2 | II-360 | H2-30 | L-3 | E2-3 | II-531 | H2-30 | L-22 | E2-38 | II-532 | H2-30 | L-22 | E2-39 |
| II-361 | H2-30 | L-3 | E2-4 | II-362 | H2-30 | L-3 | E2-5 | II-533 | H2-30 | L-22 | E2-40 | II-534 | H2-30 | L-22 | E2-41 |
| II-363 | H2-30 | L-3 | E2-6 | II-364 | H2-30 | L-3 | E2-7 | II-535 | H2-30 | L-22 | E2-42 | II-536 | H2-30 | L-22 | E2-43 |
| II-365 | H2-30 | L-3 | E2-8 | II-366 | H2-30 | L-3 | E2-9 | II-537 | H2-30 | L-22 | E2-44 | II-538 | H2-30 | L-22 | E2-45 |
| II-367 | H2-30 | L-3 | E2-10 | II-368 | H2-30 | L-3 | E2-11 | II-539 | H2-30 | L-22 | E2-46 | II-540 | H2-30 | L-22 | E2-47 |
| II-369 | H2-30 | L-3 | E2-12 | II-370 | H2-30 | L-3 | E2-13 | II-541 | H2-30 | L-22 | E2-48 | II-542 | H2-30 | L-22 | E2-49 |
| II-371 | H2-30 | L-3 | E2-14 | II-372 | H2-30 | L-3 | E2-15 | II-543 | H2-30 | L-22 | E2-50 | II-544 | H2-30 | L-22 | E2-51 |
| II-373 | H2-30 | L-3 | E2-16 | II-374 | H2-30 | L-3 | E2-17 | II-545 | H2-30 | L-22 | E2-52 | II-546 | H2-30 | L-22 | E2-53 |
| II-375 | H2-30 | L-3 | E2-18 | II-376 | H2-30 | L-3 | E2-19 | II-547 | H2-30 | L-22 | E2-54 | II-548 | H2-30 | L-22 | E2-55 |
| II-377 | H2-30 | L-3 | E2-20 | II-378 | H2-30 | L-3 | E2-21 | II-549 | H2-30 | L-22 | E2-56 | II-550 | H2-30 | L-22 | E2-57 |
| II-379 | H2-30 | L-21 | E2-1 | II-380 | H2-30 | L-21 | E2-2 | II-551 | H2-30 | L-22 | E2-58 | | | | |
| II-381 | H2-30 | L-21 | E2-3 | II-382 | H2-30 | L-21 | E2-4 | II-563 | H2-15 | L-4 | E2-1 | II-564 | H2-15 | L-5 | E2-1 |
| II-383 | H2-30 | L-21 | E2-5 | II-384 | H2-30 | L-21 | E2-6 | II-565 | H2-15 | L-6 | E2-1 | II-566 | H2-15 | L-7 | E2-1 |
| II-385 | H2-30 | L-21 | E2-7 | II-386 | H2-30 | L-21 | E2-8 | II-567 | H2-15 | L-8 | E2-1 | II-568 | H2-15 | L-9 | E2-1 |
| II-387 | H2-30 | L-21 | E2-9 | II-388 | H2-30 | L-21 | E2-10 | II-569 | H2-15 | L-10 | E2-1 | II-570 | H2-15 | L-11 | E2-1 |
| II-389 | H2-30 | L-21 | E2-11 | II-390 | H2-30 | L-21 | E2-12 | II-571 | H2-15 | L-12 | E2-1 | II-572 | H2-15 | L-13 | E2-1 |
| II-391 | H2-30 | L-21 | E2-13 | II-392 | H2-30 | L-21 | E2-14 | II-573 | H2-15 | L-14 | E2-1 | II-574 | H2-15 | L-15 | E2-1 |
| II-393 | H2-30 | L-21 | E2-15 | II-394 | H2-30 | L-21 | E2-16 | II-575 | H2-15 | L-16 | E2-1 | II-576 | H2-15 | L-17 | E2-1 |
| II-395 | H2-30 | L-21 | E2-17 | II-396 | H2-30 | L-21 | E2-18 | II-577 | H2-15 | L-18 | E2-1 | II-578 | H2-15 | L-19 | E2-1 |
| II-397 | H2-30 | L-21 | E2-19 | II-398 | H2-30 | L-21 | E2-20 | II-579 | H2-15 | L-20 | E2-1 | II-580 | H2-15 | L-23 | E2-1 |
| II-399 | H2-30 | L-21 | E2-21 | II-400 | H2-30 | L-22 | E2-1 | II-581 | H2-15 | L-24 | E2-1 | II-582 | H2-15 | L-25 | E2-1 |
| II-401 | H2-30 | L-22 | E2-2 | II-402 | H2-30 | L-22 | E2-3 | II-583 | H2-15 | L-26 | E2-1 | II-584 | H2-15 | L-27 | E2-1 |
| II-403 | H2-30 | L-22 | E2-4 | II-404 | H2-30 | L-22 | E2-5 | II-585 | H2-15 | L-28 | E2-1 | II-586 | H2-15 | L-29 | E2-1 |
| II-405 | H2-30 | L-22 | E2-6 | II-406 | H2-30 | L-22 | E2-7 | II-587 | H2-15 | L-30 | E2-1 | II-588 | H2-15 | L-31 | E2-1 |
| II-407 | H2-30 | L-22 | E2-8 | II-408 | H2-30 | L-22 | E2-9 | II-589 | H2-15 | L-32 | E2-1 | II-590 | H2-15 | L-33 | E2-1 |
| II-409 | H2-30 | L-22 | E2-10 | II-410 | H2-30 | L-22 | E2-11 | II-591 | H2-15 | L-34 | E2-1 | II-592 | H2-15 | L-35 | E2-1 |
| II-411 | H2-30 | L-22 | E2-12 | II-412 | H2-30 | L-22 | E2-13 | II-593 | H2-15 | L-36 | E2-1 | II-594 | H2-15 | L-37 | E2-1 |
| II-413 | H2-30 | L-22 | E2-14 | II-414 | H2-30 | L-22 | E2-15 | II-595 | H2-15 | L-38 | E2-1 | II-596 | H2-15 | L-39 | E2-1 |
| II-415 | H2-30 | L-22 | E2-16 | II-416 | H2-30 | L-22 | E2-17 | II-597 | H2-15 | L-40 | E2-1 | II-598 | H2-15 | L-41 | E2-1 |
| II-417 | H2-30 | L-22 | E2-18 | II-418 | H2-30 | L-22 | E2-19 | II-599 | H2-15 | L-42 | E2-1 | II-600 | H2-15 | L-43 | E2-1 |
| II-419 | H2-30 | L-22 | E2-20 | II-420 | H2-30 | L-22 | E2-21 | II-601 | H2-15 | L-44 | E2-1 | II-602 | H2-15 | L-45 | E2-1 |
| II-421 | H2-15 | L-22 | E2-22 | II-422 | H2-15 | L-22 | E2-23 | II-603 | H2-15 | L-46 | E2-1 | II-604 | H2-15 | L-47 | E2-1 |
| II-423 | H2-15 | L-22 | E2-24 | II-424 | H2-15 | L-22 | E2-25 | II-605 | H2-15 | L-48 | E2-1 | II-606 | H2-15 | L-49 | E2-1 |
| II-425 | H2-15 | L-22 | E2-26 | II-426 | H2-15 | L-22 | E2-27 | II-607 | H2-15 | L-50 | E2-1 | II-608 | H2-15 | L-51 | E2-1 |
| II-427 | H2-15 | L-22 | E2-28 | II-428 | H2-15 | L-22 | E2-29 | II-609 | H2-15 | L-52 | E2-1 | II-610 | H2-15 | L-53 | E2-1 |
| II-429 | H2-15 | L-22 | E2-30 | II-430 | H2-15 | L-22 | E2-31 | II-611 | H2-15 | L-54 | E2-1 | II-612 | H2-15 | L-55 | E2-1 |
| II-431 | H2-15 | L-22 | E2-32 | II-432 | H2-15 | L-22 | E2-33 | II-613 | H2-15 | L-56 | E2-1 | II-614 | H2-15 | L-57 | E2-1 |
| II-433 | H2-15 | L-22 | E2-34 | II-434 | H2-15 | L-22 | E2-35 | II-615 | H2-15 | L-58 | E2-1 | II-616 | H2-15 | L-59 | E2-1 |
| II-435 | H2-15 | L-22 | E2-36 | II-436 | H2-15 | L-22 | E2-37 | II-617 | H2-15 | L-60 | E2-1 | II-618 | H2-15 | L-61 | E2-1 |
| II-437 | H2-15 | L-22 | E2-38 | II-438 | H2-15 | L-22 | E2-39 | II-619 | H2-15 | L-62 | E2-1 | II-620 | H2-15 | L-63 | E2-1 |
| II-439 | H2-15 | L-22 | E2-40 | II-440 | H2-15 | L-22 | E2-41 | II-621 | H2-15 | L-64 | E2-1 | II-622 | H2-15 | L-65 | E2-1 |
| II-441 | H2-15 | L-22 | E2-42 | II-442 | H2-15 | L-22 | E2-43 | II-623 | H2-15 | L-66 | E2-1 | II-624 | H2-15 | L-67 | E2-1 |
| II-443 | H2-15 | L-22 | E2-44 | II-444 | H2-15 | L-22 | E2-45 | II-625 | H2-15 | L-68 | E2-1 | II-626 | H2-15 | L-69 | E2-1 |
| II-445 | H2-15 | L-22 | E2-46 | II-446 | H2-15 | L-22 | E2-47 | II-627 | H2-15 | L-70 | E2-1 | II-628 | H2-15 | L-71 | E2-1 |
| II-447 | H2-15 | L-22 | E2-48 | II-448 | H2-15 | L-22 | E2-49 | II-629 | H2-15 | L-72 | E2-1 | II-630 | H2-15 | L-73 | E2-1 |
| II-449 | H2-15 | L-22 | E2-50 | II-450 | H2-15 | L-22 | E2-51 | II-631 | H2-15 | L-74 | E2-1 | II-632 | H2-15 | L-75 | E2-1 |
| II-451 | H2-15 | L-22 | E2-52 | II-452 | H2-15 | L-22 | E2-53 | II-633 | H2-15 | L-76 | E2-1 | II-634 | H2-15 | L-77 | E2-1 |
| II-453 | H2-15 | L-22 | E2-54 | II-454 | H2-15 | L-22 | E2-55 | II-635 | H2-15 | L-78 | E2-1 | II-636 | H2-15 | L-79 | E2-1 |
| II-455 | H2-15 | L-22 | E2-56 | II-456 | H2-15 | L-22 | E2-57 | II-637 | H2-15 | L-80 | E2-1 | II-638 | H2-15 | L-81 | E2-1 |
| II-457 | H2-15 | L-22 | E2-58 | | | | | II-639 | H2-15 | L-82 | E2-1 | II-640 | H2-15 | L-83 | E2-1 |
| | | | | II-468 | H2-27 | L-22 | E2-22 | II-641 | H2-15 | L-84 | E2-1 | II-642 | H2-15 | L-85 | E2-1 |
| II-469 | H2-27 | L-22 | E2-23 | II-470 | H2-27 | L-22 | E2-24 | II-643 | H2-15 | L-86 | E2-1 | II-644 | H2-15 | L-87 | E2-1 |
| II-471 | H2-27 | L-22 | E2-25 | II-472 | H2-27 | L-22 | E2-26 | II-645 | H2-15 | L-88 | E2-1 | II-646 | H2-15 | L-89 | E2-1 |
| II-473 | H2-27 | L-22 | E2-27 | II-474 | H2-27 | L-22 | E2-28 | II-647 | H2-15 | L-90 | E2-1 | II-648 | H2-15 | L-91 | E2-1 |
| II-475 | H2-27 | L-22 | E2-29 | II-476 | H2-27 | L-22 | E2-30 | II-649 | H2-15 | L-92 | E2-1 | II-650 | H2-15 | L-93 | E2-1 |
| II-477 | H2-27 | L-22 | E2-31 | II-478 | H2-27 | L-22 | E2-32 | II-651 | H2-15 | L-94 | E2-1 | II-652 | H2-15 | L-95 | E2-1 |
| II-479 | H2-27 | L-22 | E2-33 | II-480 | H2-27 | L-22 | E2-34 | II-653 | H2-15 | L-96 | E2-1 | II-654 | H2-15 | L-97 | E2-1 |
| II-481 | H2-27 | L-22 | E2-35 | II-482 | H2-27 | L-22 | E2-36 | II-655 | H2-15 | L-98 | E2-1 | II-656 | H2-15 | L-99 | E2-1 |
| II-483 | H2-27 | L-22 | E2-37 | II-484 | H2-27 | L-22 | E2-38 | II-657 | H2-15 | L-100 | E2-1 | II-658 | H2-15 | L-101 | E2-1 |
| II-485 | H2-27 | L-22 | E2-39 | II-486 | H2-27 | L-22 | E2-40 | II-659 | H2-15 | L-102 | E2-1 | II-660 | H2-15 | L-103 | E2-1 |
| II-487 | H2-27 | L-22 | E2-41 | II-488 | H2-27 | L-22 | E2-42 | II-661 | H2-15 | L-104 | E2-1 | II-662 | H2-15 | L-105 | E2-1 |
| II-489 | H2-27 | L-22 | E2-43 | II-490 | H2-27 | L-22 | E2-44 | II-663 | H2-15 | L-106 | E2-1 | II-664 | H2-15 | L-107 | E2-1 |
| II-491 | H2-27 | L-22 | E2-45 | II-492 | H2-27 | L-22 | E2-46 | II-665 | H2-15 | L-108 | E2-1 | II-666 | H2-15 | L-109 | E2-1 |
| II-493 | H2-27 | L-22 | E2-47 | II-494 | H2-27 | L-22 | E2-48 | II-667 | H2-15 | L-110 | E2-1 | II-668 | H2-15 | L-111 | E2-1 |
| II-495 | H2-27 | L-22 | E2-49 | II-496 | H2-27 | L-22 | E2-50 | II-669 | H2-15 | L-112 | E2-1 | II-670 | H2-15 | L-113 | E2-1 |
| II-497 | H2-27 | L-22 | E2-51 | II-498 | H2-27 | L-22 | E2-52 | II-671 | H2-15 | L-114 | E2-1 | II-672 | H2-15 | L-115 | E2-1 |
| II-499 | H2-27 | L-22 | E2-53 | II-500 | H2-27 | L-22 | E2-54 | II-673 | H2-15 | L-116 | E2-1 | II-674 | H2-15 | L-117 | E2-1 |
| II-501 | H2-27 | L-22 | E2-55 | II-502 | H2-27 | L-22 | E2-56 | II-675 | H2-15 | L-118 | E2-1 | II-676 | H2-15 | L-119 | E2-1 |
| II-503 | H2-27 | L-22 | E2-57 | II-504 | H2-27 | L-22 | E2-58 | II-677 | H2-15 | L-120 | E2-1 | II-678 | H2-15 | L-121 | E2-1 |
| II-515 | H2-30 | L-22 | E2-22 | II-516 | H2-30 | L-22 | E2-23 | II-679 | H2-15 | L-122 | E2-1 | II-680 | H2-15 | L-123 | E2-1 |
| II-517 | H2-30 | L-22 | E2-24 | II-518 | H2-30 | L-22 | E2-25 | II-681 | H2-15 | L-124 | E2-1 | II-682 | H2-15 | L-125 | E2-1 |

| Compound | H₂ | L₂ | E₂ | Compound | H₂ | L₂ | E₂ | Compound | H₂ | L₂ | E₂ | Compound | H₂ | L₂ | E₂ |
|---|---|---|---|---|---|---|---|---|---|---|---|---|---|---|---|
| II-683 | H2-15 | L-126 | E2-1 | II-684 | H2-15 | L-127 | E2-1 | II-837 | H2-27 | L-84 | E2-1 | II-838 | H2-27 | L-85 | E2-1 |
| II-685 | H2-15 | L-128 | E2-1 | II-686 | H2-15 | L-129 | E2-1 | II-839 | H2-27 | L-86 | E2-1 | II-840 | H2-27 | L-87 | E2-1 |
| II-687 | H2-15 | L-130 | E2-1 | II-688 | H2-15 | L-131 | E2-1 | II-841 | H2-27 | L-88 | E2-1 | II-842 | H2-27 | L-89 | E2-1 |
| II-689 | H2-15 | L-132 | E2-1 | II-690 | H2-15 | L-133 | E2-1 | II-843 | H2-27 | L-90 | E2-1 | II-844 | H2-27 | L-91 | E2-1 |
| II-691 | H2-15 | L-134 | E2-1 | II-692 | H2-15 | L-135 | E2-1 | II-845 | H2-27 | L-92 | E2-1 | II-846 | H2-27 | L-93 | E2-1 |
| II-693 | H2-15 | L-136 | E2-1 | II-694 | H2-15 | L-137 | E2-1 | II-847 | H2-27 | L-94 | E2-1 | II-848 | H2-27 | L-95 | E2-1 |
| II-695 | H2-15 | L-138 | E2-1 | II-696 | H2-15 | L-139 | E2-1 | II-849 | H2-27 | L-96 | E2-1 | II-850 | H2-27 | L-97 | E2-1 |
| II-697 | H2-15 | L-140 | E2-1 | II-698 | H2-15 | L-141 | E2-1 | II-851 | H2-27 | L-98 | E2-1 | II-852 | H2-27 | L-99 | E2-1 |
| II-699 | H2-15 | L-142 | E2-1 | II-700 | H2-15 | L-143 | E2-1 | II-853 | H2-27 | L-100 | E2-1 | II-854 | H2-27 | L-101 | E2-1 |
| II-701 | H2-15 | L-144 | E2-1 | II-702 | H2-15 | L-145 | E2-1 | II-855 | H2-27 | L-102 | E2-1 | II-856 | H2-27 | L-103 | E2-1 |
| II-703 | H2-15 | L-146 | E2-1 | II-704 | H2-15 | L-147 | E2-1 | II-857 | H2-27 | L-104 | E2-1 | II-858 | H2-27 | L-105 | E2-1 |
| II-705 | H2-15 | L-148 | E2-1 | II-706 | H2-15 | L-149 | E2-1 | II-859 | H2-27 | L-106 | E2-1 | II-860 | H2-27 | L-107 | E2-1 |
| II-707 | H2-15 | L-150 | E2-1 | II-708 | H2-15 | L-151 | E2-1 | II-861 | H2-27 | L-108 | E2-1 | II-862 | H2-27 | L-109 | E2-1 |
| II-709 | H2-15 | L-152 | E2-1 | II-710 | H2-15 | L-153 | E2-1 | II-863 | H2-27 | L-110 | E2-1 | II-864 | H2-27 | L-111 | E2-1 |
| II-711 | H2-15 | L-154 | E2-1 | II-712 | H2-15 | L-155 | E2-1 | II-865 | H2-27 | L-112 | E2-1 | II-866 | H2-27 | L-113 | E2-1 |
| II-713 | H2-15 | L-156 | E2-1 | II-714 | H2-15 | L-157 | E2-1 | II-867 | H2-27 | L-114 | E2-1 | II-868 | H2-27 | L-115 | E2-1 |
| II-715 | H2-15 | L-158 | E2-1 | II-716 | H2-15 | L-159 | E2-1 | II-869 | H2-27 | L-116 | E2-1 | II-870 | H2-27 | L-117 | E2-1 |
| II-717 | H2-15 | L-160 | E2-1 | II-718 | H2-15 | L-161 | E2-1 | II-871 | H2-27 | L-118 | E2-1 | II-872 | H2-27 | L-119 | E2-1 |
| II-719 | H2-15 | L-162 | E2-1 | II-720 | H2-15 | L-163 | E2-1 | II-873 | H2-27 | L-120 | E2-1 | II-874 | H2-27 | L-121 | E2-1 |
| II-721 | H2-15 | L-164 | E2-1 | II-722 | H2-15 | L-165 | E2-1 | II-875 | H2-27 | L-122 | E2-1 | II-876 | H2-27 | L-123 | E2-1 |
| II-723 | H2-15 | L-166 | E2-1 | II-724 | H2-15 | L-167 | E2-1 | II-877 | H2-27 | L-124 | E2-1 | II-878 | H2-27 | L-125 | E2-1 |
| II-725 | H2-15 | L-168 | E2-1 | II-726 | H2-15 | L-169 | E2-1 | II-879 | H2-27 | L-126 | E2-1 | II-880 | H2-27 | L-127 | E2-1 |
| II-727 | H2-15 | L-170 | E2-1 | II-728 | H2-15 | L-171 | E2-1 | II-881 | H2-27 | L-128 | E2-1 | II-882 | H2-27 | L-129 | E2-1 |
| II-729 | H2-15 | L-172 | E2-1 | II-730 | H2-15 | L-173 | E2-1 | II-883 | H2-27 | L-130 | E2-1 | II-884 | H2-27 | L-131 | E2-1 |
| II-731 | H2-15 | L-174 | E2-1 | II-732 | H2-15 | L-175 | E2-1 | II-885 | H2-27 | L-132 | E2-1 | II-886 | H2-27 | L-133 | E2-1 |
| II-733 | H2-15 | L-176 | E2-1 | II-734 | H2-15 | L-177 | E2-1 | II-887 | H2-27 | L-134 | E2-1 | II-888 | H2-27 | L-135 | E2-1 |
| II-735 | H2-15 | L-178 | E2-1 | II-736 | H2-15 | L-179 | E2-1 | II-889 | H2-27 | L-136 | E2-1 | II-890 | H2-27 | L-137 | E2-1 |
| II-737 | H2-15 | L-180 | E2-1 | II-738 | H2-15 | L-181 | E2-1 | II-891 | H2-27 | L-138 | E2-1 | II-892 | H2-27 | L-139 | E2-1 |
| II-739 | H2-15 | L-182 | E2-1 | II-740 | H2-15 | L-183 | E2-1 | II-893 | H2-27 | L-140 | E2-1 | II-894 | H2-27 | L-141 | E2-1 |
| II-741 | H2-15 | L-184 | E2-1 | II-742 | H2-15 | L-185 | E2-1 | II-895 | H2-27 | L-142 | E2-1 | II-896 | H2-27 | L-143 | E2-1 |
| II-743 | H2-15 | L-186 | E2-1 | II-744 | H2-15 | L-187 | E2-1 | II-897 | H2-27 | L-144 | E2-1 | II-898 | H2-27 | L-145 | E2-1 |
| II-745 | H2-15 | L-188 | E2-1 | II-746 | H2-15 | L-189 | E2-1 | II-899 | H2-27 | L-146 | E2-1 | II-900 | H2-27 | L-147 | E2-1 |
| II-747 | H2-15 | L-190 | E2-1 | II-748 | H2-15 | L-191 | E2-1 | II-901 | H2-27 | L-148 | E2-1 | II-902 | H2-27 | L-149 | E2-1 |
| II-749 | H2-15 | L-192 | E2-1 | II-750 | H2-15 | L-193 | E2-1 | II-903 | H2-27 | L-150 | E2-1 | II-904 | H2-27 | L-151 | E2-1 |
| II-751 | H2-15 | L-194 | E2-1 | II-752 | H2-15 | L-195 | E2-1 | II-905 | H2-27 | L-152 | E2-1 | II-906 | H2-27 | L-153 | E2-1 |
| II-753 | H2-15 | L-196 | E2-1 | II-754 | H2-15 | L-197 | E2-1 | II-907 | H2-27 | L-154 | E2-1 | II-908 | H2-27 | L-155 | E2-1 |
| II-755 | H2-15 | L-198 | E2-1 | II-756 | H2-15 | L-199 | E2-1 | II-909 | H2-27 | L-156 | E2-1 | II-910 | H2-27 | L-157 | E2-1 |
| II-757 | H2-15 | L-200 | E2-1 | | | | | II-911 | H2-27 | L-158 | E2-1 | II-912 | H2-27 | L-159 | E2-1 |
| II-759 | H2-15 | L-4 | E2-1 | II-760 | H2-15 | L-5 | E2-1 | II-913 | H2-27 | L-160 | E2-1 | II-914 | H2-27 | L-161 | E2-1 |
| II-761 | H2-27 | L-6 | E2-1 | II-762 | H2-27 | L-7 | E2-1 | II-915 | H2-27 | L-162 | E2-1 | II-916 | H2-27 | L-163 | E2-1 |
| II-763 | H2-27 | L-8 | E2-1 | II-764 | H2-27 | L-9 | E2-1 | II-917 | H2-27 | L-164 | E2-1 | II-918 | H2-27 | L-165 | E2-1 |
| II-765 | H2-27 | L-10 | E2-1 | II-766 | H2-27 | L-11 | E2-1 | II-919 | H2-27 | L-166 | E2-1 | II-920 | H2-27 | L-167 | E2-1 |
| II-767 | H2-27 | L-12 | E2-1 | II-768 | H2-27 | L-13 | E2-1 | II-921 | H2-27 | L-168 | E2-1 | II-922 | H2-27 | L-169 | E2-1 |
| II-769 | H2-27 | L-14 | E2-1 | II-770 | H2-27 | L-15 | E2-1 | II-923 | H2-27 | L-170 | E2-1 | II-924 | H2-27 | L-171 | E2-1 |
| II-771 | H2-27 | L-16 | E2-1 | II-772 | H2-27 | L-17 | E2-1 | II-925 | H2-27 | L-172 | E2-1 | II-926 | H2-27 | L-173 | E2-1 |
| II-773 | H2-27 | L-18 | E2-1 | II-774 | H2-27 | L-19 | E2-1 | II-927 | H2-27 | L-174 | E2-1 | II-928 | H2-27 | L-175 | E2-1 |
| II-775 | H2-27 | L-20 | E2-1 | II-776 | H2-27 | L-23 | E2-1 | II-929 | H2-27 | L-176 | E2-1 | II-930 | H2-27 | L-177 | E2-1 |
| II-777 | H2-27 | L-24 | E2-1 | II-778 | H2-27 | L-25 | E2-1 | II-931 | H2-27 | L-178 | E2-1 | II-932 | H2-27 | L-179 | E2-1 |
| II-779 | H2-27 | L-26 | E2-1 | II-780 | H2-27 | L-27 | E2-1 | II-933 | H2-27 | L-180 | E2-1 | II-934 | H2-27 | L-181 | E2-1 |
| II-781 | H2-27 | L-28 | E2-1 | II-782 | H2-27 | L-29 | E2-1 | II-935 | H2-27 | L-182 | E2-1 | II-936 | H2-27 | L-183 | E2-1 |
| II-783 | H2-27 | L-30 | E2-1 | II-784 | H2-27 | L-31 | E2-1 | II-937 | H2-27 | L-184 | E2-1 | II-938 | H2-27 | L-185 | E2-1 |
| II-785 | H2-27 | L-32 | E2-1 | II-786 | H2-27 | L-33 | E2-1 | II-939 | H2-27 | L-186 | E2-1 | II-940 | H2-27 | L-187 | E2-1 |
| II-787 | H2-27 | L-34 | E2-1 | II-788 | H2-27 | L-35 | E2-1 | II-941 | H2-27 | L-188 | E2-1 | II-942 | H2-27 | L-189 | E2-1 |
| II-789 | H2-27 | L-36 | E2-1 | II-790 | H2-27 | L-37 | E2-1 | II-943 | H2-27 | L-190 | E2-1 | II-944 | H2-27 | L-191 | E2-1 |
| II-791 | H2-27 | L-38 | E2-1 | II-792 | H2-27 | L-39 | E2-1 | II-945 | H2-27 | L-192 | E2-1 | II-946 | H2-27 | L-193 | E2-1 |
| II-793 | H2-27 | L-40 | E2-1 | II-794 | H2-27 | L-41 | E2-1 | II-947 | H2-27 | L-194 | E2-1 | II-948 | H2-27 | L-195 | E2-1 |
| II-795 | H2-27 | L-42 | E2-1 | II-796 | H2-27 | L-43 | E2-1 | II-949 | H2-27 | L-196 | E2-1 | II-950 | H2-27 | L-197 | E2-1 |
| II-797 | H2-27 | L-44 | E2-1 | II-798 | H2-27 | L-45 | E2-1 | II-951 | H2-27 | L-198 | E2-1 | II-952 | H2-27 | L-199 | E2-1 |
| II-799 | H2-27 | L-46 | E2-1 | II-800 | H2-27 | L-47 | E2-1 | II-953 | H2-27 | L-200 | E2-1 | | | | |
| II-801 | H2-27 | L-48 | E2-1 | II-802 | H2-27 | L-49 | E2-1 | II-955 | H2-30 | L-4 | E2-1 | II-956 | H2-30 | L-5 | E2-1 |
| II-803 | H2-27 | L-50 | E2-1 | II-804 | H2-27 | L-51 | E2-1 | II-957 | H2-30 | L-6 | E2-1 | II-958 | H2-30 | L-7 | E2-1 |
| II-805 | H2-27 | L-52 | E2-1 | II-806 | H2-27 | L-53 | E2-1 | II-959 | H2-30 | L-8 | E2-1 | II-960 | H2-30 | L-9 | E2-1 |
| II-807 | H2-27 | L-54 | E2-1 | II-808 | H2-27 | L-55 | E2-1 | II-961 | H2-30 | L-10 | E2-1 | II-962 | H2-30 | L-11 | E2-1 |
| II-809 | H2-27 | L-56 | E2-1 | II-810 | H2-27 | L-57 | E2-1 | II-963 | H2-30 | L-12 | E2-1 | II-964 | H2-30 | L-13 | E2-1 |
| II-811 | H2-27 | L-58 | E2-1 | II-812 | H2-27 | L-59 | E2-1 | II-965 | H2-30 | L-14 | E2-1 | II-966 | H2-30 | L-15 | E2-1 |
| II-813 | H2-27 | L-60 | E2-1 | II-814 | H2-27 | L-61 | E2-1 | II-967 | H2-30 | L-16 | E2-1 | II-968 | H2-30 | L-17 | E2-1 |
| II-815 | H2-27 | L-62 | E2-1 | II-816 | H2-27 | L-63 | E2-1 | II-969 | H2-30 | L-18 | E2-1 | II-970 | H2-30 | L-19 | E2-1 |
| II-817 | H2-27 | L-64 | E2-1 | II-818 | H2-27 | L-65 | E2-1 | II-971 | H2-30 | L-20 | E2-1 | II-972 | H2-30 | L-23 | E2-1 |
| II-819 | H2-27 | L-66 | E2-1 | II-820 | H2-27 | L-67 | E2-1 | II-973 | H2-30 | L-24 | E2-1 | II-974 | H2-30 | L-25 | E2-1 |
| II-821 | H2-27 | L-68 | E2-1 | II-822 | H2-27 | L-69 | E2-1 | II-975 | H2-30 | L-26 | E2-1 | II-976 | H2-30 | L-27 | E2-1 |
| II-823 | H2-27 | L-70 | E2-1 | II-824 | H2-27 | L-71 | E2-1 | II-977 | H2-30 | L-28 | E2-1 | II-978 | H2-30 | L-29 | E2-1 |
| II-825 | H2-27 | L-72 | E2-1 | II-826 | H2-27 | L-73 | E2-1 | II-979 | H2-30 | L-30 | E2-1 | II-980 | H2-30 | L-31 | E2-1 |
| II-827 | H2-27 | L-74 | E2-1 | II-828 | H2-27 | L-75 | E2-1 | II-981 | H2-30 | L-32 | E2-1 | II-982 | H2-30 | L-33 | E2-1 |
| II-829 | H2-27 | L-76 | E2-1 | II-830 | H2-27 | L-77 | E2-1 | II-983 | H2-30 | L-34 | E2-1 | II-984 | H2-30 | L-35 | E2-1 |
| II-831 | H2-27 | L-78 | E2-1 | II-832 | H2-27 | L-79 | E2-1 | II-985 | H2-30 | L-36 | E2-1 | II-986 | H2-30 | L-37 | E2-1 |
| II-833 | H2-27 | L-80 | E2-1 | II-834 | H2-27 | L-81 | E2-1 | II-987 | H2-30 | L-38 | E2-1 | II-988 | H2-30 | L-39 | E2-1 |
| II-835 | H2-27 | L-82 | E2-1 | II-836 | H2-27 | L-83 | E2-1 | II-989 | H2-30 | L-40 | E2-1 | II-990 | H2-30 | L-41 | E2-1 |

| Compound | H₂ | L₂ | E₂ | Compound | H₂ | L₂ | E₂ | Compound | H₂ | L₂ | E₂ | Compound | H₂ | L₂ | E₂ |
| --- | --- | --- | --- | --- | --- | --- | --- | --- | --- | --- | --- | --- | --- | --- | --- |
| II-991 | H2-30 | L-42 | E2-1 | II-992 | H2-30 | L-43 | E2-1 | II-1145 | H2-30 | L-196 | E2-1 | II-1146 | H2-30 | L-197 | E2-1 |
| II-993 | H2-30 | L-44 | E2-1 | II-994 | H2-30 | L-45 | E2-1 | II-1147 | H2-30 | L-198 | E2-1 | II-1148 | H2-30 | L-199 | E2-1 |
| II-995 | H2-30 | L-46 | E2-1 | II-996 | H2-30 | L-47 | E2-1 | II-1149 | H2-30 | L-200 | E2-1 | II-1150 | H2-1 | L-22 | E2-1 |
| II-997 | H2-30 | L-48 | E2-1 | II-998 | H2-30 | L-49 | E2-1 | II-1151 | H2-2 | L-22 | E2-1 | II-1152 | H2-3 | L-22 | E2-1 |
| II-999 | H2-30 | L-50 | E2-1 | II-1000 | H2-30 | L-51 | E2-1 | II-1153 | H2-4 | L-22 | E2-1 | II-1154 | H2-5 | L-22 | E2-1 |
| II-1001 | H2-30 | L-52 | E2-1 | II-1002 | H2-30 | L-53 | E2-1 | II-1155 | H2-6 | L-22 | E2-1 | II-1156 | H2-7 | L-22 | E2-1 |
| II-1003 | H2-30 | L-54 | E2-1 | II-1004 | H2-30 | L-55 | E2-1 | II-1157 | H2-8 | L-22 | E2-1 | II-1158 | H2-9 | L-22 | E2-1 |
| II-1005 | H2-30 | L-56 | E2-1 | II-1006 | H2-30 | L-57 | E2-1 | II-1159 | H2-10 | L-22 | E2-1 | II-1160 | H2-11 | L-22 | E2-1 |
| II-1007 | H2-30 | L-58 | E2-1 | II-1008 | H2-30 | L-59 | E2-1 | II-1161 | H2-12 | L-22 | E2-1 | II-1162 | H2-14 | L-22 | E2-1 |
| II-1009 | H2-30 | L-60 | E2-1 | II-1010 | H2-30 | L-61 | E2-1 | II-1163 | H2-16 | L-22 | E2-1 | II-1164 | H2-17 | L-22 | E2-1 |
| II-1011 | H2-30 | L-62 | E2-1 | II-1012 | H2-30 | L-63 | E2-1 | II-1165 | H2-18 | L-22 | E2-1 | II-1166 | H2-19 | L-22 | E2-1 |
| II-1013 | H2-30 | L-64 | E2-1 | II-1014 | H2-30 | L-65 | E2-1 | II-1167 | H2-20 | L-22 | E2-1 | II-1168 | H2-21 | L-22 | E2-1 |
| II-1015 | H2-30 | L-66 | E2-1 | II-1016 | H2-30 | L-67 | E2-1 | II-1169 | H2-22 | L-22 | E2-1 | II-1170 | H2-23 | L-22 | E2-1 |
| II-1017 | H2-30 | L-68 | E2-1 | II-1018 | H2-30 | L-69 | E2-1 | II-1171 | H2-24 | L-22 | E2-1 | II-1172 | H2-25 | L-22 | E2-1 |
| II-1019 | H2-30 | L-70 | E2-1 | II-1020 | H2-30 | L-71 | E2-1 | II-1173 | H2-26 | L-22 | E2-1 | II-1174 | H2-28 | L-22 | E2-1 |
| II-1021 | H2-30 | L-72 | E2-1 | II-1022 | H2-30 | L-73 | E2-1 | II-1175 | H2-29 | L-22 | E2-1 | II-1176 | H2-31 | L-22 | E2-1 |
| II-1023 | H2-30 | L-74 | E2-1 | II-1024 | H2-30 | L-75 | E2-1 | II-1177 | H2-32 | L-22 | E2-1 | II-1178 | H2-33 | L-22 | E2-1 |
| II-1025 | H2-30 | L-76 | E2-1 | II-1026 | H2-30 | L-77 | E2-1 | II-1179 | H2-34 | L-22 | E2-1 | II-1180 | H2-35 | L-22 | E2-1 |
| II-1027 | H2-30 | L-78 | E2-1 | II-1028 | H2-30 | L-79 | E2-1 | II-1181 | H2-36 | L-22 | E2-1 | II-1182 | H2-37 | L-22 | E2-1 |
| II-1029 | H2-30 | L-80 | E2-1 | II-1030 | H2-30 | L-81 | E2-1 | II-1183 | H2-38 | L-22 | E2-1 | II-1184 | H2-39 | L-22 | E2-1 |
| II-1031 | H2-30 | L-82 | E2-1 | II-1032 | H2-30 | L-83 | E2-1 | II-1185 | H2-40 | L-22 | E2-1 | II-1186 | H2-41 | L-22 | E2-1 |
| II-1033 | H2-30 | L-84 | E2-1 | II-1034 | H2-30 | L-85 | E2-1 | II-1187 | H2-42 | L-22 | E2-1 | II-1188 | H2-43 | L-22 | E2-1 |
| II-1035 | H2-30 | L-86 | E2-1 | II-1036 | H2-30 | L-87 | E2-1 | II-1189 | H2-44 | L-22 | E2-1 | II-1190 | H2-45 | L-22 | E2-1 |
| II-1037 | H2-30 | L-88 | E2-1 | II-1038 | H2-30 | L-89 | E2-1 | II-1191 | H2-46 | L-22 | E2-1 | II-1192 | H2-47 | L-22 | E2-1 |
| II-1039 | H2-30 | L-90 | E2-1 | II-1040 | H2-30 | L-91 | E2-1 | II-1193 | H2-48 | L-22 | E2-1 | II-1194 | H2-49 | L-22 | E2-1 |
| II-1041 | H2-30 | L-92 | E2-1 | II-1042 | H2-30 | L-93 | E2-1 | II-1195 | H2-50 | L-22 | E2-1 | II-1196 | H2-51 | L-22 | E2-1 |
| II-1043 | H2-30 | L-94 | E2-1 | II-1044 | H2-30 | L-95 | E2-1 | II-1197 | H2-52 | L-22 | E2-1 | II-1198 | H2-53 | L-22 | E2-1 |
| II-1045 | H2-30 | L-96 | E2-1 | II-1046 | H2-30 | L-97 | E2-1 | II-1199 | H2-54 | L-22 | E2-1 | II-1200 | H2-55 | L-22 | E2-1 |
| II-1047 | H2-30 | L-98 | E2-1 | II-1048 | H2-30 | L-99 | E2-1 | II-1201 | H2-56 | L-22 | E2-1 | II-1202 | H2-57 | L-22 | E2-1 |
| II-1049 | H2-30 | L-100 | E2-1 | II-1050 | H2-30 | L-101 | E2-1 | II-1203 | H2-58 | L-22 | E2-1 | II-1204 | H2-59 | L-22 | E2-1 |
| II-1051 | H2-30 | L-102 | E2-1 | II-1052 | H2-30 | L-103 | E2-1 | II-1205 | H2-60 | L-22 | E2-1 | II-1206 | H2-61 | L-22 | E2-1 |
| II-1053 | H2-30 | L-104 | E2-1 | II-1054 | H2-30 | L-105 | E2-1 | II-1207 | H2-62 | L-22 | E2-1 | II-1208 | H2-63 | L-22 | E2-1 |
| II-1055 | H2-30 | L-106 | E2-1 | II-1056 | H2-30 | L-107 | E2-1 | II-1209 | H2-64 | L-22 | E2-1 | II-1210 | H2-65 | L-22 | E2-1 |
| II-1057 | H2-30 | L-108 | E2-1 | II-1058 | H2-30 | L-109 | E2-1 | II-1211 | H2-66 | L-22 | E2-1 | II-1212 | H2-67 | L-22 | E2-1 |
| II-1059 | H2-30 | L-110 | E2-1 | II-1060 | H2-30 | L-111 | E2-1 | II-1213 | H2-68 | L-22 | E2-1 | II-1214 | H2-69 | L-22 | E2-1 |
| II-1061 | H2-30 | L-112 | E2-1 | II-1062 | H2-30 | L-113 | E2-1 | II-1215 | H2-70 | L-22 | E2-1 | II-1216 | H2-71 | L-22 | E2-1 |
| II-1063 | H2-30 | L-114 | E2-1 | II-1064 | H2-30 | L-115 | E2-1 | II-1217 | H2-72 | L-22 | E2-1 | II-1218 | H2-73 | L-22 | E2-1 |
| II-1065 | H2-30 | L-116 | E2-1 | II-1066 | H2-30 | L-117 | E2-1 | II-1219 | H2-74 | L-22 | E2-1 | II-1220 | H2-75 | L-22 | E2-1 |
| II-1067 | H2-30 | L-118 | E2-1 | II-1068 | H2-30 | L-119 | E2-1 | II-1221 | H2-76 | L-22 | E2-1 | II-1222 | H2-77 | L-22 | E2-1 |
| II-1069 | H2-30 | L-120 | E2-1 | II-1070 | H2-30 | L-121 | E2-1 | II-1223 | H2-78 | L-22 | E2-1 | II-1224 | H2-79 | L-22 | E2-1 |
| II-1071 | H2-30 | L-122 | E2-1 | II-1072 | H2-30 | L-123 | E2-1 | II-1225 | H2-80 | L-22 | E2-1 | II-1226 | H2-81 | L-22 | E2-1 |
| II-1073 | H2-30 | L-124 | E2-1 | II-1074 | H2-30 | L-125 | E2-1 | II-1227 | H2-82 | L-22 | E2-1 | II-1228 | H2-83 | L-22 | E2-1 |
| II-1075 | H2-30 | L-126 | E2-1 | II-1076 | H2-30 | L-127 | E2-1 | II-1229 | H2-84 | L-22 | E2-1 | II-1230 | H2-85 | L-22 | E2-1 |
| II-1077 | H2-30 | L-128 | E2-1 | II-1078 | H2-30 | L-129 | E2-1 | II-1231 | H2-86 | L-22 | E2-1 | II-1232 | H2-87 | L-22 | E2-1 |
| II-1079 | H2-30 | L-130 | E2-1 | II-1080 | H2-30 | L-131 | E2-1 | II-1233 | H2-88 | L-22 | E2-1 | II-1234 | H2-89 | L-22 | E2-1 |
| II-1081 | H2-30 | L-132 | E2-1 | II-1082 | H2-30 | L-133 | E2-1 | II-1235 | H2-90 | L-22 | E2-1 | II-1236 | H2-91 | L-22 | E2-1 |
| II-1083 | H2-30 | L-134 | E2-1 | II-1084 | H2-30 | L-135 | E2-1 | II-1237 | H2-92 | L-22 | E2-1 | II-1238 | H2-93 | L-22 | E2-1 |
| II-1085 | H2-30 | L-136 | E2-1 | II-1086 | H2-30 | L-137 | E2-1 | II-1239 | H2-94 | L-22 | E2-1 | II-1240 | H2-95 | L-22 | E2-1 |
| II-1087 | H2-30 | L-138 | E2-1 | II-1088 | H2-30 | L-139 | E2-1 | II-1241 | H2-96 | L-22 | E2-1 | II-1242 | H2-97 | L-22 | E2-1 |
| II-1089 | H2-30 | L-140 | E2-1 | II-1090 | H2-30 | L-141 | E2-1 | II-1243 | H2-98 | L-22 | E2-1 | II-1244 | H2-99 | L-22 | E2-1 |
| II-1091 | H2-30 | L-142 | E2-1 | II-1092 | H2-30 | L-143 | E2-1 | II-1245 | H2-100 | L-22 | E2-1 | II-1246 | H2-101 | L-22 | E2-1 |
| II-1093 | H2-30 | L-144 | E2-1 | II-1094 | H2-30 | L-145 | E2-1 | II-1247 | H2-102 | L-22 | E2-1 | II-1248 | H2-103 | L-22 | E2-1 |
| II-1095 | H2-30 | L-146 | E2-1 | II-1096 | H2-30 | L-147 | E2-1 | II-1249 | H2-104 | L-22 | E2-1 | II-1250 | H2-105 | L-22 | E2-1 |
| II-1097 | H2-30 | L-148 | E2-1 | II-1098 | H2-30 | L-149 | E2-1 | II-1251 | H2-106 | L-22 | E2-1 | II-1252 | H2-107 | L-22 | E2-1 |
| II-1099 | H2-30 | L-150 | E2-1 | II-1100 | H2-30 | L-151 | E2-1 | II-1253 | H2-108 | L-22 | E2-1 | II-1254 | H2-109 | L-22 | E2-1 |
| II-1101 | H2-30 | L-152 | E2-1 | II-1102 | H2-30 | L-153 | E2-1 | II-1255 | H2-110 | L-22 | E2-1 | II-1256 | H2-111 | L-22 | E2-1 |
| II-1103 | H2-30 | L-154 | E2-1 | II-1104 | H2-30 | L-155 | E2-1 | II-1257 | H2-112 | L-22 | E2-1 | II-1258 | H2-113 | L-22 | E2-1 |
| II-1105 | H2-30 | L-156 | E2-1 | II-1106 | H2-30 | L-157 | E2-1 | II-1259 | H2-114 | L-22 | E2-1 | II-1260 | H2-115 | L-22 | E2-1 |
| II-1107 | H2-30 | L-158 | E2-1 | II-1108 | H2-30 | L-159 | E2-1 | II-1261 | H2-116 | L-22 | E2-1 | II-1262 | H2-117 | L-22 | E2-1 |
| II-1109 | H2-30 | L-160 | E2-1 | II-1110 | H2-30 | L-161 | E2-1 | II-1263 | H2-118 | L-22 | E2-1 | II-1264 | H2-119 | L-22 | E2-1 |
| II-1111 | H2-30 | L-162 | E2-1 | II-1112 | H2-30 | L-163 | E2-1 | II-1265 | H2-120 | L-22 | E2-1 | II-1266 | H2-121 | L-22 | E2-1 |
| II-1113 | H2-30 | L-164 | E2-1 | II-1114 | H2-30 | L-165 | E2-1 | II-1267 | H2-122 | L-22 | E2-1 | II-1268 | H2-123 | L-22 | E2-1 |
| II-1115 | H2-30 | L-166 | E2-1 | II-1116 | H2-30 | L-167 | E2-1 | II-1269 | H2-124 | L-22 | E2-1 | II-1270 | H2-125 | L-22 | E2-1 |
| II-1117 | H2-30 | L-168 | E2-1 | II-1118 | H2-30 | L-169 | E2-1 | II-1271 | H2-126 | L-22 | E2-1 | II-1272 | H2-127 | L-22 | E2-1 |
| II-1119 | H2-30 | L-170 | E2-1 | II-1120 | H2-30 | L-171 | E2-1 | II-1273 | H2-128 | L-22 | E2-1 | II-1274 | H2-129 | L-22 | E2-1 |
| II-1121 | H2-30 | L-172 | E2-1 | II-1122 | H2-30 | L-173 | E2-1 | II-1275 | H2-130 | L-22 | E2-1 | II-1276 | H2-131 | L-22 | E2-1 |
| II-1123 | H2-30 | L-174 | E2-1 | II-1124 | H2-30 | L-175 | E2-1 | II-1277 | H2-132 | L-22 | E2-1 | II-1278 | H2-133 | L-22 | E2-1 |
| II-1125 | H2-30 | L-176 | E2-1 | II-1126 | H2-30 | L-177 | E2-1 | II-1279 | H2-134 | L-22 | E2-1 | II-1280 | H2-135 | L-22 | E2-1 |
| II-1127 | H2-30 | L-178 | E2-1 | II-1128 | H2-30 | L-179 | E2-1 | II-1281 | H2-136 | L-22 | E2-1 | II-1282 | H2-137 | L-22 | E2-1 |
| II-1129 | H2-30 | L-180 | E2-1 | II-1130 | H2-30 | L-181 | E2-1 | II-1283 | H2-138 | L-22 | E2-1 | II-1284 | H2-139 | L-22 | E2-1 |
| II-1131 | H2-30 | L-182 | E2-1 | II-1132 | H2-30 | L-183 | E2-1 | II-1285 | H2-140 | L-22 | E2-1 | II-1286 | H2-141 | L-22 | E2-1 |
| II-1133 | H2-30 | L-184 | E2-1 | II-1134 | H2-30 | L-185 | E2-1 | II-1287 | H2-142 | L-22 | E2-1 | II-1288 | H2-143 | L-22 | E2-1 |
| II-1135 | H2-30 | L-186 | E2-1 | II-1136 | H2-30 | L-187 | E2-1 | II-1289 | H2-144 | L-22 | E2-1 | II-1290 | H2-145 | L-22 | E2-1 |
| II-1137 | H2-30 | L-188 | E2-1 | II-1138 | H2-30 | L-189 | E2-1 | II-1291 | H2-146 | L-22 | E2-1 | II-1292 | H2-147 | L-22 | E2-1 |
| II-1139 | H2-30 | L-190 | E2-1 | II-1140 | H2-30 | L-191 | E2-1 | II-1293 | H2-148 | L-22 | E2-1 | II-1294 | H2-149 | L-22 | E2-1 |
| II-1141 | H2-30 | L-192 | E2-1 | II-1142 | H2-30 | L-193 | E2-1 | II-1295 | H2-150 | L-22 | E2-1 | II-1296 | H2-151 | L-22 | E2-1 |
| II-1143 | H2-30 | L-194 | E2-1 | II-1144 | H2-30 | L-195 | E2-1 | II-1297 | H2-152 | L-22 | E2-1 | II-1298 | H2-153 | L-22 | E2-1 |

| Compound | H$_2$ | L$_2$ | E$_2$ | Compound | H$_2$ | L$_2$ | E$_2$ |
|---|---|---|---|---|---|---|---|
| II-1299 | H2-154 | L-22 | E2-1 | II-1300 | H2-155 | L-22 | E2-1 |
| II-1301 | H2-156 | L-22 | E2-1 | II-1302 | H2-157 | L-22 | E2-1 |
| II-1303 | H2-158 | L-22 | E2-1 | II-1304 | H2-159 | L-22 | E2-1 |
| II-1305 | H2-160 | L-22 | E2-1 | II-1306 | H2-161 | L-22 | E2-1 |
| II-1307 | H2-162 | L-22 | E2-1 | II-1308 | H2-163 | L-22 | E2-1 |
| II-1309 | H2-164 | L-22 | E2-1 | II-1310 | H2-165 | L-22 | E2-1 |
| II-1311 | H2-166 | L-22 | E2-1 | II-1312 | H2-167 | L-22 | E2-1 |
| II-1313 | H2-168 | L-22 | E2-1 | II-1314 | H2-169 | L-22 | E2-1 |
| II-1315 | H2-170 | L-22 | E2-1 | II-1316 | H2-171 | L-22 | E2-1 |
| II-1317 | H2-172 | L-22 | E2-1 | II-1318 | H2-173 | L-22 | E2-1 |
| II-1319 | H2-174 | L-22 | E2-1 | II-1320 | H2-175 | L-22 | E2-1 |
| II-1321 | H2-176 | L-22 | E2-1 | II-1322 | H2-177 | L-22 | E2-1 |
| II-1323 | H2-178 | L-22 | E2-1 | II-1324 | H2-179 | L-22 | E2-1 |
| II-1325 | H2-180 | L-22 | E2-1 | II-1326 | H2-181 | L-22 | E2-1 |
| II-1327 | H2-182 | L-22 | E2-1 | II-1328 | H2-183 | L-22 | E2-1 |
| II-1329 | H2-184 | L-22 | E2-1 | II-1330 | H2-185 | L-22 | E2-1 |
| II-1331 | H2-186 | L-22 | E2-1 | II-1332 | H2-187 | L-22 | E2-1 |
| II-1333 | H2-188 | L-22 | E2-1 | II-1334 | H2-189 | L-22 | E2-1 |
| II-1335 | H2-190 | L-22 | E2-1 | II-1336 | H2-191 | L-22 | E2-1 |
| II-1337 | H2-192 | L-22 | E2-1 | II-1338 | H2-193 | L-22 | E2-1 |
| II-1339 | H2-194 | L-22 | E2-1 | II-1340 | H2-195 | L-22 | E2-1 |
| II-1341 | H2-196 | L-22 | E2-1 | II-1342 | H2-197 | L-22 | E2-1 |
| II-1343 | H2-198 | L-22 | E2-1 | II-1344 | H2-199 | L-22 | E2-1 |
| II-1345 | H2-200 | L-22 | E2-1 | II-1346 | H2-201 | L-22 | E2-1 |
| II-1347 | H2-202 | L-22 | E2-1 | II-1348 | H2-203 | L-22 | E2-1 |
| II-1349 | H2-204 | L-22 | E2-1 | II-1350 | H2-205 | L-22 | E2-1 |
| II-1351 | H2-206 | L-22 | E2-1 | | | | | optionally, hydrogens in the Compound II-1 to Compound II-457, Compound II-468 to Compound II-504, Compound II-515 to Compound II-551, Compound II-563 to Compound II-757, Compound II-759 to Compound II-953, and Compound II-955 to Compound II-1351 can be partially or fully substituted with deuterium.

* * * * *